United States Patent [19]

Tanigawa et al.

[11] Patent Number: 5,410,349
[45] Date of Patent: Apr. 25, 1995

[54] SOLID-STATE IMAGE PICK-UP DEVICE OF THE CHARGE-COUPLED DEVICE TYPE SYNCHRONIZING DRIVE SIGNALS FOR A FULL-FRAME READ-OUT

[75] Inventors: Hiroshi Tanigawa; Hideki Mutoh; Tetsuo Toma; Kazuhiro Kawashiri, all of Kanagawa, Japan

[73] Assignee: Fuji Photo Film Co., Ltd., Kanagawa, Japan

[21] Appl. No.: 169,769

[22] Filed: Dec. 20, 1993

Related U.S. Application Data

[63] Continuation of Ser. No. 725,105, Jul. 3, 1991, abandoned.

[30] Foreign Application Priority Data

| Jul. 6, 1990 | [JP] | Japan | 2-178654 |
| Jul. 6, 1990 | [JP] | Japan | 2-178655 |
| Jul. 6, 1990 | [JP] | Japan | 2-178656 |
| Sep. 10, 1990 | [JP] | Japan | 2-237251 |

[51] Int. Cl.$^6$ .............................. H04N 3/14
[52] U.S. Cl. .................... 348/311; 348/312; 257/242
[58] Field of Search ........... 348/311, 312, 317, 319; 357/242, 249, 250; H04N 3/14, 3/15

[56] References Cited

U.S. PATENT DOCUMENTS

| 4,799,109 | 1/1989 | Esser et al. | 358/213.26 |
| 4,829,368 | 5/1989 | Kobayashi et al. | 358/213.29 |
| 5,027,226 | 6/1991 | Nagata et al. | 358/213.11 |
| 5,040,038 | 8/1991 | Yutani et al. | 358/213.22 |
| 5,119,202 | 7/1992 | Hashimoto et al. | 358/213.11 |

FOREIGN PATENT DOCUMENTS 63-275164 11/1988 Japan .............................. 358/213.23

Primary Examiner—Joseph Mancuso
Assistant Examiner—Wendy R. Greening
Attorney, Agent, or Firm—Sughrue, Mion, Zinn, Macpeak & Seas

[57] ABSTRACT

A solid-state CCD image pick-up device includes optoelectric transducing elements corresponding to pixels vertically and horizontally arrayed in a matrix forming column linear arrays defining a column direction and at least one vertical charge transfer path associated with a corresponding adjacent column linear array. Pixel signals are vertically transferred from the column linear arrays to the vertical charge transfer paths such that gate signals occurring at predetermined times are applied to gate electrodes of the vertical charge transfer paths to permit the pixel signals to be scan read by a horizontal charge transfer path. Switching elements are provided for transfer gate electrodes and a drive circuit sequentially generates drive signals for groups of gate electrodes during periods in which the switching elements are rendered conductive to allow a full frame scan read to be performed by supplying a predetermined number of timing signals to the gate electrodes. The pick-up device can be fabricated with high density integration and high pixel density and can be provided with an improved vertical overflow drain structure. The image pick-up device also provides an electronic shutter function having improved vertical resolution. A shift register for producing improved vertical resolution is also disclosed.

20 Claims, 27 Drawing Sheets

SOLID-STATE IMAGE PICK-UP DEVICE OF THE CHARGE-COUPLED DEVICE TYPE SYNCHRONIZING DRIVE SIGNALS FOR A FULL-FRAME READ-OUT

This is a continuation of application No. 07/725,105 filed Jul. 3, 1991 abandoned.

BACKGROUND OF THE INVENTION

The present invention relates generally to a solid-state image pick-up device of the charge-coupled device (CCD) type. More specifically, the present invention relates to solid-state image pick-up device which may be fabricated with high density integration and high pixel density. According to one aspect of the present invention, a solid-state image pick-up device is provided with an improved vertical overflow drain structure. According to another aspect of the present invention, a solid-state image pick-up device provides an electronic shutter function having improved vertical resolution. In particular, the present invention employs a shift register for producing improved vertical resolution. The present invention is particularly advantageous for solid-state image pick-up devices providing functions for photographing a motion picture in an interlace scan read mode and photographing a still picture in a noninterlace/frame scan read mode.

BACKGROUND OF THE INVENTION

Solid-state image pick-up devices of the interline transfer type are used for electronic cameras, copying machines, and other video devices. In this type of the image pick-up device, a plurality of photodiodes, each defining a pixel, are vertically and horizontally arrayed in a matrix. Vertical charge transfer paths are disposed between adjacent linear arrays of photodiodes, which extend in the column or vertical direction. A horizontal charge transfer path is disposed at one end of the vertical charge transfer paths. The area of the device where the photodiodes and the vertical charge transfer paths are formed is called the photodetecting area. Light shield layers for shielding light incident on the surfaces of the vertical and horizontal charge transfer paths are normally provided on these surfaces.

FIG. 1 is a plan view showing a selected portion of the photodetecting area A, shown in FIG. 3. A plurality of n+ impurity layers are arrayed in a matrix and are buried in a P-well layer, which is formed in the surface region of a semiconductor substrate, to form a plurality of photodiodes, e.g., photodiodes $Pd_1$ and $Pd_2$. Vertical charge transfer paths such as paths $L_1$, $L_2$ and $L_3$, which are formed between adjacent columns of the matrix of the photodiodes $Pd_1$ and $Pd_2$, are provided for transferring signal charges in the direction of arrow Y. The other area of the device than the photodetecting area including those photodiodes and the vertical charge transfer paths, forms the channel stop area. A plurality of gate electrodes $G_1$–$G_4$, for example, which are made of polycrystalline silicon layers, are formed on the surfaces of the vertical charge transfer paths $L_1$, $L_2$ and $L_3$. The image pick-up device provides a four-phase drive system based on each quartet of gate electrodes, which receive clock signals $\phi_1$, $\phi_2$, $\phi_3$, and $\phi_4$.

As shown in FIG. 1, a photodiode $Pd_1$ is formed from the two parallel gate electrodes $G_1$ and $G_2$, and the photodiode $Pd_2$ is formed from the two parallel gate electrodes $G_3$ and $G_4$. The same structure is correspondingly applied for the remaining photodiodes and gate electrodes (not shown). The photodiodes $Pd_1$ and $Pd_2$ are connected via transfer gates $Tg_1$ and $Tg_2$, respectively, to the vertical charge transfer paths $L_1$, $L_2$ and $L_3$. The clock signals $\phi_1$–$\phi_4$, which are set at a predetermined high voltage, permit the charge from the photodiodes to be transferred to the vertical charge transfer paths.

With voltage variations of the clock signals $\phi_1$, $\phi_2$, $\phi_3$, and $\phi_4$ according to the four-phase drive system, potential wells and potential barriers are sequentially generated at predetermined times $t_0$ to $t_4$, as shown in FIG. 2. The vertical charge transfer paths $L_1$, $L_2$ and $L_3$ transfer signal charges in the direction Y toward the horizontal charge transfer path (see FIG. 3). The horizontal charge transfer path transfers the signal charges from the respective vertical charge transfer paths at predetermined times so that the signal charges are read out sequentially.

The solid-state CCD image pick-up device thus arranged provides a so-called interlace/two-field scan read system for reading the signal charges. In the read system, odd-numbered groups, i.e., linear arrays of photodiodes, define an odd-numbered field, and even-numbered groups define an even-numbered field. The signal charges generated in the odd-numbered field are first read out of the photodiodes and then the signal charges of the even-numbered field are read out. Consequently, the signal charges for one frame are read out. However, when photographing a still picture using the conventional image pick-up device, because the even-numbered field and the odd-numbered field are combined to form one frame of an image, the time difference between the fields deteriorates the quality of the image.

FIG. 3 illustrates a solid-state image pick-up device of the frame transfer type (FT-CCD), which provides a scan read function based on the accordion transfer system. See Theuwissen, A.J.P. et al., "The Accordion Imager, A New Solid-State Image Sensor," PHILIPS TECHNICAL REVIEW VOL. 43, No. ½, 1986. This solid-state image pick-up device will be described with reference to FIGS. 3 through 9.

As shown in FIG. 3, the device is made up of a photodetecting portion A consisting of a number m of vertical transfer paths $L_1$ to $L_m$ providing optoelectric transducing and charge transfer functions, a storage portion B consisting of charge transfer paths, which is disposed adjoining the vertical charge transfer paths $L_1$ to $L_m$, and a horizontal charge transfer path C, which is coupled to one end of the group of the charge transfer paths in the storage portion B. Portions B and C generally have surfaces which are covered with a light shield film. Transfer gate electrodes, extending in the charge transfer direction Y, are disposed side by side on the upper surfaces of the vertical charge transfer paths $L_1$ to $L_m$ in a manner such that the gate electrodes correspond to the pixels.

Gate signals are applied to the gate electrodes at times characteristic of the accordion transfer system. In an exposure mode, potential wells and potential barriers corresponding to the pixels are generated in the vertical charge transfer paths $L_1$ to $L_m$. In a transfer mode, the signal charges are transferred in the Y direction by varying the potential wells and the potential barriers at predetermined times. The gate signals are generated in such a way that a shift register, denoted as D, shifts a start pulse IM in synchronism with clock signals $\phi_1$ and $\phi_2$. Gate electrodes are likewise provided for the charge transfer paths in the storage portion B. The signal charges are transferred in the Y direction by gate signals generated in such a way that a shift register E transfers a start pulse ST in synchronism with clock signals $\phi_1$ and $\phi_2$.

The vertical charge transfer paths $L_1$ to $L_m$ and the charge transfer paths in the storage portion B synchronously transfer pixel signals generated in the photodetecting portion A to the storage portion B, where the pixel signals are temporarily stored. Then, the pixel signals are transferred line by line from the storage portion B to the horizontal charge transfer path C. Every time the horizontal charge transfer path C receives the pixel signal, it+horizontally transfers the pixel signal in synchronism with a gate signal generated by a shift register F (not shown). In this way, all of the pixel signals are read out.

The timing of the related signals for the scan read operation are illustrated in FIGS. 4(a) through 4(c). As shown in FIG. 4(a), the start pulses IM and ST are supplied to the shift registers D and E. Those start pulses are transferred in synchronism with the two-phase clock signals $\phi_1$ and $\phi_2$. Then, as shown in FIG. 4(b), gate signals $A_1$, $B_1$, $C_1$, ..., and $H_1$, which are derived from the bit output contacts of the shift register D, are sequentially supplied to the gate electrodes of the vertical charge transfer paths $L_1$ to $L_m$ in photodetecting area A. Similarly, as shown in FIG. 4(c), gate signals $A_s$, $B_s$, $C_s$, ..., $H_s$, which are derived from the bit output contacts of the shift register E, are sequentially supplied to the gate electrodes of the charge transfer paths in the storage portion B. For simplicity, only the gate signals corresponding to eight gate electrodes are illustrated.

When the voltage of the gate signals $A_1$, $B_1$, $C_1$, ..., $H_1$ and $A_s$, $B_s$, $C_s$, ..., $H_s$ is varied, the potential wells and the potential barriers, as shown in FIG. 5, are progressively changed so that the pixels signals are transferred, in order from pixel signals $q_a$ closest to the horizontal charge transfer path C, to the charge transfer paths under the gate electrodes in the photodetecting area A and the storage portion B (the even-numbered gate electrodes and the odd-numbered gate electrodes being denoted Ev and Od, respectively).

The charge transfer through a vertical charge transfer path and the charge transfer path adjacent to the former in the storage portion B can best be understood by referring to FIG. 6. Assuming that the exposure takes place at time $t_0$, potential wells (marked as hatched squares) and potential barriers (white squares) are alternately generated, according to a layout of the gate electrodes, in the vertical charge transfer paths in the photodetecting area A. Pixel signals $q_a$, $q_b$, $q_c$, and $q_d$ are generated along with the potential wells of pixels. The pixel signals are progressively transferred to portion B, starting from the pixel signal $q_a$ closest to portion B. The generation of the potential wells and the potential barriers resembles the gradual expansion and contraction of the bellows of an accordion, hence the reason for referring to the charge transfer system under discussion as the accordion transfer system.

After all of the pixel signals have been temporarily stored in the storage portion B, the pixel signals are transferred in the accordion transfer mode and time sequentially read out through the horizontal charge transfer path C.

The solid-state image pick-up device based on this scan read system is advantageous in that a minimal number of transfer gate electrodes are required, which is favorable for high density integration.

In the image pick-up device just described, the shift register circuitry is constructed with CMOS transistors, and this circuitry, the photodetecting area A, the storage portion B, and the horizontal charge transfer path C are all fabricated into a semiconductor substrate.

The shift register is arranged as shown in FIG. 7 while a longitudinal sectional view of it in the semiconductor substrate is shown in FIG. 8. In FIG. 7, the shift register is constructed between power source voltages Vcc and $V_{DD}$ (VCC>$V_{DD}$). The bit stages of the shift register are constructed with inverting circuits each consisting of a p-channel MOS transistor connected to the power source Vcc and an n-channel MOS transistor. Both transistors are complimentarily coupled with one another. A MOS transistor, which is made conductive and nonconductive by clock signals $\phi_1$ and $\phi_2$, is connected between the input and output contacts. In FIG. 7, capacitive elements $\epsilon$ are constructed utilizing interline capacitance. If the start pulse IM (or ST) is applied to the first bit stage, the shift register shifts the start signal in synchronism with the clock signal $\phi_1$ and $\phi_2$, and produces gate signals at the bit output contacts in synchronism with the clock signal $\phi_1$ and $\phi_2$.

When the shift register and the charge transfer paths are fabricated into a single semiconductor chip, the structure is as shown in FIG. 8. For example, a plurality of n-type impurity layers are formed in the region to serve as a photodetecting area in the p-type semiconductor substrate so as to form the vertical charge transfer paths $L_1$ to $L_m$. A gate oxide film (not shown) is formed on the upper surfaces of the vertical charge transfer paths $L_1$ to $L_m$, and gate electrodes are layered on that oxide film. An n-well layer is buried in a drive region where the circuitry of the shift register is to be formed. A pair of p+-type impurity layers are provided in the n-well layer. Gate electrodes $\eta_p$ are layered with a gate oxide film, not shown, to form a p-channel MOS transistor. An n+-type impurity layer is buried in the semiconductor substrate (p-Sub), and gate electrodes $\eta_n$ are formed on the surface to form an n-channel MOS transistor. Those gates $\eta_p$ and $\eta_n$, and predetermined nodes are connected to form the CMOS inverting circuit (see FIG. 7).

In the solid-state image pick-up device of the CCD type thus constructed, the power source voltage Vcc is set at approximately 10 V and another power source voltage $V_{DD}$ is set at 0 V. The gate signal voltage at the gate electrode also varies between 0 V and 10 V.

In the solid-state image pick-up device, the peripheral circuitry, including the shift registers controlling charge transfer, is constructed of CMOS transistors. Accordingly, it is extremely difficult to provide the image pick-up device with improved functions such as a so-called overflow drain, which drains unnecessary or excessive charges to the semiconductor substrate. In addition, it is difficult to implement an electronic shutter function. These difficulties are due to both the structure of the device and breakdown voltage.

With respect to the structural limitations, the conventional image pick-up device is based on the frame transfer type in which the vertical charge transfer paths include the mechanism for producing pixel signals. If the electronic shutter function is introduced into the image pick-up device, the smear component of the pixel signals is inevitably increased in the resultant reproduced picture. Therefore, the introduction of the electronic shutter function into the conventional image pick-up device is impractical.

With respect to the breakdown voltage limitation, if the vertical overflow drain function is introduced into the conventional image pick-up device, high voltage in the range of about 15 to 25 V must be applied to the semiconductor substrate. This voltage range is high enough to potentially destroy the impurity regions corresponding to the nodes of the CMOS transistors and to cause the gate oxide films to break down.

If the electronic shutter function is realized in the conventional image pick-up device, a much higher voltage must be applied to the semiconductor substrate than in the case of introducing the vertical overflow drain.

These problems can best be understood by referring to FIG. 9, which shows additional details of the conventional image pick-up device. To introduce the electronic shutter function into the image pick-up device, an interline transfer system is necessarily used for the charge transfer. In the photodetecting area, a plurality of $n^+$-type impurity layers are arrayed in matrix in a p-well layer buried in an n-type semiconductor substrate (n-Sub), thereby to form photodiodes. A plurality of n-type impurity layers, which serve as the vertical charge transfer paths $L_1$ to $L_m$, are formed adjoining the $n^+$-type impurity layers. Further, p-type impurity layers are buried around them, and gate electrodes are layered, to form channel stoppers.

In a drive region, a p-well layer is buried, and a pair of $n^+$-type impurity layers are formed in the p-well. A gate oxide film layer (not shown) is layered thereon, and a gate electrode $\eta_n$ is layered on the oxide film layer to form an n-channel MOS transistor. A $p^+$-type impurity layer is buried in the semiconductor substrate (n-Sub), a gate electrode $\eta_p$ is formed on the surface to form a p-channel MOS transistor. A CMOS inverting circuit for the shift register shown in FIG. 7 is formed by properly connecting gate electrodes $\eta_n$ and $\eta_p$ and predetermined nodes.

To provide the structure of the so-called vertical overflow drain, a voltage in the range of 15 to 25 V is applied to the semiconductor substrate. To also provide the electronic shutter function, a structure is required so that, when a shutter voltage SS is applied to the p-well layer in the photodetecting area, which drains the charges generated by the photodiodes to the semiconductor substrate, an npn transistor is formed between the photodiode and the substrate to allow the charge to flow to the substrate.

To transfer the pixel signals, which are generated in the photodiodes by exposure to light, to the vertical charge transfer paths, a high voltage of approximately 12 V is applied to the transfer gates. To provide the normal charge transfer operation by the vertical charge transfer paths, the voltages of the respective signals are set so that the gate signal of 0 V for generating potential wells and the gate signal of approximately $-8$ V for generating potential barriers are supplied from the CMOS shift register to the gate electrodes. In FIG. 9, the substrate voltage $V_s$ is in the range of 15 to 25 V, the power source voltage Vcc is about 0 V, and the voltage $V_L$ is about $-8$ V.

Where the CMOS structure is used and the voltages are set up as just mentioned, the gate signal voltage at the gate electrode varies from $-8$ to 12 V. Under this condition, high voltages ranging from 23 to 33 V are sometimes applied to the gate oxide films under the gate electrodes $\eta_p$ of the p-channel MOS transistors of CMOS in the drive regions. This high voltage is in excess of a nominal breakdown voltage and can damage the oxide film.

The image pick-up device can also provide a frame storage mode, in which an exposure state is set up and continued, and a field scan read for the odd-numbered field and a field scan read for the even-numbered field are alternately repeated at predetermined periods to produce an interlace scan read. In the field storage mode, the pixel signals of the odd-numbered and even-numbered fields are mixed and subjected to a one-time field scan read. This sequence is repeated twice to produce an image corresponding to one frame. At this time, if a moving object is photographed in a still picture photographing mode, the time of reading one field is different from the time of reading the succeeding field, so that the images of the fields read out are different from each other. Therefore, the picture quality of the reproduced image is deteriorated because the reproduced image is the combination of off-center images. In the field storage mode, the pixel signals of one line are formed using two lines of pixel signals. Accordingly, the vertical resolution is reduced to a value corresponding to approximately one-half of the number of pixels.

Referring to FIG. 3, the conventional CCD image pick-up device of the accordion transfer type is based on the so-called frame transfer (FT) system in which the vertical charge transfer paths in the photodetecting area provide both the charge transfer function and the optoelectric transducing function. For this reason, the reproduced image suffers from smear. In the CCD image pick-up device, the vertical charge transfer paths are formed in the p-type substrate. Because of this, the overflow drain function and the so-called substrate-free electronic shutter cannot be brought into full play. This makes it difficult to apply the image pick-up device to a built-in camera in a video tape recorder, electronic still camera, and other types of image pick-up devices.

In the image pick-up device employing the p-well structure having the above functions, a shift register circuit arrangement shown in FIG. 10 is used to form gate signals in order to realize the charge transfer by the accordion transfer system. However, the circuit arrangement involves the following problems.

As shown in FIG. 10, each bit of the shift register consists of a cell structure enclosed by the dotted line. The required number of the cells are connected in a cascade fashion to make up the shift register. The cell structure of the first stage will typically be described. Three NMOS transistors $U_{11}$, $U_{12}$, and $U_{13}$ are inserted between a signal line for a second clock signal $\phi_2$ and an earth contact such that the source-drain paths of those transistors are connected in series. A capacitance $C_{11}$ made by using a gate oxide film is connected between the gate contact and the source contact of the transistor $U_{11}$. The gate contact and the drain contact of the transistor $u_{12}$ are short circuited. The source-drain path of an additional transistor $u_{14}$ is inserted between the source contact of the transistor $u_{11}$ and ground while the gate contact is connected to a signal line for clock signal $\phi_1$. NMOS transistors $u_{15}$ to $u_{18}$, and a capacitor $C_{12}$ make up a similar circuit. The drain contact of the transistor $u_{13}$ of the first circuit of the cell structure is connected to the gate contact of the transistor $u_{15}$ of the second circuit.

The gate contact of the transistor $u_{11}$ constitutes an input contact of the cell structure. The drain contact of the transistor $u_{17}$ comprises an output contact and the gate contacts of the transistors $u_{13}$ and $u_{17}$ comprise reset contacts. A plurality of these cells are connected such that the input contacts and the output contacts of the cells are connected so as to form a cascade connection. A start pulse IM (or ST) is applied to the gate contact of the transistor $u_{11}$ of the first stage cell by way of an NMOS transistor $u_{00}$, which turns on and off in synchronism with the first clock signal $\phi_1$.

In the cascade connection of the cells, the adjacent cells, for example, cells SE1 and SE2, are interconnected as shown. The gate contact of the transistor $u_{13}$ in the first circuit of the cell SE1 is connected to the source contact of the transistor $U_{11}$ in the first circuit of the succeeding cell SE2. The gate contact of the transistor $u_{17}$ in the second circuit of the cell SE1 is connected to the source contact of the transistor $u_{15}$ in the second circuit of the succeeding cell SE2. The cell of the last stage is followed by a terminal circuit, as shown.

Bit output signals $A_1$, $B_1$, $C_1$, ..., $H_1$ or $A_s$, $B_s$, $C_s$, ..., $H_s$ generated at the source contacts of the transistors $u_{15}$ of the respective cells are applied to the transfer gates of the photodetecting area A and the storage portion B, as shown in FIG. 3. The timing of the bit output signals, clock signals $\phi_1$ and $\phi_2$ and the start signal are as shown in FIG. 11.

In the conventional shift register thus constructed, as seen when watching times $t_0$, $t_1$, and $t_2$, the bit output signals $A_1$, $B_1$, $C_1$, ..., $H_1$ or $A_s$, $B_s$, $C_s$, ..., $H_s$ are output during every other period of clock signal $\phi_1$ or $\phi_2$. Therefore, the transfer speed provided by the shift register is only ½ the transfer speed as defined by the frequency of the clock signal $\phi_1$ or $\phi_2$. In other words, the frequency of the clock signal $\phi_1$ or $\phi_2$ must be twice the transfer frequency when the charge is transferred in the vertical direction. This fact indicates that to realize the solid-state image pick-up device of high pixel density, a high frequency oscillator is required, making it difficult to design the shift register.

Further, the conventional shift register cannot be reset until the start pulse reaches the cell of the last stage. Therefore, the propensity of the shift register rejects the resetting of the shift register at desired times by an external controller. In this respect, the control performance of the shift register is not optimal.

SUMMARY OF THE INVENTION

The principal object of the present invention is to provide a solid-state image pick-up device of the charge-coupled device (CCD) type which can provide a clear reproduced image by using a so-called noninterlace/full-frame read system which reads out all of the pixel signals through one-time frame read operation using a system different from the interlace/two-field scan read system employed in the prior art.

Another object of the present invention is to provide a solid-state CCD image pick-up ,device which, when the image pick-up device incorporates an electronic shutter in place of a mechanical shutter, can provide a clear reproduced image by using a so-called noninterlace/full-frame read system which reads out all of the pixel signals through one-time frame read operation.

A further object of the present invention is to provide a solid-state CCD image pick-up device which is free from unwanted blooming in which a vertical overflow drain structure is employed to drain excessive charges of the photodiodes into the substrate. The overflow drain structure advantageously can incorporate an electronic shutter function, which is operable independent of the substrate, because of the charge drainage to the substrate, and is operable in the full frame scan read mode suitable for photographing a still picture because the image pick-up device is of the interline type and yet is capable of the full frame scan read.

Still another object of the present invention is to provide a solid-state CCD image pick-up device providing a function suitable for photographing a motion picture in an interlace scan read mode and a function suitable for photographing a still picture in a noninterlace/frame scan read mode.

Another object of the present invention is to provide a solid-state CCD image pick-up device having an electronic shutter function and which is provided with a shift register capable of generating gate signals for a scan read having increased vertical resolution.

These and other objects, features and advantages of the present invention are achieved by a solid-state image pick-up device of the charge-coupled device type, comprising a plurality of optoelectric transducing elements corresponding to pixels, the elements being vertically and horizontally arrayed in a matrix fashion so as to form column linear arrays and row linear arrays, the column linear arrays defining a column direction and a plurality of vertical charge transfer paths, at least one of the vertical charge transfer paths being associated with a corresponding adjacent column linear array. Pixel signals are vertically transferred from each of the column linear arrays to a corresponding one of the vertical charge transfer paths in a manner such that, after pixel signals generated in the pixels are transferred to the vertical charge transfer paths, gate signals occurring at predetermined times are applied to gate electrodes of the vertical charge transfer paths so as to permit the pixel signals to be scan read from the column linear arrays by the horizontal charge transfer paths. The image pick-up device further comprises switching elements provided for each of a plurality of transfer gate electrodes coupled between a drive signal electrode and a pair of vertical transfer gate electrodes disposed adjacent to each of the optoelectric transducing elements so that the gate electrodes are combined in an order starting from the gate electrode disposed closest to the horizontal charge transfer path into groups each consisting of a predetermined number of gate electrodes. A drive circuit sequentially generates a plurality of drive signals for the groups of the gate electrodes during every period during which the switching elements are rendered conductive and the pixel signals are transferred to the horizontal charge transfer paths from the column linear arrays so as to allow a full frame scan read to be performed through the vertical charge transfer paths by supplying a predetermined number of timing signals, the predetermined number corresponding to the number of gate electrodes, to the gate electrodes as the drive signals from the drive circuit.

According to another embodiment of the present invention, a solid-state CCD image pick-up device comprises a vertical overflow drain structure for draining excessive charges in a photodetecting area into a semiconductor substrate, a plurality of charge transfer paths formed in first well layers buried in the semiconductor substrate and a plurality of drive circuits formed in second well layers, the second well layers being formed at least one of separately from and integrally with the first well layers in the semiconductor substrate, wherein each of the drive circuits comprises a plurality of transistors having a single MOS structure.

According to another embodiment of the present invention, a solid-state CCD image pick-up device comprises a plurality of optoelectric transducing elements corresponding to pixels, the elements being vertically and horizontally arrayed in a matrix fashion, a plurality of vertical charge transfer paths each disposed between the adjacent linear arrays of optoelectric transducing elements which extend in the column direction and a pair of gate electrodes for each of the vertical charge transfer paths adjacent to the optoelectric transducing elements. Pixel signals are vertically transferred from each of the column linear arrays to a corresponding one of the vertical charge transfer paths such that, after pixel signals generated in the pixels are transferred to the vertical charge transfer paths, gate signals occurring at predetermined times are applied to the gate electrodes of the vertical charge transfer paths so as to permit the pixel signals to be scan read from the column linear arrays by a horizontal charge transfer path. The image pick-up device photographs a motion picture by an interlace/2 field scan read such that, by application of the gate signals to the gate electrodes at the predetermined times, the field scan read is performed twice while the pixel signals from two lines of pixel signals are mixed in the horizontal charge transfer path.

Further, another embodiment of the present invention provides a solid-state CCD image pick-up device comprising a plurality of optoelectric transducing elements corresponding to pixels, the elements being vertically and horizontally arrayed in a matrix fashion, the vertically arrayed elements defining a column direction, a plurality of vertical charge transfer paths, each of the paths being operatively coupled to a corresponding one of the linear arrays of optoelectric transducing elements extending in the column direction, a pair of gate electrodes coupled to each of the vertical charge transfer paths adjacent to the optoelectric transducing elements and circuitry for supplying a field shift signal for transferring pixel signals generated in the optoelectric transducing elements to the vertical charge transfer paths at different times for odd-numbered fields and even-numbered fields. Pixel signals are vertically transferred from the column linear arrays to the vertical charge transfer paths such that, after pixel signals generated in the pixels are transferred to the vertical charge transfer paths, application of gate signals occurring at predetermined times to the gate electrodes of the vertical charge transfer paths provides a scan read of the pixel signals from each of the column linear arrays by the horizontal charge transfer path. The image pick-up device photographs a motion picture in an interlace/2 field scan read mode such that a field scan read is performed two times by application of the gate signals to the gate electrodes to allow transfer of pixel charges to the vertical charge transfer paths in an order starting from one of the pixel signals corresponding to the one of the pixels closest to the horizontal charge transfer path.

Additionally, the present invention provides a solid-state CCD image pick-up device comprising a plurality of optoelectric transducing elements corresponding to pixels, the elements being vertically and horizontally arrayed in a matrix fashion to provide column linear arrays and row linear arrays of the elements, the column linear arrays defining a column direction, a plurality of vertical charge transfer paths, each of the paths being operatively coupled to a corresponding one of the optoelectric transducing elements and a pair of gate electrodes for each of the vertical charge transfer paths adjacent to the optoelectric transducing elements. A plurality of pixel signals are vertically transferred from each of the column linear arrays to a corresponding one of the vertical charge transfer paths such that, after the pixel signals are transferred to the vertical charge transfer paths, application of gate signals occurring at predetermined times to the gate electrodes of the vertical charge transfer paths permit a scan read of the pixel signals for each of the column linear arrays by a horizontal charge transfer path. The image pick-up device provides at least one photograph of motion picture in an interlace/2 field scan read model such that the field scan read is performed responsive to two applications of the gate signals to the gate electrodes to allow transfer of pixel charges to the vertical charge transfer paths in an order starting from one of the pixel signals provided by the pixel closest to the horizontal charge transfer path.

To achieve the above objects, the present invention is directed to a solid-state CCD image pick-up device in which a plurality of optoelectric transducing elements corresponding to pixels are vertically and horizontally arrayed in a matrix fashion, and in which vertical charge transfer paths are each disposed between adjacent column linear arrays of optoelectric transducing elements defining a column direction, wherein pixel signals are vertically transferred from each of the column linear arrays to a corresponding one of the vertical charge transfer paths to permit, after pixel signals generated in the optoelectric transducing elements are transferred to the vertical charge transfer paths,, application of gate signals generated at predetermined times from a shift register to gate electrodes of the vertical charge transfer paths at predetermined times, wherein the pixel signals are scan read from the column linear arrays by a horizontal charge transfer path.

More specifically, the shift register comprises first, second and third transistors having source-drain paths connected in series between a first line providing a first timing signal and a predetermined voltage line, a bootstrap capacitor connected between the gate and source of the first transistor and a fourth transistor having a gate contact connected to receive a second timing signal and having a drain contact connected to both a gate contact and the drain contact of the second transistor and having a source contact connected to the predetermined voltage line. The shift register further comprises fifth, sixth and seventh transistors having source-drain paths connected in series between a line providing a second timing signal and the predetermined voltage line, a bootstrap capacitor connected between the gate and source of the fifth transistor and an eight transistor having a gate contact connected to receive the first timing signal, having a drain contact connected to both the gate and drain contacts of the sixth transistor and having a source contact connected to the predetermined voltage line. The shift register further comprises a plurality of bit circuits each having a cell structure in which a node between the second and third transistors is connected to the gate contact of the fifth transistor, the gate contact of the first transistor forms an input contact, and a node between sixth and seventh transistors forms an output contact, wherein the plurality of bit circuits are connected in a cascade fashion to permit the output contact of one bit circuit to be coupled to the input contact of the succeeding bit circuit.

According to one aspect of the present invention, a start pulse is applied to the input contact of the least significant bit circuit through a switching element to be turned on and off in synchronism with the second timing signal and a reset signal is applied to the gate contacts of the third and seventh transistors and bit signals appearing at the output contacts of the bit circuits are applied to transfer gate electrodes.

These and other objects, features and advantages of the invention are disclosed in or apparent from the following description of preferred embodiments.

BRIEF DESCRIPTION OF THE DRAWINGS

The preferred embodiments are described with reference to the drawings, in which like elements are generally denoted by like or similar numbers, and in which.

DESCRIPTION OF THE PREFERRED EMBODIMENTS

A first embodiment of a solid-state image pick-up device of the charge-coupled device type according to the present invention will be described with reference to the accompanying drawings. In this embodiment, the image pick-up device is particularly suited for electronic still cameras.

Figure 12:
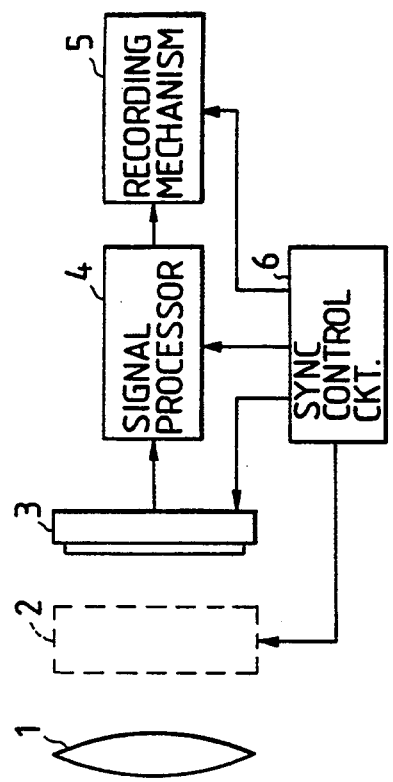
FIG. 12 is a block and schematic diagram showing an electronic still camera incorporating a solid-state image pick-up device of the CCD type according to an embodiment of the present invention.

As shown in FIG. 12, the overall construction of the electronic still camera includes a pick-up optical system 1, a stop mechanism 2, and a solid-state image pick-up device 3 of the CCD type incorporating the present invention. These components are disposed side by side in alignment with one another with respect to an optical axis of the pick-up optical system 1. With the combination of those components, an image of an object is incident on the photodetecting area of the solid-state image pick-up device 3. Preferably, the electronic still camera includes a signal processor 4 and a recording mechanism 5. The signal processor 4 applies the processings of color separation, $\gamma$-correction, white balance adjustment, and the like to the pixel signals generated by the solid-state image pick-up device 3. The recording mechanism 5 advantageously applies the modulation processing to the luminance signal and the color difference signal generated from the recording mechanism 5, thereby converting them into a signal format advantageously suited to recording operations. A sync control circuit 6 synchronously controls the operation of the stop mechanism 2, read times of the solid-state image pick-up device 3, and the operation of the signal processor 4 and the recording mechanism 5. The still camera, under the control of the sync control circuit 6, provides a sequence of operations including the image pick-up and recording.

Figure 13:
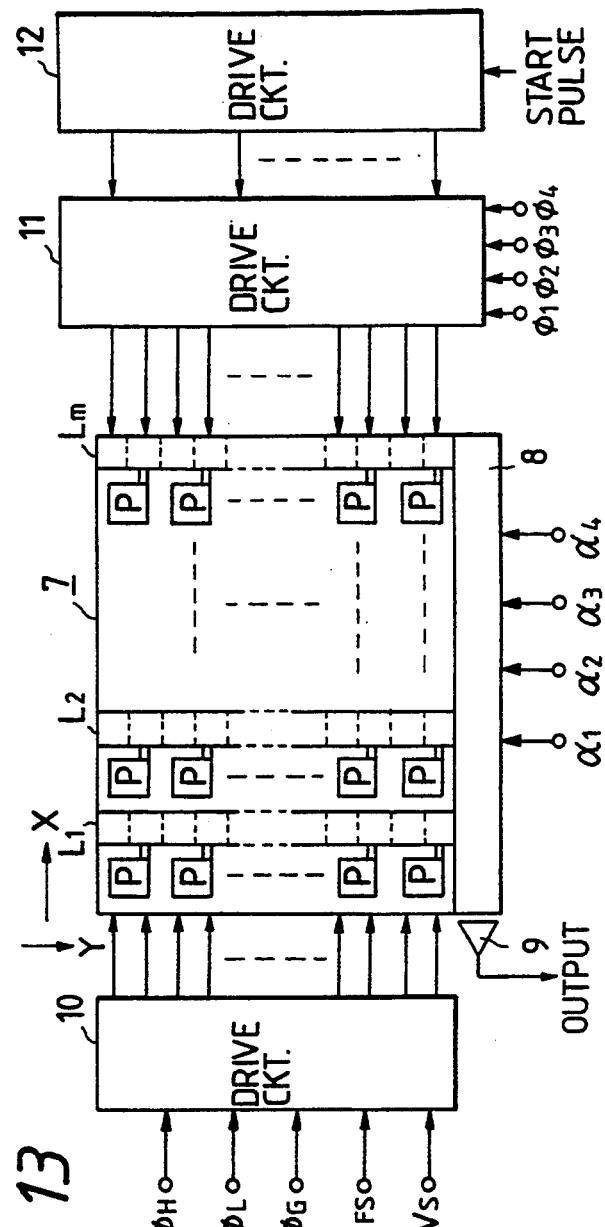
FIG. 13 is a block and schematic diagram showing the solid-state image pick-up device of the invention.

The construction of the solid-state image pick-up device 3 is as shown in FIG. 13, and it includes a photodetecting area 7 including a plurality of matrix-arrayed photodiodes, generally denoted P, corresponding to pixels and vertical charge transfer paths $L_1$ to $L_m$ each disposed between the adjacent linear arrays of photodiodes, which extend in the column direction Y. A horizontal charge transfer path 8 is formed and located at one end of the vertical charge transfer paths $L_1$ to $L_m$. An output amplifier 9 is formed and located at one end of the horizontal charge transfer path 8.

In connection with the vertical charge transfer paths $L_1$ to $L_m$, gate electrodes are provided as discussed in greater detail below. A light shield layer advantageously is provided over the structure to shield light incident on the upper surface. First, second and third drive circuits 10, 11 and 12, respectively, supply signals to the gate electrodes to cause the vertical charge transfer paths $L_1$ to $L_m$ to transfer charges at predetermined times. The sync control circuit 6 of FIG. 12 generates a start pulse and timing signals $\phi_L$, $\phi_G$, $\phi_{FS}$, $\phi_S$, $\phi_1$, $\phi_2$, $\phi_3$, and $\phi_4$, which are supplied to the drive circuits 10, 11, and 12.

The horizontal charge transfer path 8, which receives signal charges transferred from the vertical charge transfer paths $L_1$ to $L_m$, is provided with gate electrodes for horizontally transferring the received signal charges to an output amplifier 9. Gate signals $\alpha_1, \alpha_2, \alpha_3$, and $\alpha_4$, supplied from the sync control circuit 6, are applied to the gate electrodes, causing the horizontal transfer of signal charges.

Figure 14:
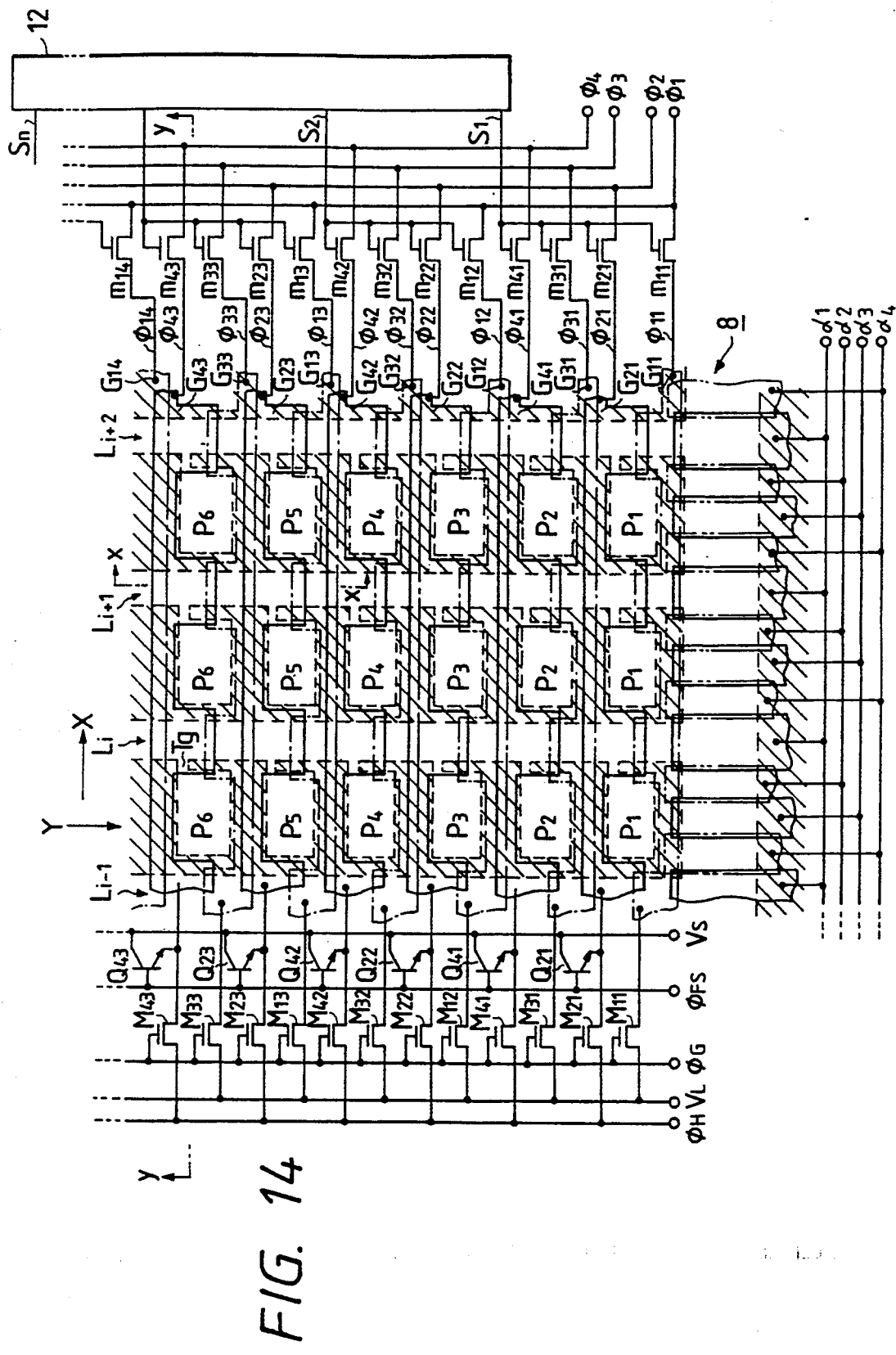
FIG. 14 is a diagram showing the construction of a key portion of a photodetecting area of the image pick-up device, and its periphery circuit arrangement.
Figure 15:
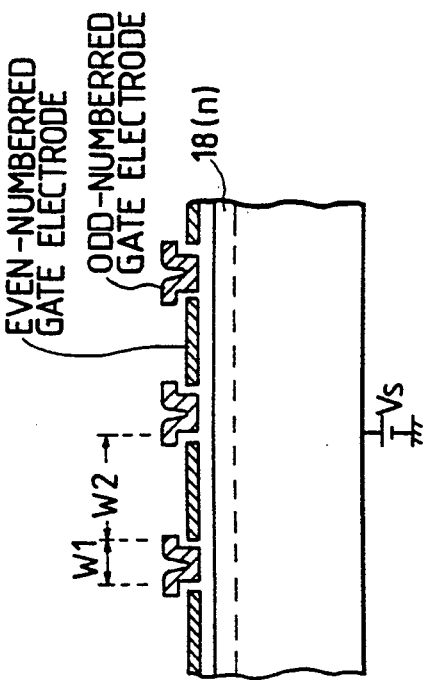
FIGS. 15 and 16 are sectional views showing key portions of the structure shown in FIG. 14.
Figure 16:
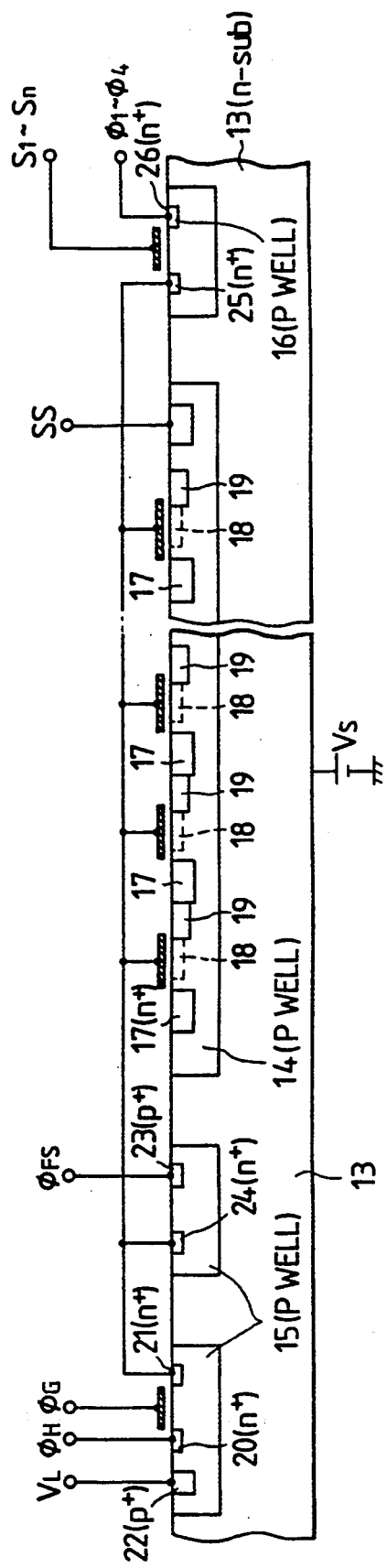

The structure of the photodetecting area 7 and the circuit arrangements of the drive circuits 10, 11, and 12 coupled with the area will be described with reference to FIGS. 14, 15 and 16. FIG. 14 is a plan view showing a key portion of the photodetecting area 7, as viewed from the photodetecting surface. FIG. 15 is a sectional view taken along line x—x in FIG. 14, while FIG. 16 is a sectional view taken along line y—y in FIG. 14.

In these figures, p-well layers 14, 15 and 16 are formed in the surface region of an n-type semiconductor substrate 13. The p-well layer 14 is provided for forming the photodetecting area 7. The p-well layer 14 is also used in forming the first drive circuit 10. The p-well layer 16 is used in forming the second and third drive circuits 11 and 12. The related circuits advantageously are formed in p-well layers 14, 15, and 16.

In the photodetecting area 7, a plurality of impurity layers 17 made of n+ impurity are formed in the column direction Y and the row direction X into a matrix array of photodiodes denoted as P in FIG. 13. A plurality of n-type impurity layers 18 (indicated by dotted lines in FIG. 16) are formed between the adjacent linear arrays of impurity layers 17, which extend in the column direction Y to form the vertical charge transfer paths $L_1$ to $L_m$ shown in FIG. 13. A plurality of p+impurity layers 19 are formed, in a surrounding fashion, in the portions exclusive of the portions to serve as transfer gates denoted as Tg (only one portion is typically illustrated in FIG. 14), the photodiode portions, and the portions of the vertical charge transfer paths to form channel stopper regions (shaded portions enclosed by dotted lines in FIG. 14).

In FIG. 14, the horizontal linear arrays of photodiodes P (FIG. 13) are denoted, in order from the bottom, as $P_1$, $P_2$, $P_3$, . . . , $P_6$, respectively. Gate electrodes $G_{11}$ to $G_{41}$, $G_{12}$ to $G_{13}$ to $G_{43}$, . . . $G_{in}$ to $G_{4n}$, each consisting of paired polycrystalline silicon layers, are layered on the upper surfaces of the vertical charge transfer paths $L_1$ to $L_n$, while being respectively adjacent to the horizontal linear arrays of photodiodes $P_1$, $P_2$, $P_3$, . . ., $P_6$. As shown in FIGS. 14 and 15, the odd-numbered gate electrodes, $G_{11}$, $G_{31}$, $G_{12}$, $G_{32}$, $G_{13}$ and $G_{33}$, for example, are designed to have a narrow width W1, while the even-numbered gate electrodes, such as $G_{21}$, $G_{41}$, $G_{22}$, $G_{42}$, $G_{23}$ and $G_{43}$, are designed to have a wide width W2. Here, those gate electrodes are counted, with the gate electrode $G_{11}$ as the first gate electrode.

Gate signals $\phi_{11}$, $\phi_{21}$, $\phi_{31}$, $\phi_{41}$, $\phi_{12}$, $\phi_{22}$, $\phi_{32}$, and $\phi_{42}$ are applied at predetermined times (discussed below) to the gate electrodes so that potential wells (referred to as transfer pixels) and potential barriers, which are for charge transfer, are generated in the vertical charge transfer paths under the gate electrodes. When a predetermined high voltage is applied to the even-numbered gate electrodes $G_{21}$, $G_{41}$, $G_{21}$, $G_{42}$, $G_{23}$ and $G_{43}$, the transfer gates Tg become conductive. The transfer pixels, which are generated under the even-numbered gate electrodes $G_{21}$, $G_{41}$, $G_{22}$, $G_{42}$, $G_{23}$ and $G_{43}$ located adjacent to the horizontal linear arrays of photodiodes $P_1$, $P_2$, $P_3$, . . . , $P_6$ become conductive. Under this condition, transfer of signal charges from the photodiodes to the transfer pixels is allowed.

As shown in FIG. 14, the horizontal charge transfer path 8 is formed in the location at the end of the vertical charge transfer paths $L_1$ to $L_m$, and gate electrodes are provided for horizontally transferring signal charges at the times providing either a four- or a two-phase drive system.

A circuit arrangement of the first drive circuit 10 will be described with reference to FIGS. 14 and 16. The leading end of the odd-numbered gate electrodes $G_{11}$, $G_{31}$, $G_{12}$, $G_{32}$, $G_{13}$ and $G_{33}$ are connected to a signal line providing a $V_L$, through NMOS transistors $M_{11}$, $M_{31}$, $M_{12}$, $M_{32}$, $M_{13}$ and $M_{33}$. The leading ends of the even-numbered gate electrodes $G_{21}$, $G_{41}$, $G_{22}$, $G_{42}$, $G_{23}$ and $G_{43}$ are connected to a signal line providing a drive signal $\phi_H$ through NMOS transistors $M_{21}$, $M_{41}$, $M_{22}$, $M_{42}$, $M_{23}$ and $M_{43}$. It will be apparent that the gate electrode $G_{11}$ closest to the horizontal charge transfer path 8 is counted as the first gate electrode. A drive signal $\phi_G$ is applied to the gate contacts of those transistors.

The leading ends of the even-numbered gate electrodes $G_{21}$, $G_{41}$, $G_{22}$, $G_{42}$, $G_{23}$ and $G_{43}$ are connected to the emitter contacts of npn transistors $Q_{21}$, $Q_{41}$, $Q_{22}$, $Q_{42}$, $Q_{23}$ and $Q_{43}$, respectively. A drive signal $\phi_{FS}$ is applied to the base contacts of those transistors, and voltage $V_s$ is applied to the collector contacts.

Each NMOS transistor is constructed from a pair of n+ impurity layers 20 and 21, and a gate electrode layered on the surface portion, as shown in the structure within the p-well layer 15 in FIG. 16. A drive signal $\phi_H$ is coupled with the n+ impurity layer 20 to serve as a drain contact. The n+ impurity layer 21 to serve as a source contact is connected to the gate electrode on the vertical charge transfer path. The signal $V_L$ is applied to a p+impurity layer 22 buried in the p-well layer 15. The npn transistor includes a p+ impurity layer 23 buried in the p-well layer 15, an n+ impurity layer 24 and an n-type semiconductor substrate 13. The n+ impurity layer 24 serving as an emitter contact is connected to the gate electrodes. A timing signal $\phi_{FS}$ is applied to the p-well layer 15, serving as the base contact and the p+impurity layer 23. A bias voltage Vs for the substrate 13 is applied to the n-type semiconductor substrate 13 serving as the collector contact. The second drive circuit 11 includes NMOS transistors $m_{11}$, to $m_{4n}$ which select the timing signals $\phi_1$ to $\phi_4$ from the sync control circuit 6 in synchronism with drive signals $S_1$ to $S_n$ generated from the third drive circuit 12. The NMOS transistors are grouped into quartets of transistors. The drive signals $S_1$, $S_2$, $S_3$ and $S_4$ are sequentially applied to their gate contacts. The timing signal $\phi_1$ is applied to the drain contacts of the first NMOS transistors $m_{11}$, $m_{12}$, $m_{13}$ and $m_{14}$, timing signal $\phi_2$ is applied to the drain contacts of the second NMOS transistors $m_{21}$, $m_{22}$, $m_{23}$ and $m_{24}$, timing signal $\phi_3$ is applied to the drain contacts of the third NMOS transistors $m_{31}$, $m_{32}$, $m_{33}$ and $m_{34}$ and timing signal $\phi_4$ is applied to the drain contacts of the fourth NMOS transistors $m_{41}$, $m_{42}$, $m_{43}$ and $m_{44}$. The signals $\phi_{11}$, $\phi_{21}$, $\phi_{31}$ and $\phi_{41}$ coupled with the source contacts of the NMOS transistors $m_{11}$, $m_{21}$, $m_{31}$ and $m_{41}$ in FIG. 14, respectively, correspond to the timing signals $\phi_1$, $\phi_2$, $\phi_3$, and $\phi_4$.

As shown, gate electrodes are connected, starting with gate electrode $G_{11}$ closest to the horizontal charge transfer path 8, to the source contacts of the NMOS transistors.

The third drive circuit 12 ,includes a shift register for producing drive signals $S_1$ to $S_n$ at predetermined times, as discussed in greater detail below.

Second and third drive circuits 11 and 12 are each composed of an NMOS transistor formed in the p-well layer 16 shown in FIG. 16, and other electronic components. A plurality of n+ impurity layers 25 and 26 forming an NMOS transistor and a gate contact, by way of example, are formed in the p-well layer 15, as shown in FIG. 16.

The operation of the image pick-up device when it takes a still picture will be described with reference to FIG. 17. It is assumed that the period $T_{VB}$ corresponds to the vertical blanking period of a standard television system, i.e., an NTSC television system. At a predetermined time during the period $T_{VB}$, a so-called field shift is performed to shift the pixel charges from the photodiodes to the vertical charge transfer paths. For the electronic shutter function, the time of the field shift operation corresponds to a time at which a shutter is closed, i.e., exposure completion. Accordingly, the exposure operation starts at a time after the shutter close time, and the device operates so that the exposure time ranges from the exposure start time to a time of starting the field shift operation. The unnecessary charges possibly causing the smear component and the dark current component in the vertical charge transfer paths $L_1$ to $L_m$ and the horizontal charge transfer path 8, are discharged by the charge transfer operation before the field shift starts. Further, immediately before the exposure starts, the unnecessary charges in the photodiodes are drained by the vertical overflow drain structure.

During the period $T_{VB}$ corresponding to the vertical blanking period of the standard television system, the pixel signals of all of the photodiodes are simultaneously transferred to the transfer pixels of the vertical charge transfer paths $L_1$ to $L_m$. During the period $T_{HB}$ corresponding to the horizontal blanking period, a pixel signal of the transfer pixel closest to the horizontal charge transfer path 8 is transferred to the transfer path 8. During a period $T_{1H}$ corresponding to the horizontal scan period (called a 1 H period), the pixel signals of one line are horizontally transferred through the horizontal charge transfer path 8. As a result, the pixel signals of the first line are read out.

Then, during the period $T_{HB}$ corresponding to the next horizontal blanking period, the vertical charge transfer paths $L_1$ to $L_m$ feed the pixel signals of the next line to the horizontal charge transfer path 8. During a period $T_{1H}$ corresponding to the next horizontal scan period, the pixel signals are horizontally transferred through the horizontal charge transfer path 8. In this way, the pixel signals of the second line are read out.

The pixel signals of the third line are likewise read out of the photodiodes during periods $T_{HB}$ and $T_{1H}$. The pixel signals of the remaining lines are successively read out while repeating this sequence of operations. Finally, all of the pixel signals of one frame are read out.

Figure 18:
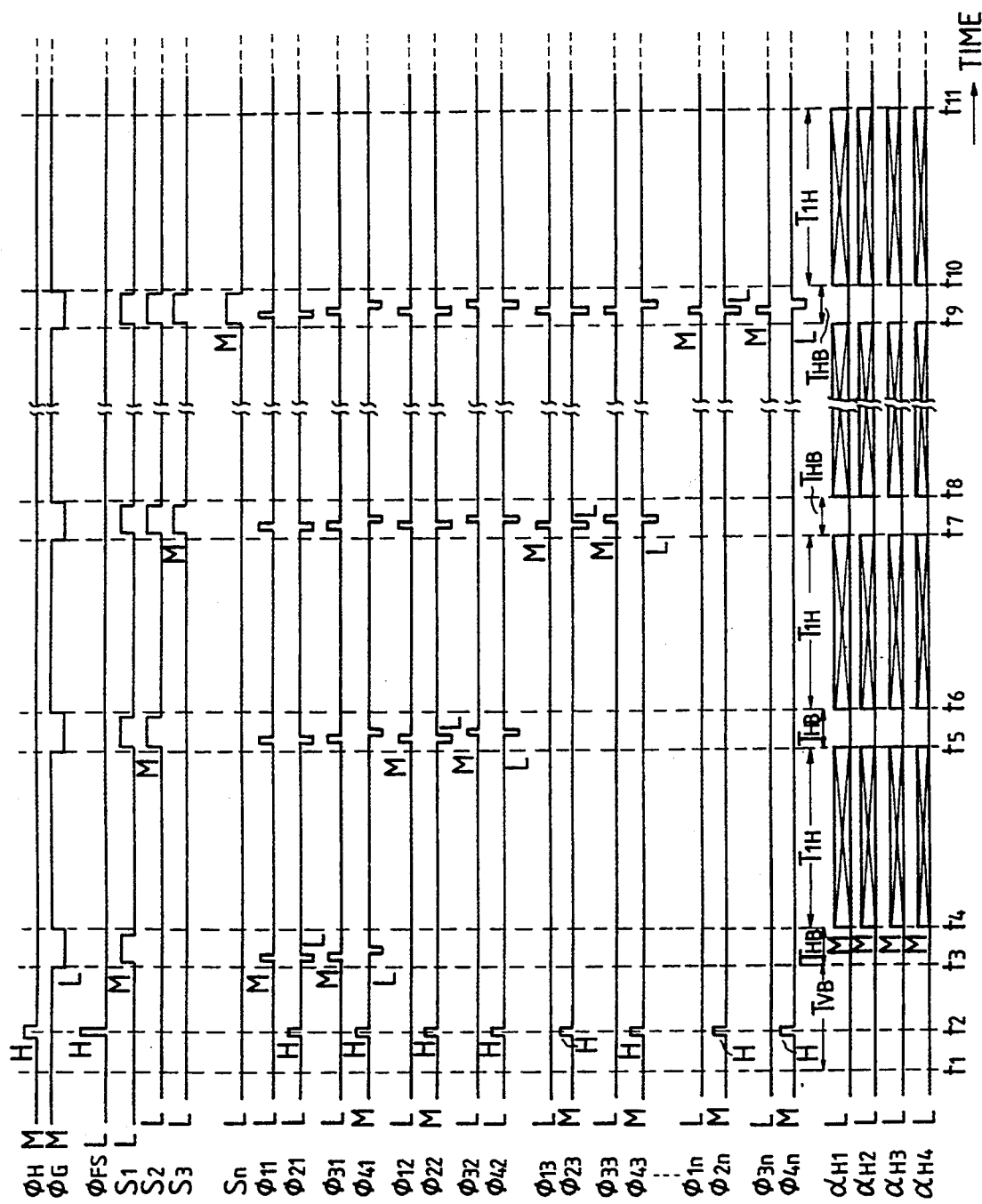
FIGS. 18 through 23 are timing charts showing in detail the scan read operation of the image pick-up device of the embodiment.

The scan read operation will be described in greater detail with reference to FIG. 18, which shows a timing chart for drive signals and timing signals. In FIG. 18, the period $T_{VB}$ corresponds to the vertical blanking period, period $T_{HB}$ corresponds to the horizontal blanking period and period $T_{1H}$ corresponds to the horizontal scan period. Further, "H" indicates a voltage of about 12 V, "M" indicates a voltage of about 0 V, "L" indicates a voltage of about −8 V and "HH" indicates approximately 15 to 25 V, which is equal to the substrate voltage.

During the period $T_{VB}$ corresponding to the vertical blanking period, the timing signal $\phi_H$ goes high (H) only at a predetermined time $t_2$, and remains at a level "M" during the remaining time. The timing signal $\phi_G$ is always at the "M" level. The timing signal $\phi_{FS}$ goes high as the timing signal $\phi_H$ goes high, and is kept at the "L" level during the remaining time. The drive signals $S_1$ to $S_n$ generated from the third drive circuit 12 are always at the "L" level.

During the period $T_{VB}$, all of the NMOS transistors of the first drive circuit 10 are rendered conductive by the timing signal $\phi_G$ at the "M" level, while at the same time all of the drive signals $S_1$ to $S_n$ of the third drive circuit 12 are set at the "L" level. Accordingly, all of the NMOS transistors in the second drive circuit 11 become conductive. All of the gate electrodes $G_{11}$, $G_{21}$, $G_{31}$, $G_{41}$ to $G_{in}$, $G_{2n}$, $G_{4n}$ are controlled by the first drive circuit 10.

More specifically, when the timing signals $\phi_H$ and $\phi_{FS}$ are not at the "H" level, the gate signals $\phi_{11}$, $\phi_{31}$, $\phi_{12}, \phi_{32}$ to $\phi_{in}$, $\phi_{3n}$, which are applied to the odd-numbered gate electrodes $G_{11}$, $G_{31}$, $G_{12}$, $G_{32}$ to $G_{in}$, $G_{3n}$, are each equal in voltage level to the signal $V_L$ (constantly set at −8 V). Under this condition, potential barriers are generated in the vertical charge transfer paths $L_1$ to $L_m$ under those gate electrodes.

The gate signals $\phi_{21}$, $\phi_{41}$, $\phi_{22}$, $\phi_{42}$ to $\phi_{2n}$, $\phi_{4n}$, which are applied to the even-numbered gate electrodes $G_{21}$, $G_{41}$, $G_{22}$, $G_{42}$ to $G_{2n}$, $G_{4n}$, are each equal in voltage to the signal $\phi_H$ at the "M" level. Under this condition, transfer pixels are generated in the vertical charge transfer paths $L_1$ to $L_m$ under those gate electrodes.

Accordingly, all of the portions adjacent to the transfer gates Tg (see FIG. 14) serve as the transfer pixels being separated from one another by the potential barriers.

Under this condition, when the timing signals $\phi_H$ and $\phi_{FS}$ go high at time $t_2$, all of the npn transistors $Q_{21}$, $Q_{41}$, $Q_{61}$, etc., become conductive and the "H" level voltage of approximately 12 V is applied to only the even-numbered gate electrodes $G_{21}$, $G_{41}$, $G_{22}$, $G_{42}$ to $G_{2n}$, $G_{4n}$. Accordingly, all of the transfer gates Tg become conductive, and all of the pixel signals of the photodiodes are transferred to the adjacent transfer pixels.

Figure 17:
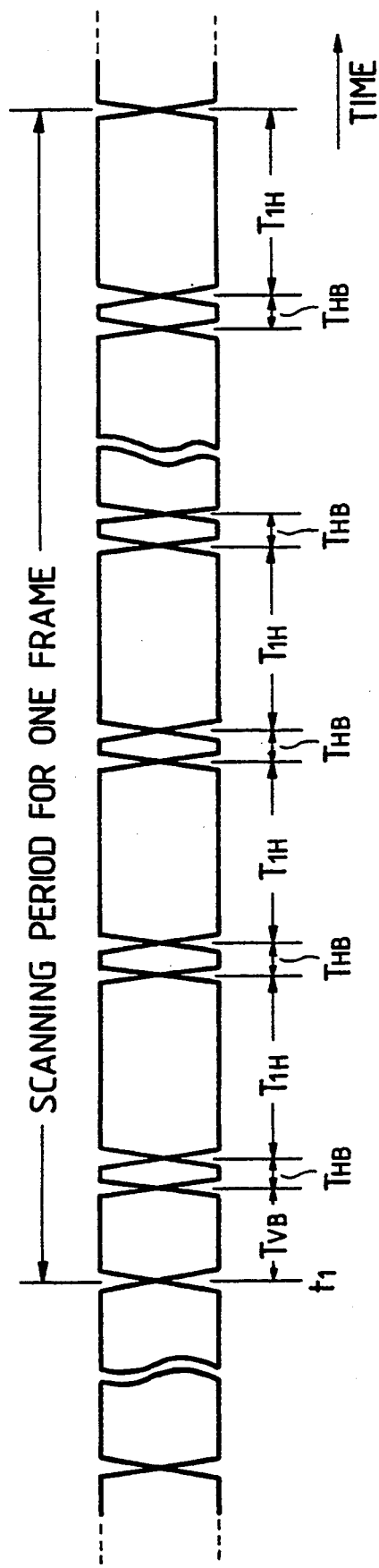
FIG. 17 is a waveform roughly showing a scan read operation of the image pick-up device.
Figure 22:
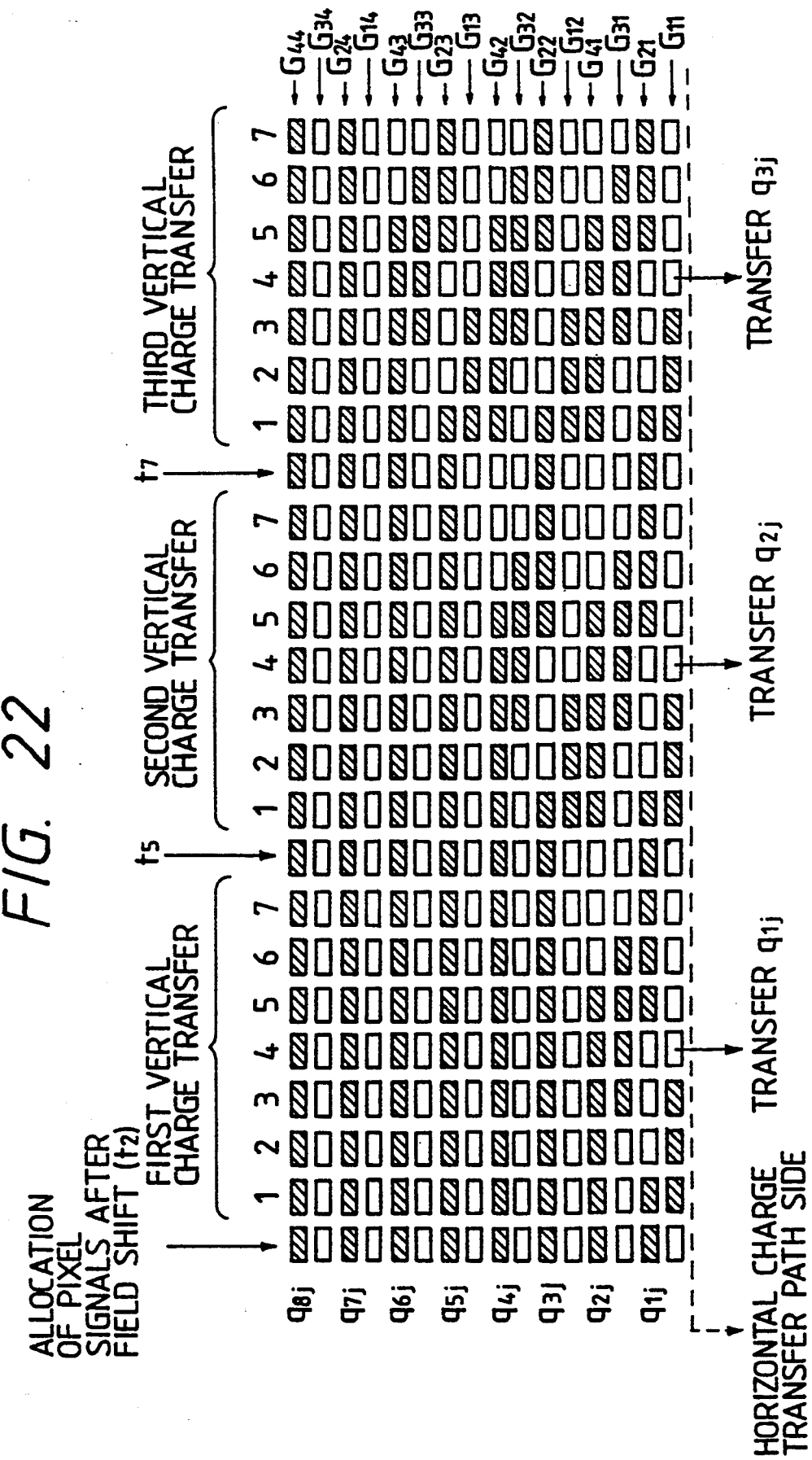

As already described referring to FIG. 17, the exposure process has been completed just before the time $t_2$, and the removal of the unnecessary charges has also been completed. During the period $T_{VB}$, a so-called field shift operation is performed, so that at the time $t_2$ in FIG. 22, the pixel signals (marked as shaded squares) are transferred to the vertical charge transfer paths. FIG. 22 is a view showing the charge transfer operation of one vertical charge transfer path. During the period $T_{HB}$ corresponding to the first horizontal blanking period, the timing signal $\phi_G$ is always at the "L" level. Accordingly, all of the NMOS transistors in the first drive circuit 10 become nonconductive and are separated from all of the gate electrodes.

Only the drive signal $S_1$ at the first output terminal of the third drive circuit 12 is set at the "M" level, while the remaining drive signals $S_2$ to $S_n$, are at the "L" level. This renders only the first set of NMOS transistors $m_{11}$, $m_{21}$, $m_{31}$, $m_{41}$ conductive due to the drive signal $S_1$ of the second drive circuit 11.

During the period when only the drive signal $S_1$ is set at the "M" level, the timing signals $\phi_1$, $\phi_2$, $\phi_3$, and $\phi_4$ of four phases for the vertical charge transfer are supplied to the second drive circuit 11. Accordingly, only the first set of gate signals $\phi_{11}$, $\phi_{21}$, $\phi_{31}$, and $\phi_{41}$ are equal in level to the timing signals $\phi_1$, $\phi_2$, $\phi_3$, and $\phi_4$. The charge transfer is performed by the first set of gate electrodes $G_{11}$, $G_{21}$, $G_{31}$, and $G_{41}$. The enlarged signal waveforms during the period $T_{HB}$ are shown in FIG. 19.

Figure 19:
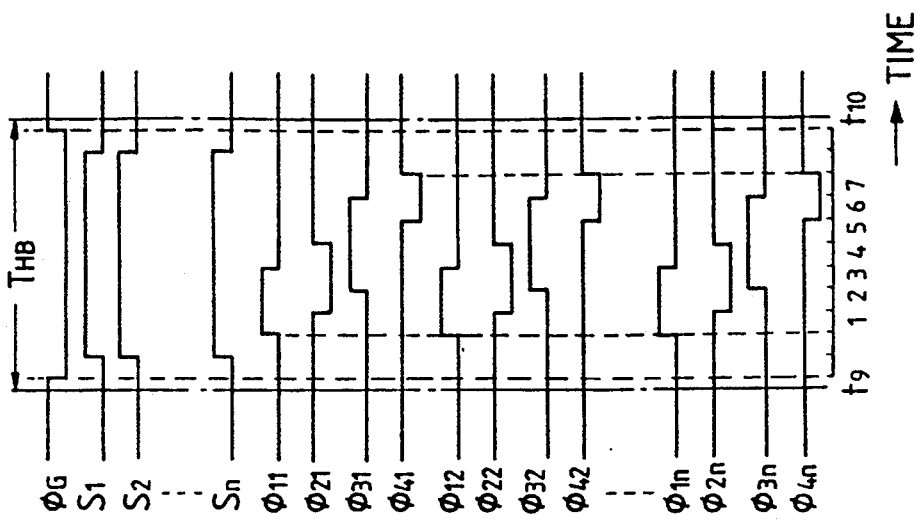

As a consequence, the signal charges are transferred to the horizontal charge transfer path 8 at the times (indicated by numerals 1, 2, 3, 4, 5, 6, and 7) of the gate signals $\phi_{11}$, $\phi_{21}$, $\phi_{31}$, and $\phi_{41}$ in FIG. 19, as in the first transfer shown in FIG. 22. A pixel signal $q_{1j}$ of the first line closest to the horizontal charge transfer path 8 is transferred to the transfer path 8. A pixel signal $q_{2j}$ of the second line moves to the first line position.

Then, during the first horizontal scan period $T_{1H}$ (between times $t_4$ and $t_5$), the variation of the signal applied to each gate electrode stops, and the horizontal charge transfer path 8 vertically transfers signal charges in synchronism with the gate signals $\alpha_1$ to $\alpha_4$ recurring at predetermined times according to the four- or two-phase drive system. As a result, pixel signals of the first line are read out.

During a period between times $t_5$ to $t_7$, a sequence of operations, which is similar to that during the period between times $t_3$ to $t_5$, is repeated to read the pixel signals of the next line out of the image pick-up device. During the horizontal blanking period $T_{HB}$ between times $t_3$ to $t_4$, the drive signals $S_1$ and $S_2$ of the third drive circuit 12 are simultaneously set to the "M" level and the remaining drive signals $S_3$ to $S_n$ are set to the "L" level. The enlarged signal waveforms during this period $T_{HB}$ are shown in FIG. 20.

Consequently, a set of the first to fourth gate electrodes $G_{11}$ to $G_{41}$, and two sets of fifth to eighth gate electrodes $G_{12}$ to $G_{42}$ are driven by the gate signals $\phi_{11}$ to $\phi_{41}$ and $\phi_{12}$ to $\phi_{42}$, which are equal to the timing signals $\phi_1$, $\phi_2$, $\phi_3$, and $\phi_4$. The result is the vertical transfer of the pixel signals under those gate electrodes.

Figure 20:
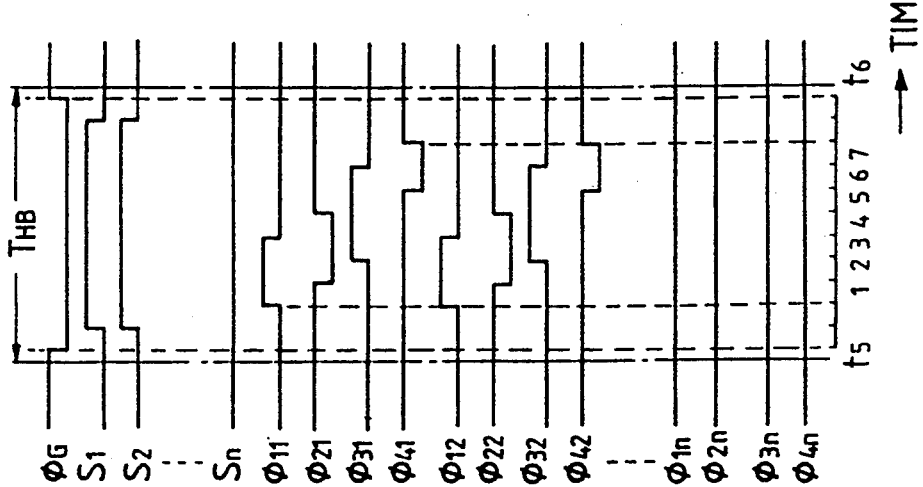

The timing chart shown in FIG. 20 shows that as indicated by the second vertical scan in FIG. 22, the pixel signal $q_{2j}$ of the second line is transferred to the horizontal charge transfer path 8. Two lines of the pixel signals $q_{3j}$ of the third line and one line of the pixel signal $q_{4j}$ of the fourth line are transferred to the horizontal charge transfer path 8.

During the horizontal scan period $T_{1H}$ between times $t_6$ and $t_7$, the horizontal charge transfer path 8 reads out the pixel signal $q_{2j}$ of the second line.

The third scan read starts at time $t_7$. Then, the drive signals $S_1$, $S_2$, and $S_3$ are set at the "M" level, while the remaining drive signals $S_4$ to $S_n$ of the third drive circuit 12 are set at the "L" level. The first to third sets of first to 12th gate electrodes $G_{11}$ to $G_{41}$, $G_{12}$ to $G_{42}$ to $G_{42}$, and $G_{13}$ to $G_{42}$ are driven for the vertical charge transfer. Accordingly, as in the third transfer of FIG. 22, the pixel signal $q_{3j}$ of the third line is transferred to the horizontal charge transfer path 8. The pixel signals $q_{4j}$ to $q_{7j}$ of the 4th to 7th lines are transferred every line to the horizontal charge transfer path 8.

Then, the pixel signal $q_{3j}$ is read out of the photodiodes by the horizontal charge transfer path 8.

Figure 21:
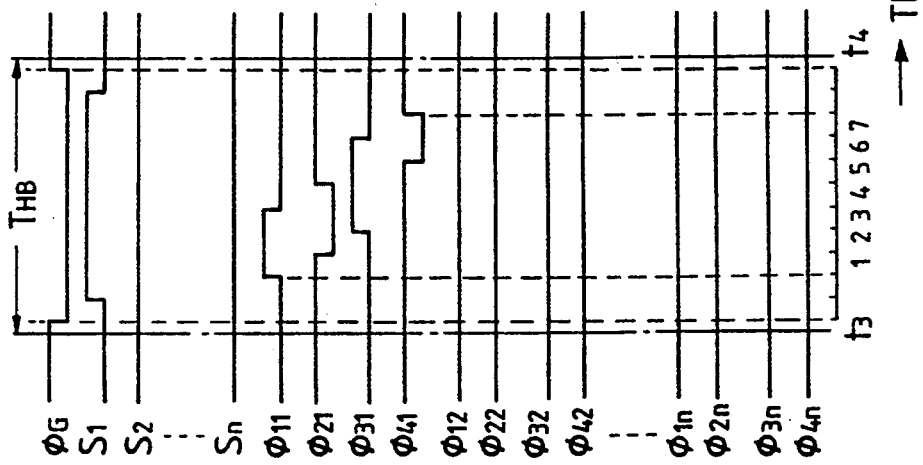

Subsequently, the drive signals $S_4$ to $S_n$ of the third drive circuit 12 are progressively inverted to "M" level every time the pixel signal of each line is read out. The gate electrodes to be driven are increased every four gate electrodes. During the horizontal blanking period $T_{HB}$ (between times $t_9$ and $t_{10}$), all of the gate signals $\phi_{11}$ to $\phi_{4n}$ have the same waveforms as those of the timing signals $\phi_1$ to $\phi_4$, as shown in FIG. 21. The pixel signals of the last line are read out by the final scan read operation.

Figure 23:
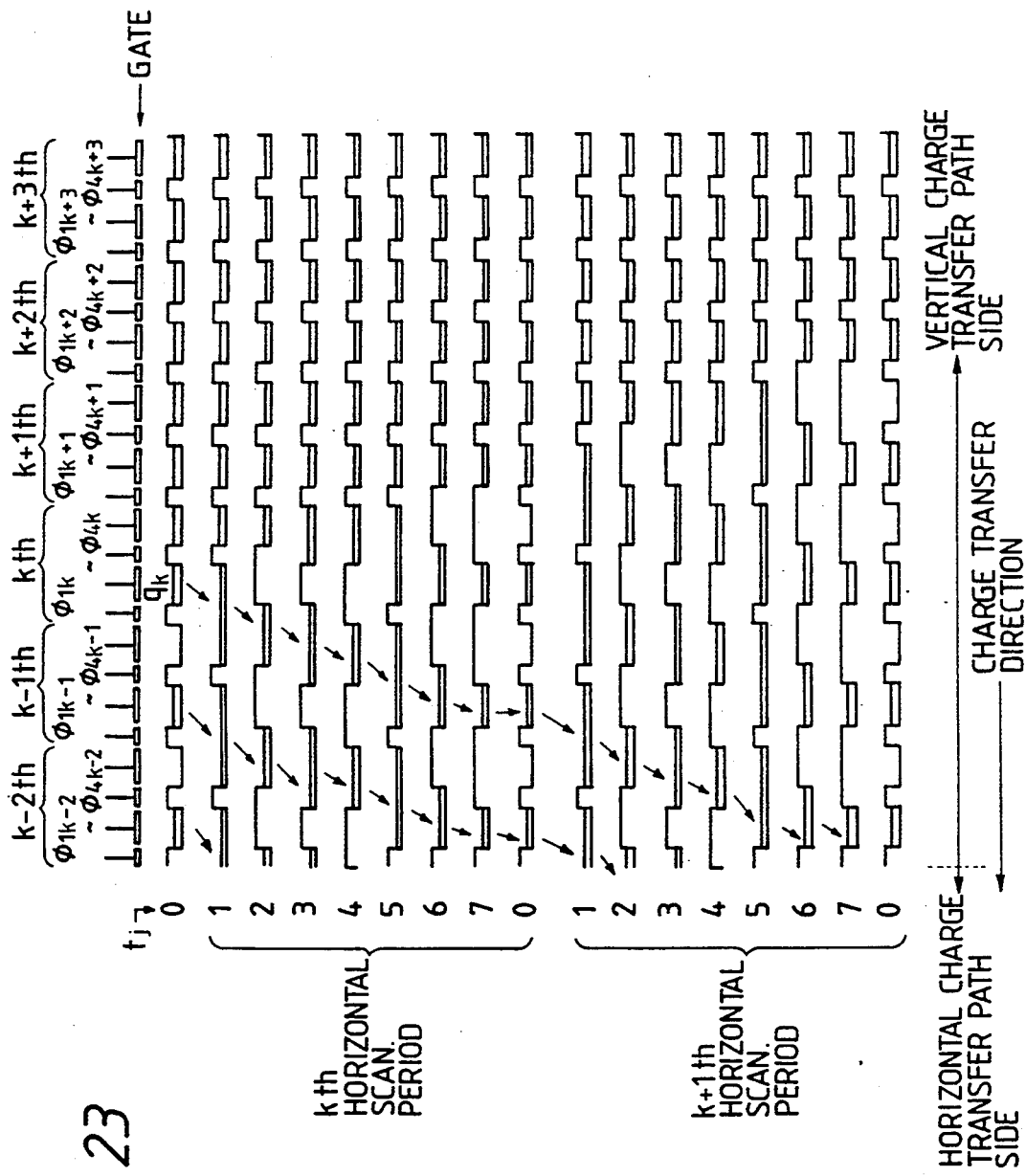

FIG. 23 shows the K-th and (K+1)th vertical charge transfer operations, for example, in terms of potential profiles. As shown, in order from the transfer pixel closest to the horizontal charge transfer path 8, the intervals of the idle transfer pixels progressively increase. With this the pixel signals are progressively read out in the order from the pixel signal closest to the transfer path 8 to the succeeding ones.

It will be appreciated that, in the present embodiment, the pixel signals of one frame can be read out by a single frame scan read operation.

The width of the odd-numbered gate electrodes is wider than that of the even-numbered gate electrodes. This feature advantageously allows an increase in a charge retaining capacitance of the transfer pixels adjacent to the transfer gates. Additionally, during the vertical charge transfer, the transfer pixels under the even-numbered gate electrodes are used for the charge transfer, thereby improving the charge transfer efficiency.

It will also be apparent that the charge transfer is performed in synchronism with the four-phase timing signals $\phi_1$, $\phi_2$, $\phi_3$, and $\phi_4$ during the period $T_{HB}$ corresponding to each horizontal blanking period. If necessary, timing signals having four or more phases may be used for driving the gate electrodes corresponding to the number of phases.

The solid-state image pick-up device thus arranged can read all of the pixel signals of one frame through one-time frame scan read operation. Therefore, exposure through the electronic shutter can be applied to all of the pixel signals under the same conditions. Accordingly, the image pick-up device can reproduce a clear image having a high vertical resolution.

As described above, in the solid-state image pick-up device of the CCD type according to the invention, the exposure is performed at the grouped optoelectric transducing elements corresponding to the pixels allowing the pixel signals generated in the optoelectric transducing elements to be read out through the vertical and horizontal charge transfer paths by a full-frame scan read operation. Accordingly, still picture reproduction is clear.

It will be appreciated that the solid-state CCD image pick-up device provides a so-called electronic shutter function such that a predetermined voltage applied to the semiconductor substrate to drain excessive or unnecessary charges into the substrate, and the exposure starts at the time of completing the excessive charge drainage.

Additionally, the paired gate electrodes adjacent to each other cause the transfer paths to generate therein the transfer pixels and potential barriers. Accordingly, the transfer paths can transfer charges while preventing the charges from being mixed. This realizes the most efficient charge transfer and provides a means to effectively improve the vertical resolution.

Another preferred embodiment of the present invention, which includes a third drive circuit 12, will be described with reference to FIG. 24. The third drive circuit 12 consists of a shift register for shifting a start pulse $\phi_S$ in synchronism with two-phase clock signal $\phi_A$ and $\phi_B$ to sequentially generate drive signals of logic "H" in the order from the low- order bit to the high-order bit. In the first period, only the first drive signal $S_1$ goes high ("H"), while the remaining high-order bits are all low ("L") in logic level. In the second period, two low-order bits $S_1$ and $S_2$ go high, while the remaining high-order bits are low. In the third period, three low-order bits $S_1$, $S_2$, and $S_3$ go high, while the remaining high-order bits are low. Thus, the number of high drive signals progressively increases in order from the low-order bits to the high-order bits.

Figure 24:
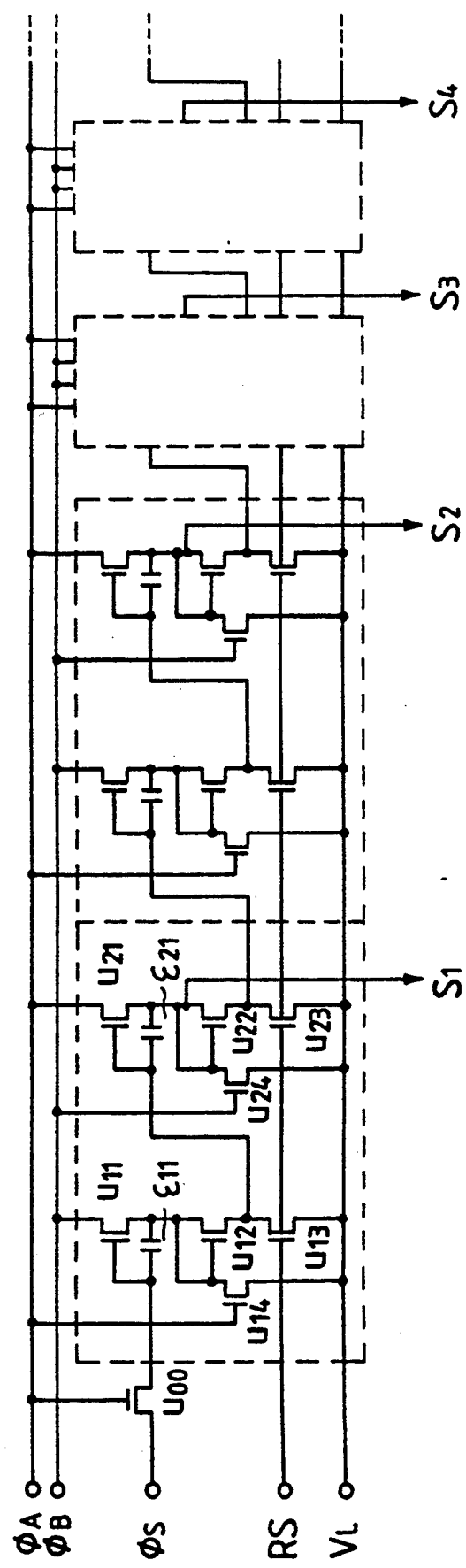
FIG. 24 is a circuit diagram showing a drive circuit used in another embodiment of the present invention.

As shown in FIG. 24, each bit has a corresponding cell structure, and hence the circuit of the first bit will be typically described. The source-drain paths of three MOS $u_{11}$, $u_{12}$, $u_{13}$, and $u_{14}$ are connected in series between a signal line of the voltage $V_L$ and a signal line of the clock signal $\phi_B$. A signal line for the reset signal RS is connected to the gate contact of the transistor $u_{13}$. A bootstrap capacitor $\epsilon_{11}$ is connected between the gate contact and the drain contact of the transistor $u_{11}$. The gate contact and the source contact of the transistor $u_{12}$ are connected to each other, and to the source contact of the transistor $u_{14}$. The transistor $u_{14}$ is connected at the drain contact to the signal line for the voltage $V_L$ and at the gate contact to the signal line for the clock signal $\phi_4$.

Transistors MOS $U_{22}$, $U_{22}$, $U_{23}$, and $u_{24}$ make up the same circuit as that made up of the transistors MOS $U_{11}$, $U_{12}$, $U_{13}$, and $u_{14}$. The drain contact (output point) of the transistor $u_{12}$ is connected to the gate contact (input point) of the transistor $u_{22}$. However, the connection of the signals $\phi_A$ and $\phi_B$ thereto is inverted.

The bit input corresponds to the gate contact of the gate contact of the transistor $u_{11}$. The bit output corresponds to the drain contact of the transistor $u_{22}$. An n-bit shift register is formed by connecting the inputs and outputs of those bit cells in a cascade fashion. A start pulse $\phi_s$ is inputted to the least significant bit cell through an analog switch $u_{00}$ which is rendered conductive in synchronism with the clock signal $\phi_A$.

Figure 1:
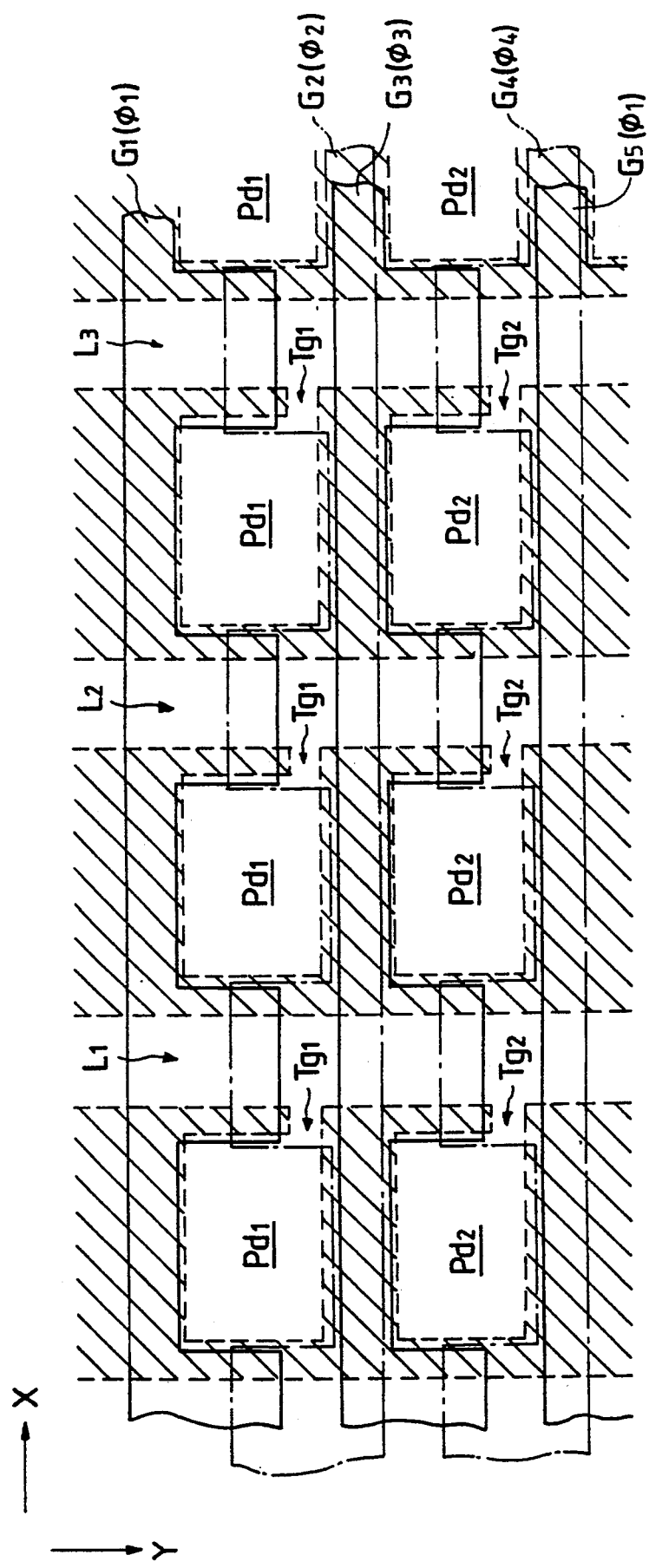
FIG. 1 is a plan view showing the structure of a key portion of a conventional solid-state image pick-up device of the CCD type.
Figure 2:
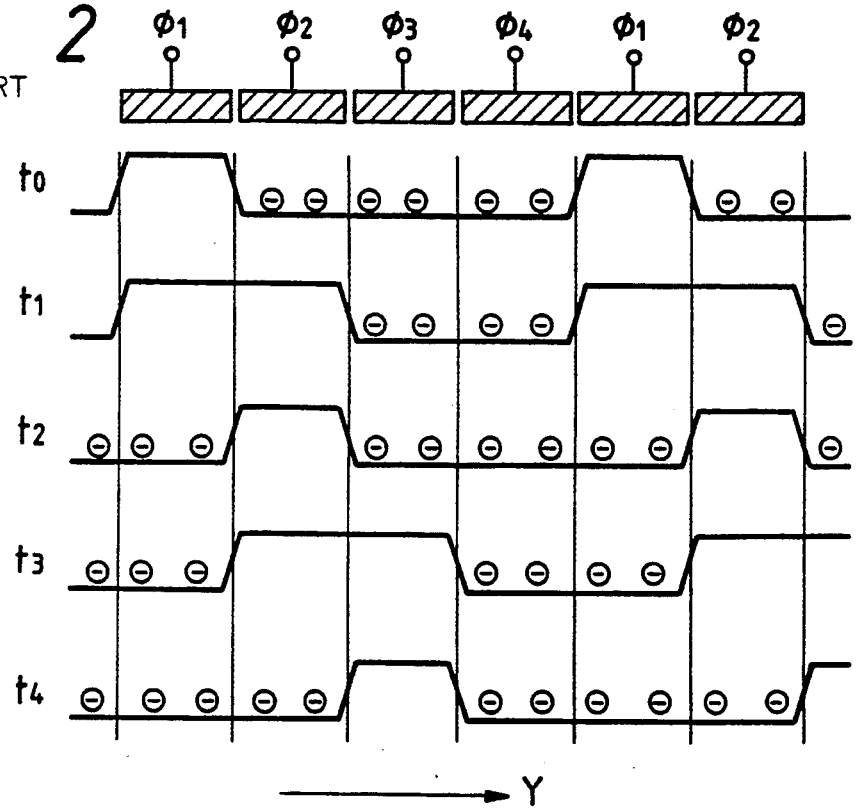
FIG. 2 is a diagram showing the charge transfer operation by the conventional device in terms of potential profiles.
Figure 3:
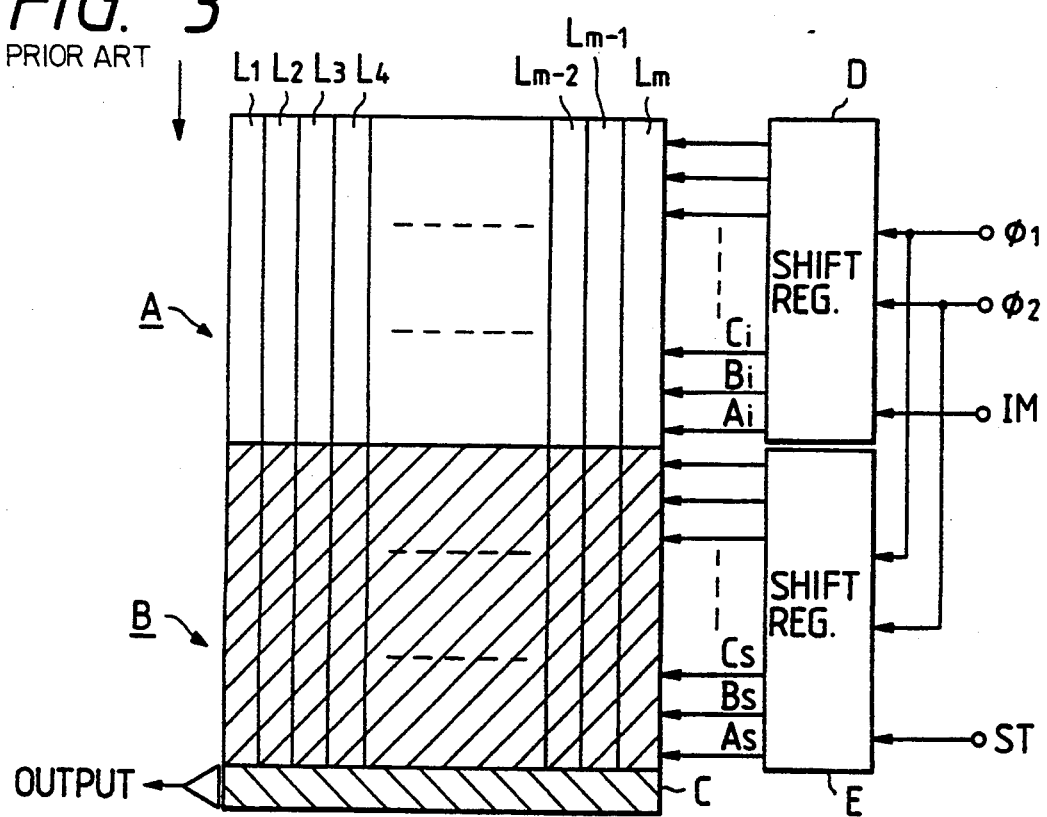
FIG. 3 is a plan view showing the structure of a key portion of a conventional solid-state image pick-up device of the CCD type.
Figure 4A:
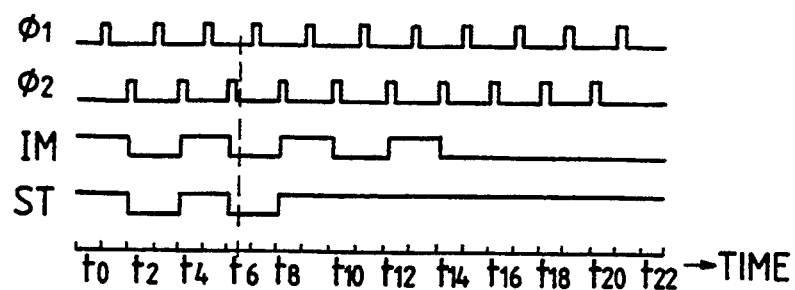
FIGS. 4(a) through 4(c) are diagrams showing the timing pattern of the device of FIG. 3.
Figure 4B:
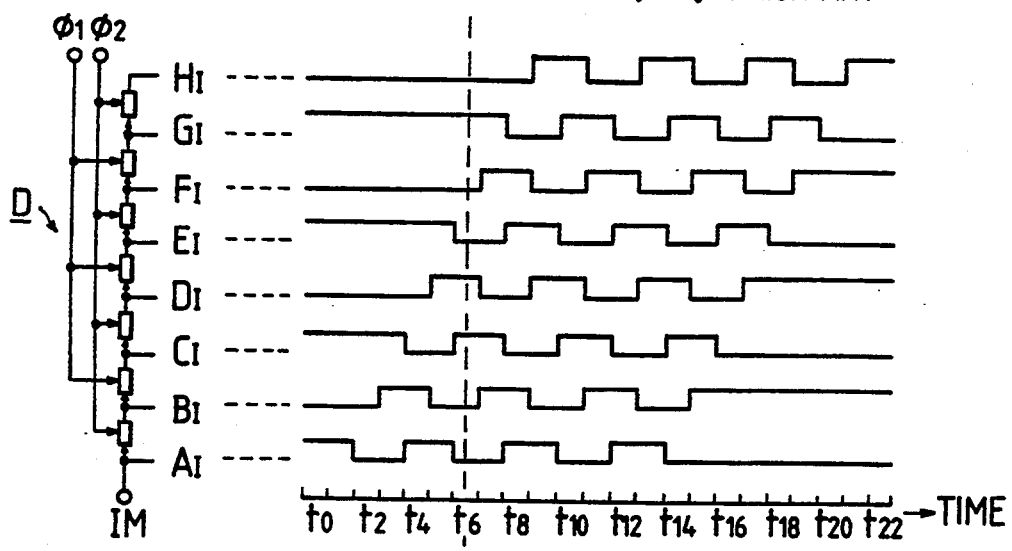
Figure 4C:
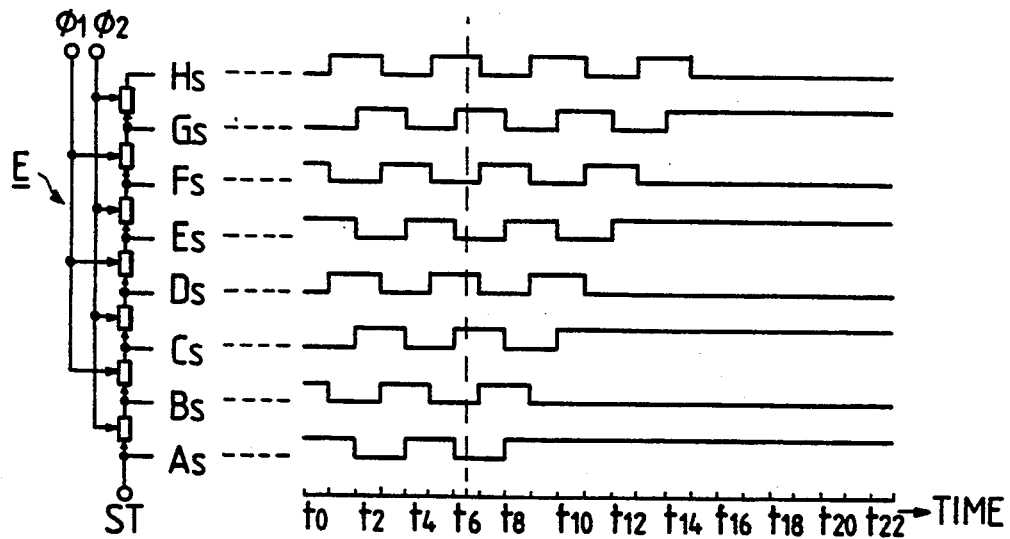
Figure 5:
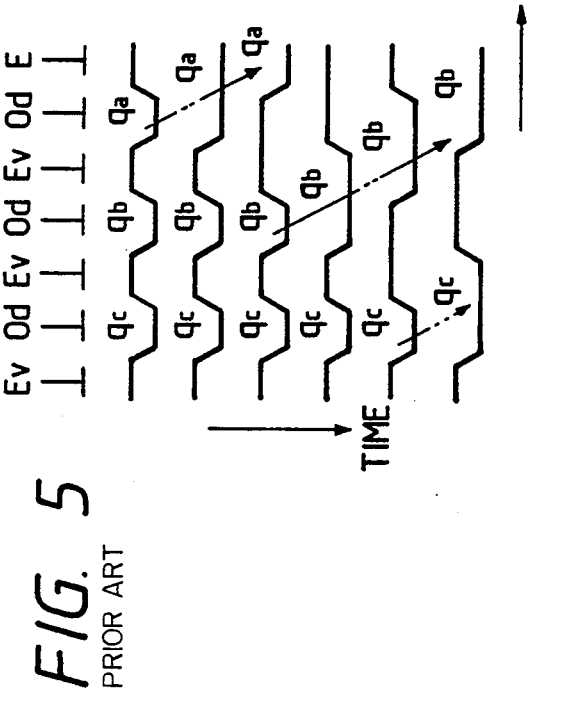
FIGS. 5 and 6 are diagrams showing the transfer operations by the conventional device.
Figure 6:
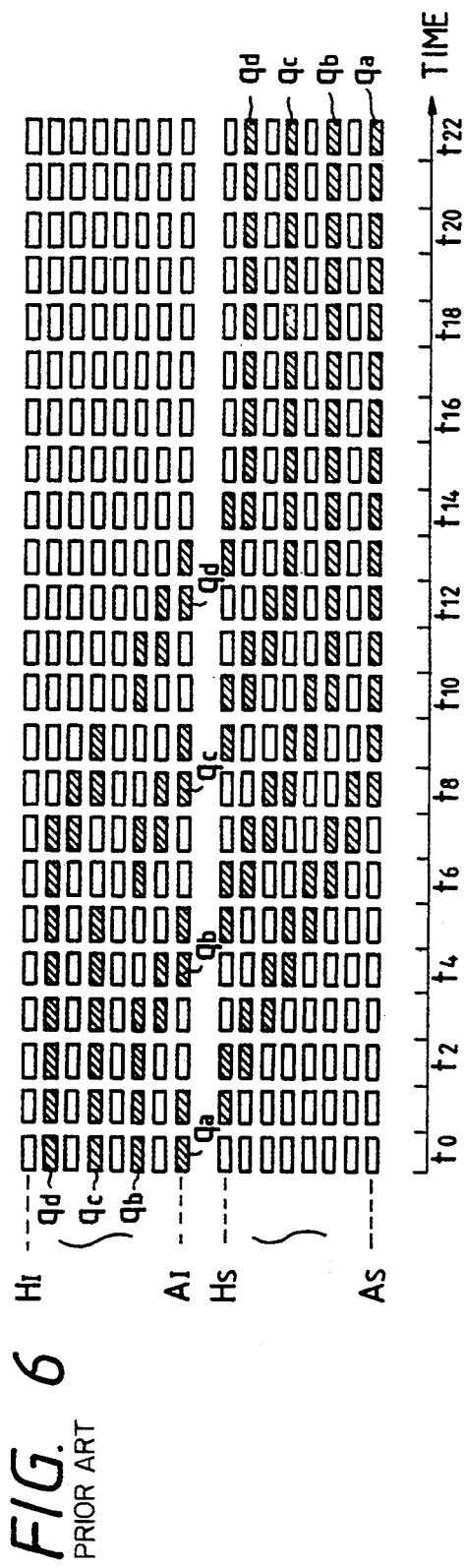
Figure 7:
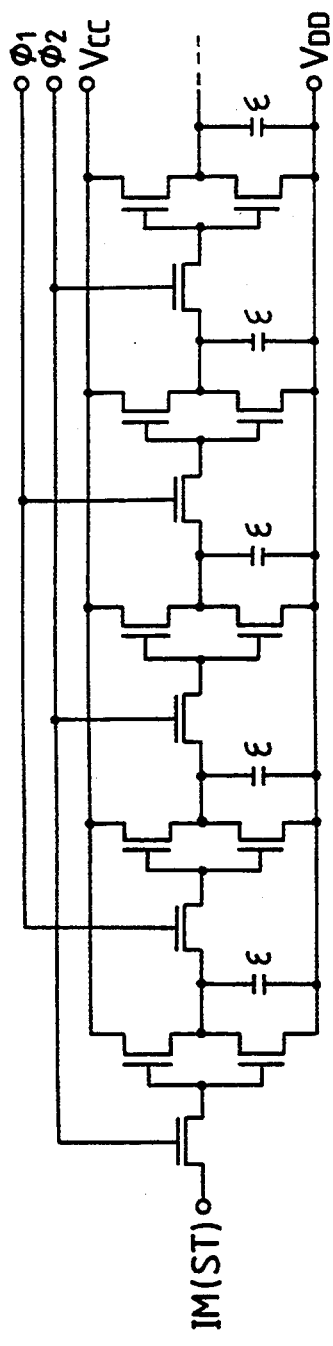
FIGS. 7 to 9 are circuit and schematic diagrams useful in explaining the problems of the conventional device.

The second and third drive circuits 11 and 12 are each composed of an NMOS transistor formed in the p-well layer 16 shown in FIG. 16, and other electronic components. A plurality of n+ impurity layers 25 and 26 forming an NMOS transistor and a gate contact, by way of example, are formed in the p-well layer 15 shown in FIG. 6.

The scan read operation will be described in detail with reference to FIG. 18 showing a timing chart of drive signals and timing signals. In the figure, the period $T_{VB}$ corresponds to the vertical blanking periods the period $T_{HB}$ corresponds to the horizontal blanking period, and the period $T_{1H}$ corresponds to the horizontal scan period. Further, "H" indicates a voltage of 12 V, "M" is a voltage of about 0 V, "L" is a voltage of about −8 V, and "HH" is approximately 15 to 25 V, which is equal to the substrate voltage. The operation of this preferred embodiment will be discussed while referring generally to FIGS. 17–23.

During the period $T_{VB}$ corresponding to the vertical blanking period, the timing signal $\phi_H$ goes high (H) at a predetermined time t2, and is at the "M" level at the remaining time. The timing signal $\phi_G$ is always at the "M" level. The timing signal $\phi_{FS}$ goes high (H) as the timing signal $\phi_H$ goes high, and is kept at the "L" level at the remaining time. The drive signals $S_1$ to $S_n$ generated from the third drive circuit 12 are always at the "L" level.

During the period $T_{VB}$, all of the NMOS transistors of the first drive circuit 10 are rendered conductive by the timing signal $\phi_G$ at the "M" level, while at the same time all of the drive signals $S_1$ to $S_n$ of the third drive circuit 12 are set to the "L" level. Accordingly, all of the NMOS transistors in the second drive circuit 11 become conductive. All of the gate electrodes $G_{11}$, $G_{21}$, $G_{31}$, $G_{41}$ to $G_{in}$, $G_{2n}$, $G_{4n}$ are controlled by the first drive circuit 10.

More specifically, when the timing signals $\phi_H$ and $\phi_{FS}$ are not at the "H" level, the gate signals $\phi_{11}$, $\phi_{31}$, $\phi_{12}$, $\phi_{32}$ to $\phi_{in}$, $\phi_{3n}$, which are applied to the odd-numbered gate electrodes $G_{11}$, $G_{31}$, $G_{12}$, $G_{32}$ to $G_{in}$, $G_{3n}$, are each equal in voltage level to the signal $V_L$ (constantly set at −8 V). Under this condition, potential barriers are generated in the vertical charge transfer paths $L_1$ to $L_m$ under those gate electrodes.

The gate signals $\phi_{21}$, $\phi_{41}$, $\phi_{22}$, $\phi_{42}$ to $\phi_{2n}$, $\phi_{4n}$, which are applied to the even-numbered gate electrodes $G_{21}$, $G_{41}$, $G_{22}$, $G_{42}$ to $G_{2n}$, $G_{4n}$, are each equal in voltage to the signal $\phi_H$ at the "M" level. Under this condition, transfer pixels are generated in the vertical charge transfer paths $L_1$ to $L_m$ under those gate electrodes.

Accordingly, all of the portions adjacent to the transfer gates Tg (see FIG. 14) serve as the transfer pixels being separated from one another by the potential barriers.

Under this condition, when the timing signals $\phi_H$ and $\phi_{FS}$ go high at time t2, all of the npn transistors $Q_{21}$, $Q_{41}$, $Q_{61}$, ... become conductive, and the "H" level voltage of approximately 15 to 25 V is applied to only the even-numbered gate electrodes $G_{21}$, $G_{41}$, $G_{22}$, $G_{42}$ to $G_{2n}$, $G_{4n}$. Accordingly, all of the transfer gates Tg become conductive, and all of the pixel signals of the photodiodes are transferred to the adjacent transfer pixels.

During the period $T_{VB}$, a so-called field shift operation is performed, so that as at the time t2 shown in FIG. 22, the pixel signals (marked as black squares) are transferred to the vertical charge transfer paths.

During the period $T_{HB}$ corresponding to the first horizontal blanking period, the timing signal $\phi_g$ is always at the "L" level. Accordingly, all of the NMOS transistors in the first drive circuit 10 become nonconductive and are separated from all of the gate electrodes.

Only the drive signal $S_1$ at the first output terminal of the third drive circuit 12 is set at the "M" level, while the remaining drive signals $S_2$ to $S_n$, are at the "L" level. This renders conductive only the first set of NMOS transistors $m_{11}$, $m_{21}$, $m_{31}$, $m_{41}$ concerning the drive signal $S_1$ of the second drive circuit 11.

During the period that only the drive signal $S_1$ is set to "M" level, the timing signals $\phi_1$, $\phi_2$, $\phi_3$, and $\phi_4$ of four phases for the vertical charge transfer are inputted to the second drive circuit 11. Accordingly, only the first set of first to fourth gate signals $\phi_{11}$, $\phi_{21}$, $\phi_{31}$, and $\phi_{41}$ are equal in level to the timing signals $\phi_1$, $\phi_2$, $\phi_3$, and $\phi_4$. The charge transfer is performed by the first set of first to fourth gate electrodes $G_{11}$, $G_{21}$, $G_{31}$, and $G_{41}$. The enlarged signal waveforms during the period $T_{HB}$ are shown in FIG. 19.

Figure 9:
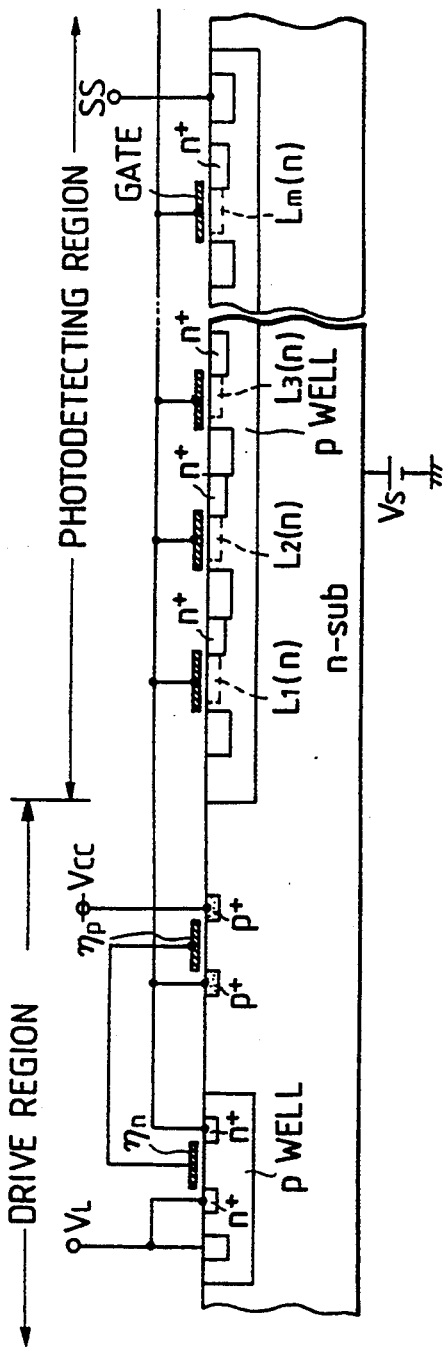
Figure 10:
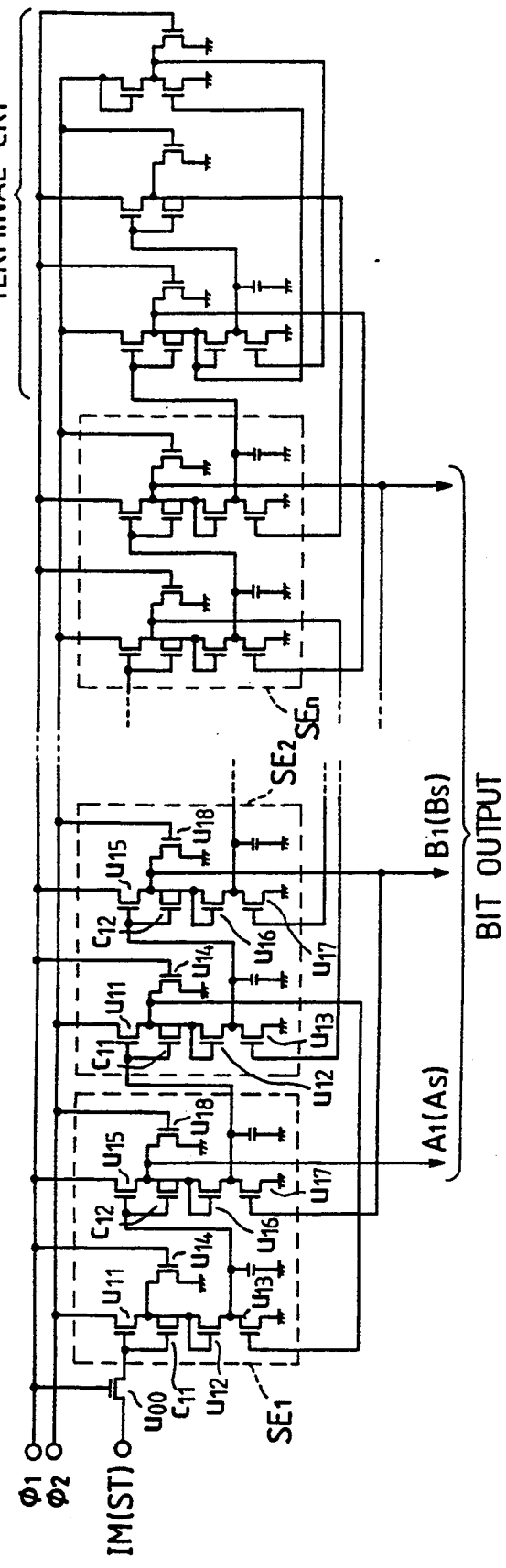
FIG. 10 is a circuit diagram showing a conventional shift register.

Consequently, the signal charges are transferred to the horizontal charge transfer path 8 at the times (indicated by numerals 1, 2, 3, 4, 5, 6, and 7) of the gate signals $\phi_{11}$, $\phi_{21}$, $\phi_{31}$, and $\phi_{41}$ in FIG. 9, as in the first transfer shown in FIG. 22. A pixel signal $q_{ij}$ of the first line closest to the horizontal charge transfer path 8 is transferred to the transfer path 8. A pixel signal $q_{2j}$ of the second line moves to the first line position.

Then, during the first horizontal scan period $T_{1H}$ (between times t4 and t5), the variation of the signal applied to each gate electrode stops, and the horizontal charge transfer path 8 vertically transfers signal charges in synchronism with the gate signals $a_1$ to $a_4$ recurring at predetermined times according to the four- or two-phase drive system. As a result, pixel signals of the first one line are read out.

During a period between times $t_5$ to $t_7$, a sequence of operations, which is similar to that during the period between times $t_3$ to $t_5$, is repeated to read the pixel signals of the next line out of the image pick-up device. During the horizontal blanking period $T_{HB}$ between times $t_3$ to $t_4$, the drive signals $S_1$ and $S_2$ of the third drive circuit 12 are simultaneously set to "M" level, and the remaining drive signals $S_3$ to $S_n$ are set to "L" level. The enlarged signal waveforms during this period $T_{HB}$ are shown in FIG. 20.

As a result, a set of the first to fourth gate electrodes $G_{11}$ to $G_{41}$, and two sets of fifth to eighth $G_{12}$ to $G_{42}$ are driven by the gate signals $\phi_{11}$ to $\phi_{41}$ and $\phi_{12}$ to $\phi_{42}$, which are equal to the timing signals $\phi_1$, $\phi_2$, $\phi_3$, and $\phi_4$. The result is the vertical transfer of the pixel signals under those gate electrodes.

The timing chart shown in FIG. 20 shows that as indicated by the second vertical scan in FIG. 22, the pixel signal $q_{2j}$ of the second line is transferred to the horizontal charge transfer path 8. Two lines of the pixel signals $q_{ij}$ of the third line and one line of the pixel signal of the fourth line are transferred to the horizontal charge transfer path 8. During the horizontal scan period $T_{1H}$ between times $t_6$ and $t_7$, the horizontal charge transfer path 8 reads out the pixel signal $q_{2j}$ of the second line.

The third scan read starts at time $t_7$. Then, the drive signals $S_1$, $S_2$, and $S_3$ are set to "M" level, while the remaining drive signals $S_4$ to $S_n$ of the third drive circuit 12 are set to "L" level. The first to third sets of first to 12th gate electrodes $G_{11}$ to $G_{41}$, $G_{12}$ to $G_{42}$ to $G_{42}$, and $G_{13}$ to $G_{42}$ are driven for the vertical charge transfer. Accordingly, as in the third transfer of FIG. 12, the pixel signal $q_{3j}$ of the third line is transferred to the horizontal charge transfer path 8. The pixel signals $q_{4j}$ to $q_{5j}$ of the 4th to 6th lines are transferred every two lines to the horizontal charge transfer path 8. The pixel signal $q_{6j}$ of one line is transferred to there.

Then, the pixel signal $q_{3j}$ is read out of the photodiodes by the horizontal charge transfer path 8.

Figure 11:
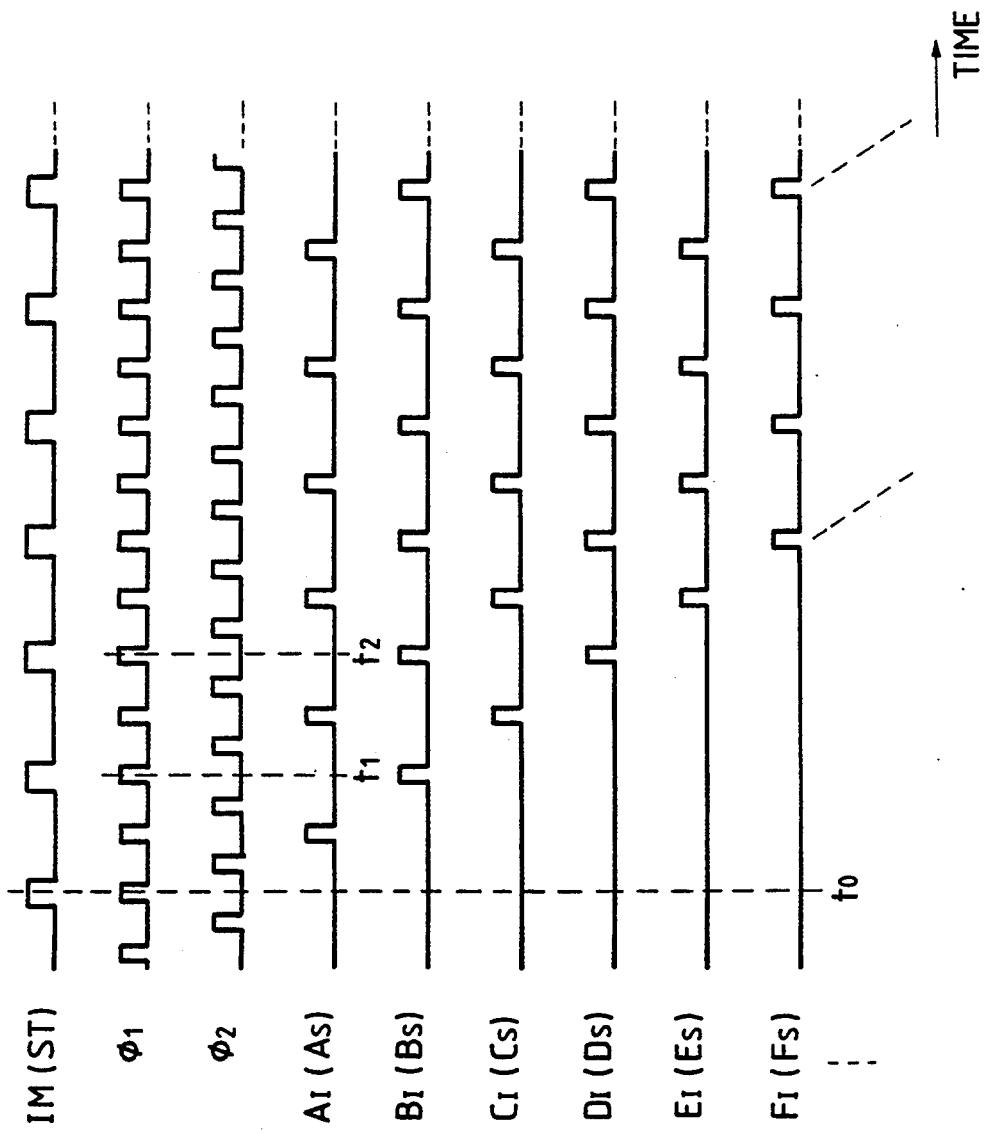
FIG. 11 is a timing chart showing the operation of the shift register of FIG. 10.

Subsequently, the drive signals $S_4$ to $S_n$ of the third drive circuit 12 are progressively inverted to "M" level every time the pixel signal of each line is read out. The gate electrodes to be driven are increased every four gate electrodes. During the horizontal blanking period $T_{HB}$ (between times $t_9$ and $t_{10}$), all of the gate signals $\phi_{11}$ to $\phi_{4n}$ have the same waveforms as those of the timing signals $\phi_1$ to $\phi_4$, as shown in FIG. 11. The pixel signals of the last line are read out by the final scan read operation.

FIG. 23 shows the K-th and (K+1)th vertical charge transfer operations, for example, in terms of potential profiles. As shown, in order from the transfer pixel closest to the horizontal charge transfer path 8, the intervals of the idle transfer pixels progressively increase. With this, the pixel signals are progressively read out in the order from the pixel signal closest to the transfer path 8 to the succeeding ones.

The preferred embodiment of the present embodiment discussed immediately above comprises a drive circuit for supplying the gate signal to the gate electrode constructed with MOS transistors of the NMOS structure, not CMOS structure, and transistors of the bipolar structure. Accordingly, the resultant drive circuits have a high breakdown voltage, and allow the vertical overflow drain and the electronic shutter function to be advantageously incorporated.

With provision of the vertical overflow drain structure, the excessive charges of the photodiodes can be drained into the substrate, removing unwanted phenomenon including blooming. Preferably, an electronic shutter which does not use the substrate is formed, and with the electronic shutter, the noninterlace/full frame read is possible. In this respect, the image pick-up device is suitable for photographing a still picture.

In the image pick-up device thus constructed, high breakdown performance is realized because the impurity concentration of the semiconductor substrate and the well layer is relatively low. The breakdown performance realized is enough to withstand the high voltage needed to realize the vertical overflow drain function, and also the high voltage needed to operate the electronic shutter.

According to the present invention, a well layer is formed in the semiconductor substrate, a circuit using MOS transistors of a single structure is formed in the well layer. Therefore, the resultant image pick-up device is improved in breakdown voltage performance, and the vertical overflow drain structure and the electronic shutter function may be introduced into the device.

Another preferred embodiment of the present invention, including a modified form of the third drive circuit 12, will be described with reference to FIG. 24. The third drive circuit 12 includes a shift register for shifting a start pulse $\phi_s$ in synchronism with two-phase clock signal $\phi_A$ and $\phi_B$ to sequentially generate drive signals of logic "H" in the order from the low- order bit to the high-order bit. In the first period, only the first drive signal $S_1$ goes high ("H"), while the remaining high-order bits are all low ("L") in logic level. In the second period, two low-order bits $S_1$ and $S_2$ go high, while the remaining high-order bits are low. In the third period, three low-order bits $S_1$, $S_2$, and $S_3$ go high, while the remaining high-order bits are low. Thus, the number of high drive signals progressively increases in order from the low-order bits to the high-order bits.

As shown in FIG. 24, each bit has a cell structure, and hence the circuit of the first bit will be typically described. The source-drain paths of three MOS $u_{11}$, $u_{12}$, $u_{13}$, and $u_{14}$ are connected in series between a signal line of the voltage $V_L$ and a signal line of the clock signal $\phi_B$. A signal line for the reset signal RS is connected to the gate contact of the transistor $u_{13}$. A bootstrap capacitor $\epsilon_{11}$ is connected between the gate contact and the drain contact of the transistor $u_{11}$. The gate contact and the source contact of the transistor $u_{12}$ are connected to each other, and to the source contact of the transistor $u_{14}$. The transistor $u_{14}$ is connected at the drain contact to the signal line for the voltage $V_L$ and at the gate contact to the signal line for the clock signal $\phi_A$.

Transistors MOS $u_{22}$, $u_{22}$, $u_{23}$, and $u_{24}$ make up the same circuit as that made up of the transistors MOS $u_{11}$, $u_{12}$, $u_{13}$, and $u_{14}$. The drain contact (output point) of the transistor $u_{12}$ is connected to the gate contact (input point) of the transistor $u_{22}$. However, the connection of the signals $\phi_A$ and $\phi_B$ thereto is inverted. The bit input corresponds to the gate contact of the gate contact of the transistor $U_{11}$. The bit output corresponds to the drain contact of the transistor $u_{22}$. An n-bit shift register is formed by connecting the inputs and outputs of those bit cells in a cascade fashion. A start pulse $\phi_s$ is inputted to the least significant bit cell through an analog switch $u_{00}$ which is rendered conductive in synchronism with the clock signal $\phi_A$.

The third drive circuit 12 includes a shift register for producing drive signals $S_1$ to $S_n$ at predetermined times, as described above.

The scan read operation will be described in detail with reference to FIG. 18. The period $T_{VB}$ corresponds to the vertical blanking period, the period $T_{HB}$ corresponds to the horizontal blanking period, period $T_{1H}$ corresponds to the horizontal scan period. Further, "H" indicates 12 V, "M" indicates 0 V, "L" indicates $-8$ V, and "HH" is approximately 12 V, which is equal to the substrate voltage.

During the period $T_{VB}$, the timing signal $\phi_H$ goes high (H) at a predetermined time t2, and is at the "M" level during the remaining time. The timing signal $\phi_G$ is always at the "M" level. The timing signal $\phi_{FS}$ goes high (H) as the timing signal $\phi_H$ goes high, and is kept at the "L" level during the remaining time. The drive signals $S_1$ to $S_n$ generated from the third drive circuit 12 are always in "L" level.

During the period $T_{VB}$, all of the NMOS transistors of the first drive circuit 10 are rendered conductive by the timing signal $\phi_G$ at the "M" level, while all of the drive signals to $S_n$ of the third drive circuit 12 are set to the "L" level. Accordingly, all of the NMOS transistors in the second drive circuit 11 become conductive. All of the gate electrodes $G_{11}$, $G_{21}$, $G_{31}$, $G_{41}$ to $G_{1n}$, $G_{2n}$, $G_{4n}$ are controlled by the first drive circuit 10.

More specifically, when the timing signals $\phi_H$ and $\phi_{FS}$ are not at the "H" level, the gate signals $\phi_{11}$, $\phi_{31}$, $\phi_{12}$, $\phi_{32}$ to $\phi_{1n}$, $\phi_{3n}$, which are applied to the odd-numbered gate electrodes $G_{11}$, $G_{31}$, $G_{12}$, $G_{32}$ to $G_{1n}$, $G_{3n}$, are each equal in voltage level to the signal $V_L$ (constantly set at $-8$ V). Under this condition, potential barriers are generated in the vertical charge transfer paths $L_1$ to $L_m$ under those gate electrodes.

The gate signals $\phi_{21}$, $\phi_{41}$, $\phi_{22}$, $\phi_{42}$ to $\phi_{2n}$, $\phi_{4n}$, which are applied to the even-numbered gate electrodes $G_{21}$, $G_{41}$, $G_{22}$, $G_{42}$ to $G_{2n}$, $G_{4n}$, are each equal in voltage to the signal $\phi_H$ at the "M" level. Under this condition, transfer pixels are generated in the vertical charge transfer paths $L_1$ to $L_m$ under those gate electrodes.

Accordingly, all of the portions adjacent to the transfer gates Tg (see FIG. 14) serve as the transfer pixels being separated from one another by the potential barriers.

Under this condition, when the timing signals $\phi_H$ and $\phi_{FS}$ go high at time t2, all of the npn transistors $Q_{21}$, $Q_{41}$, $Q_{61}$, ... become conductive, and the "H" level voltage of approximately 15 to 25 V is applied to only the even-numbered gate electrodes $G_{21}$, $G_{41}$, $G_{22}$, $G_{42}$ to $G_{2n}$, $G_{4n}$. Accordingly, all of the transfer gates Tg become conductive, and all of the pixel signals of all of the photodiodes are transferred to the adjacent transfer pixels.

During the period $T_{VB}$, a so-called field shift operation is performed, so that as at time $t_1$ in FIG. 22, the pixel signals (marked as shaded squares) are transferred to the vertical charge transfer paths. During the period $T_{HB}$ corresponding to the first horizontal blanking period, the timing signal $\phi_G$ is always in "L" level. Accordingly, all of the NMOS transistors in the first drive circuit 10 become nonconductive and are separated from all of the gate electrodes.

Only the drive signal $S_1$ at the first output terminal of the third drive circuit 12 is set at the "M" level, while the remaining drive signals $S_2$ to $S_n$, are at the "L" level.

This renders conductive only the first set of NMOS transistors $m_{11}$, $m_{21}$, $m_{31}$, $m_{41}$ concerning the drive signal $S_1$ of the second drive circuit 11.

During the period that only the drive signal $S_1$ is set to "M" level, the timing signals $\phi_1$, $\phi_2$, $\phi_3$, and $\phi_4$ of four phases for the vertical charge transfer are inputted to the second drive circuit 11. Accordingly, only the first set of first to fourth gate signals $\phi_{11}$, $\phi_{21}$, $\phi_{31}$, and $\phi_{41}$ are equal in level to the timing signals $\phi_1$, $\phi_2$, $\phi_3$, and $\phi_4$. The charge transfer is performed by the first set of first to fourth gate electrodes $G_{11}$, $G_{21}$, $G_{31}$, and $G_{41}$. The enlarged signal waveforms during the period $T_{HB}$ are shown in FIG. 19.

As a consequence, the signal charges are transferred to the horizontal charge transfer path 8 at the times (indicated by numerals 1, 2, 3, 4, 5, 6, and 7) of the gate signals $\phi_{11}$, $\phi_{21}$, $\phi_{31}$, and $\phi_{41}$ in FIG. 19, as in the first transfer shown in FIG. 22. A pixel signal $q_{1j}$ of the first line closest to the horizontal charge transfer path 8 is transferred to the transfer path 8. A pixel signal $q_{2j}$ of the second line moves to the first line position.

Then, during the first horizontal scan period $T_{1H}$ (between times $t_4$ and $t_5$), the variation of the signal applied to each gate electrode stops, and the horizontal charge transfer path 8 vertically transfers signal charges in synchronism with the gate signals $\alpha_1$ to $\alpha_4$ recurring at predetermined times according to the four-phase drive system. As a result, pixel signals of the first one line are read out.

During a period between times $t_5$ to $t_7$, a sequence of operations, which is similar to that during the period between times $t_3$ to $t_5$, is repeated to read the pixel signals of the next line out of the image pick-up device. During the horizontal blanking period $T_{HB}$ between times $t_3$ to $t_4$, the drive signals $S_1$ and $S_2$ of the third drive circuit 12 are simultaneously set to "M" level, and the remaining drive signals $S_3$ to $S_n$ are set to "L" level. The enlarged signal waveforms during this period $T_{HB}$ are shown in FIG. 20.

As a result, a set of the first to fourth gate electrodes $G_{11}$ to $G_{41}$, and two sets of fifth to eighth $G_{12}$ to $G_{42}$ are driven by the gate signals $\phi_{11}$ to $\phi_{41}$ and $\phi_{12}$ to $\phi_{42}$, which are equal to the timing signals $\phi_1$, $\phi_2$, $\phi_3$, and $\phi_4$. The result is the vertical transfer of the pixel signals under those gate electrodes.

The timing chart shown in FIG. 20 shows that as indicated by the second vertical scan in FIG. 22, the pixel signal $q_{2j}$ of the second line is transferred to the horizontal charge transfer path 8. Two lines of the pixel signals $q_{3j}$ of the third line and the pixel signal $q_{4j}$ of the fourth line are transferred to the horizontal charge transfer path 8.

During the horizontal scan period $T_{1H}$ between times $t_6$ and $t_7$, the horizontal charge transfer path 8 reads out the pixel signal $q_{2j}$ of the second line.

The third scan read starts at time $t_7$. Then, the drive signals $S_1$, $S_2$, and $S_3$ are set to "M" level, while the remaining drive signals $S_4$ to $S_n$ of the third drive circuit 12 are set to "L" level. The first to third sets of first to 12th gate electrodes $G_{11}$ to $G_{41}$, $G_{12}$ to $G_{42}$ to $G_{42}$, and $G_{13}$ to $G_{42}$ are driven for the vertical charge transfer. Accordingly, as in the third transfer of FIG. 22, the pixel signal $q_{3j}$ of the third line is transferred to the horizontal charge transfer path 8. The pixel signals $q_{4j}$ to $q_{5j}$ of the 4th to 7th lines are transferred every two lines to the horizontal charge transfer path 8. The pixel signal $q_{6j}$ of one line is transferred to there.

Then, the pixel signal $q_{3j}$ is read out of the photodiodes by the horizontal charge transfer path 8.

Subsequently, the drive signals $S_4$ to $S_n$ of the third drive circuit 12 are progressively inverted to the "M" level every time the pixel signal of each line is read out. The gate electrodes to be driven are increased every four gate electrodes. During the horizontal blanking period $T_{HB}$ (between times $t_9$ and $t_{10}$), all of the gate signals $\phi_{11}$ to $\phi_{4n}$ have the same waveforms as those of the timing signals $\phi_1$ to $\phi_4$, as shown in FIG. 21. The pixel signals of the last line are read out by the final scan read operation.

FIG. 23 shows the K-th and (K+1)th vertical charge transfer operations, for example, in terms of potential profiles. As shown, in order from the transfer pixel closest to the horizontal charge transfer path 8, the intervals of the idle transfer pixels progressively increase. With this, the pixel signals are progressively read out in the order from the pixel signal closest to the transfer path 8 to the succeeding ones.

Thus, in the still picture photographing mode, all of the pixel signals can be generated by one-time frame scan read, and the pixel signals may be scan read without mixing them. Accordingly, the image pick-up device of the embodiment can reproduce a still picture at a high resolution, which is free from flicker, pseudocolor and the like.

The operation of the image pick-up device when it is in the motion picture photographing mode will be described. In this mode, the odd-numbered field and the even-numbered field, which are shifted by one line one from the other, are field scan read, to complete the interlace scan read.

The basic times of scan reading the respective fields are substantially the same as those shown in FIGS. 17 and 18 except the signal times during the period $T_{HB}$ corresponding to the horizontal blanking period.

Figure 25:
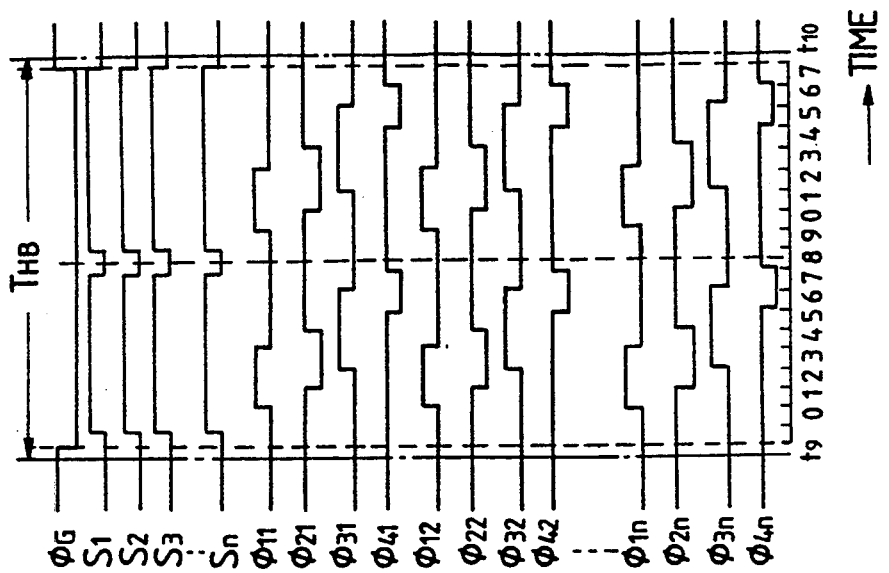
FIGS. 25 through 32 are timing charts showing in detail the scan read operation of the image pick-up device of the embodiment of FIG. 24.
Figure 26:
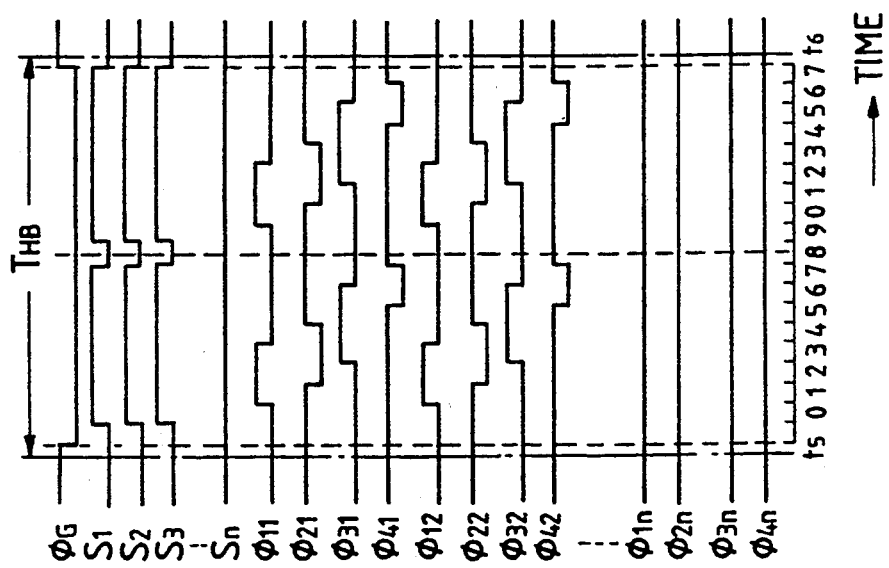
Figure 27:
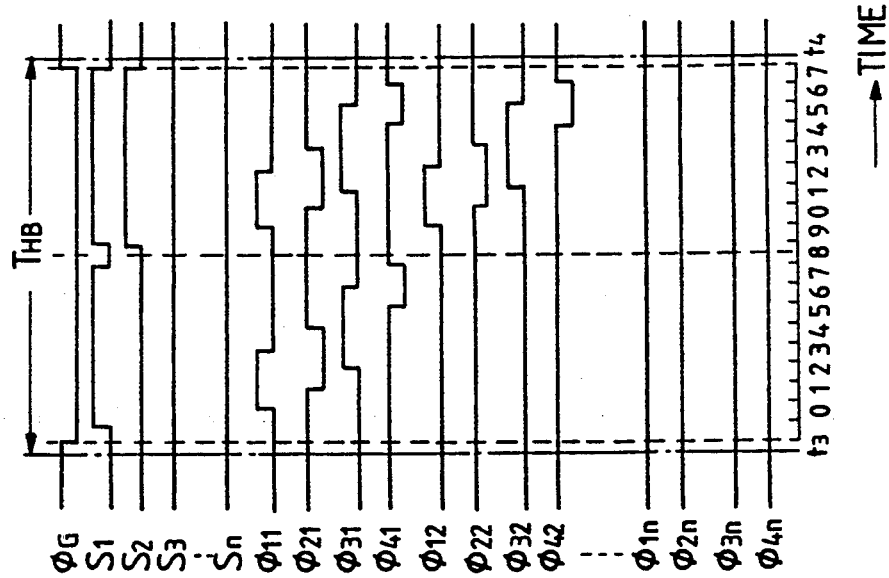

For the scan read of the odd-numbered field, the times during the period from $t_3$ to $t_4$ in FIG. 18 is replaced by the times shown in FIG. 25, the times during the period from $t_5$ to $t_6$ in FIG. 18 are replaced by the times shown in FIG. 26, and the times during the period from $t_9$ to $t_{10}$ in FIG. 18 are replaced by the times shown in FIG. 27. The times during the horizontal scan period $T_{1H}$ remains unchanged.

Figure 28:
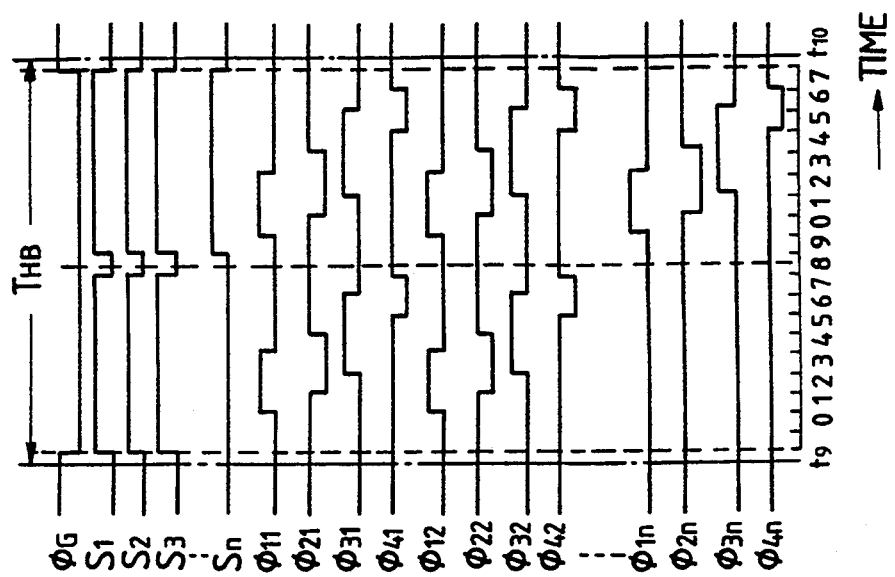
Figure 29:
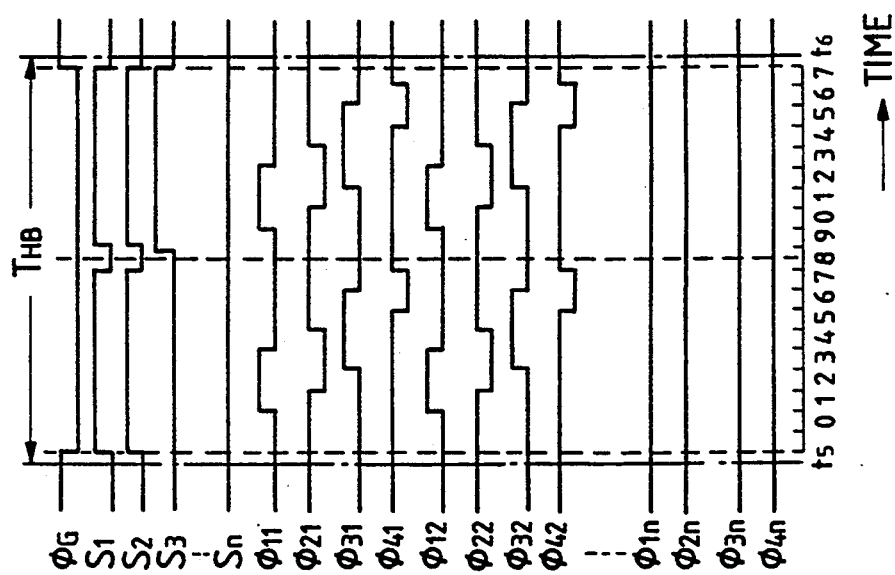
Figure 30:
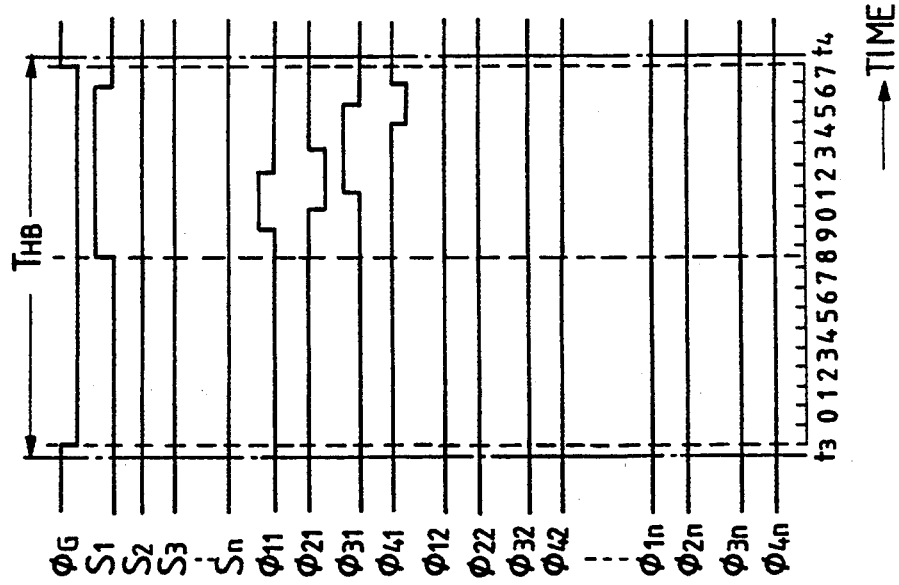

For the scan read of the even-numbered field, the times during the period from $t_3$ to $t_4$ in FIG. 18 are replaced by the times shown in FIG. 28, the times during the period from $t_5$ to $t_6$ in FIG. 18 are replaced by the times shown in FIG. 29, and the times during the period from $t_9$ to $t_{10}$ in FIG. 18 are replaced by the times shown in FIG. 30. The times during the horizontal scan period $T_{1H}$ remains unchanged.

To start the scan read of the odd-numbered field, the exposure is set up and continued, and during the vertical blanking period $T_{VB}$, the pixel signals of all of the photodiodes are shifted to the transfer pixels under the even-numbered gate electrodes $G_{21}$, $G_{41}$, $G_{22}$, $G_{42}$, ... , $G_{2n}$, $G_{4n}$ of the vertical charge transfer paths $L_1$ to $L_m$.

Then, during the first horizontal blanking period (see FIG. 25), the first and second drive signals $S_1$ and $S_2$ of the third drive circuit 12 vary over two periods as shown. The timing signals $\phi_1$, $\phi_2$, $\phi_3$, and $\phi_4$ of the second drive circuit 11 are supplied two times for each period. Accordingly, during the first period of the period from $t_3$ to $t_4$, the gate signals $\phi_{11}$ to $\phi_{41}$ are applied to only the first set of gate electrodes $G_{11}$ to $G_{41}$. During the next period, the gate signals $\phi_{11}$ to $\phi_{41}$ and $\angle_{12}$ to $\phi_{42}$ are respectively applied to the first set of gate electrodes $G_{11}$ to $G_{41}$ and the second set of gate electrodes $G_{12}$ to $G_{42}$.

As shown in FIG. 25, the pixel signals of the transfer pixels under the first set of the gate electrodes $G_{21}$ and the pixel signals of the transfer pixels under the second set of the gate electrodes $G_{22}$ are shifted to the transfer pixels of the horizontal charge transfer path 8 where those pixel signals are mixed.

During the first horizontal scan period $T_{1H}$, the horizontal charge transfer path 8 horizontally scans to time sequentially output the mixed pixel signals.

Then, during the second horizontal blanking period (see FIG. 26), the first to fourth drive signals $S_1$ to $S_4$ from the third drive circuit 12 vary over the two periods as shown. As a result, the pixel signals under the third and fourth gate electrodes $G_{13}$ to $G_{43}$ and $G_{14}$ to $G_{44}$ are transferred to and mixed in the horizontal charge transfer path 8.

During the next horizontal scan period $T_{1H}$, the horizontal charge transfer path 8 horizontally scans to time sequentially output the mixed pixel signals of the second line.

The above sequence of operations is repeated during the respective horizontal blanking periods and horizontal scan periods, so that the drive signals $S_1$ to $S_n$ from the third drive circuit 12 are generated progressively expanding. As in the above case, the horizontal charge transfer path 8 outputs all of the pixel signals while mixing them.

FIG. 27 shows times of reading out the pixel signals of the last line.

Figure 31:
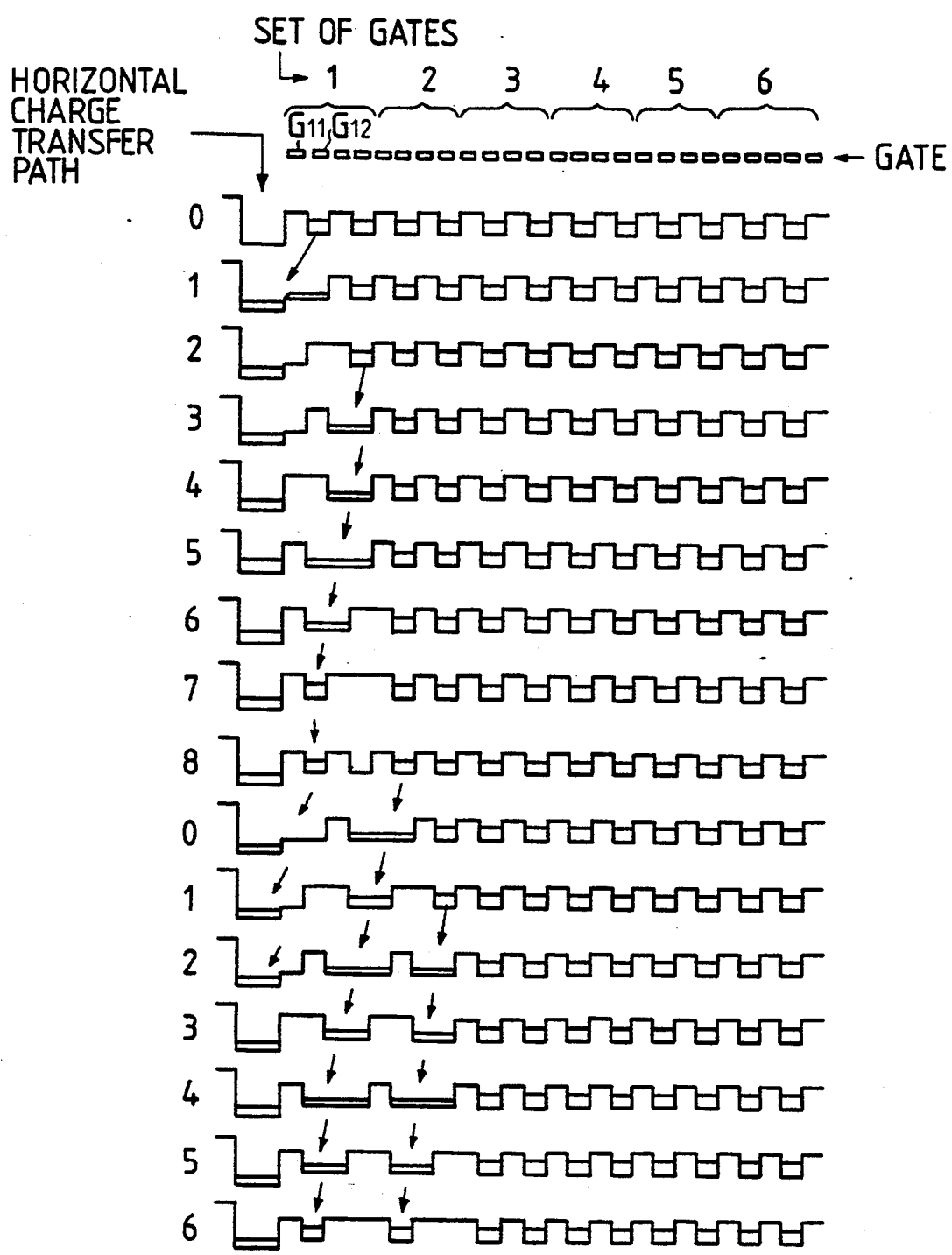

FIG. 31 is a diagram of potential profiles showing charge transfer operations by the first to sixth gate electrodes during the first horizontal blanking period $T_{HB}$ (times $t_3$ to $t_4$). At times 0 to 8 and 0 to 6, the potential variations with respect time are profiled as shown.

The scan read of the even-numbered field will be described. To start, the exposure is set up and continued, and during the vertical blanking period $T_{VB}$ in FIG. 18, the pixel signals of all of the photodiodes are shifted to the transfer pixels under the even-numbered gate electrodes $G_{21}$, $G_{41}$, $G_{22}$, $G_{42}$, $G_{2n}$, $G_{4n}$ of the vertical charge transfer paths $L_1$ to $L_m$.

Then, during the first horizontal blanking period (see FIG. 28), the first drive signal. $S_1$ of the third drive circuit 12 vary over two periods as shown. The timing signals $\phi_1$, $\phi_2$, $\phi_3$, and $\phi_4$ of the second drive circuit 11 are supplied for the later period. Accordingly, during the period from $t_3$ to $t_4$, the gate signals $\phi_{11}$ to $\phi_{41}$ are applied to only the gate electrodes $G_{11}$ to $G_{41}$.

As shown in FIG. 28, the pixel signals of the transfer pixels under the first set of the gate electrodes $G_{21}$ are shifted to the transfer pixels of the horizontal charge transfer path 8. During the first horizontal scan period $T_{1H}$, the horizontal charge transfer path 8 horizontally scans to time sequentially output the mixed pixel signals. The signals read out by the first scan read are discharged as unnecessary signals.

Then, during the second horizontal blanking period (see FIG. 29), the first to third drive signals $S_1$ to $S_3$ from the third drive circuit 12 vary over the two periods as shown. As a result, the pixel signals under the first and second gate electrodes $G_{31}$ to $G_{41}$ and $G_{12}$ to $G_{42}$ are transferred to and mixed in the horizontal charge transfer path 8. The pixel signals under the third set of gate electrodes $G_{13}$ to $G_{23}$ are transferred to under the first set of gate electrodes.

During the next horizontal scan period $T_{1H}$, the horizontal charge transfer path 8 horizontally scans to time sequentially output the mixed pixel signals of the second line.

The above sequence of operations is repeated during the respective horizontal blanking periods and horizontal scan periods, so that the drive signals $S_1$ to $S_n$ from the third drive circuit 12 are generated progressively expanding. As in the above case, the horizontal charge transfer path 8 outputs all of the pixel signals while mixing them.

FIG. 30 shows times of reading out the pixel signals of the last line.

Figure 32:
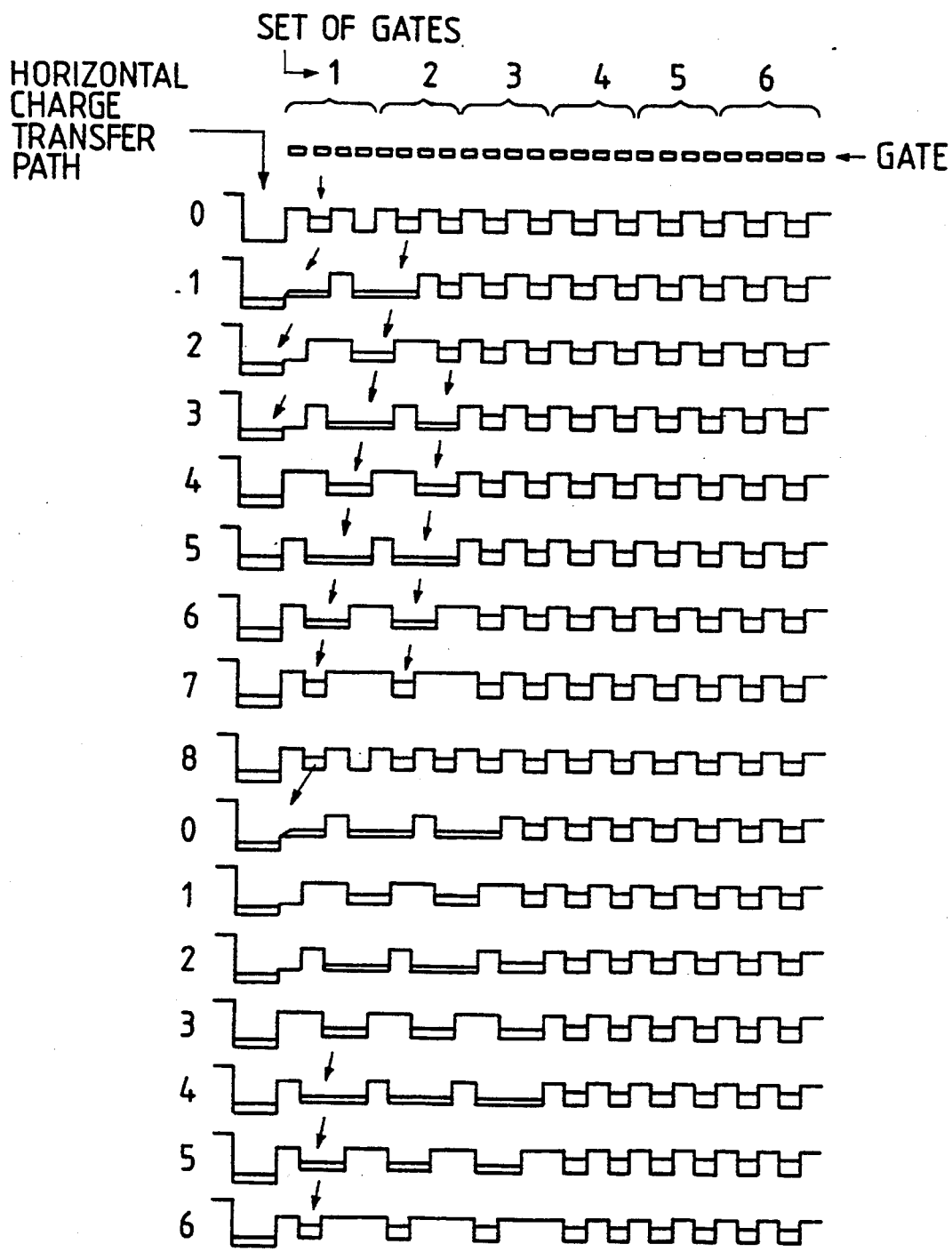

FIG. 32 is a diagram of potential profiles showing charge transfer operations by the first to sixth gate electrodes during the first horizontal blanking period $T_{HB}$ (times $t_5$ to $t_6$) in FIG. 29. At times 0 to 8 and 0 to 6, the potential variations with respect time are profiled as shown.

As seen from FIGS. 31 and 32, in the motion picture photographing mode as mentioned above, the mixing and combination of the pixel signals in the odd-numbered field are shifted by one line from those in the even-numbered field. Therefore, the interlace scan read is realized.

Figure 33:
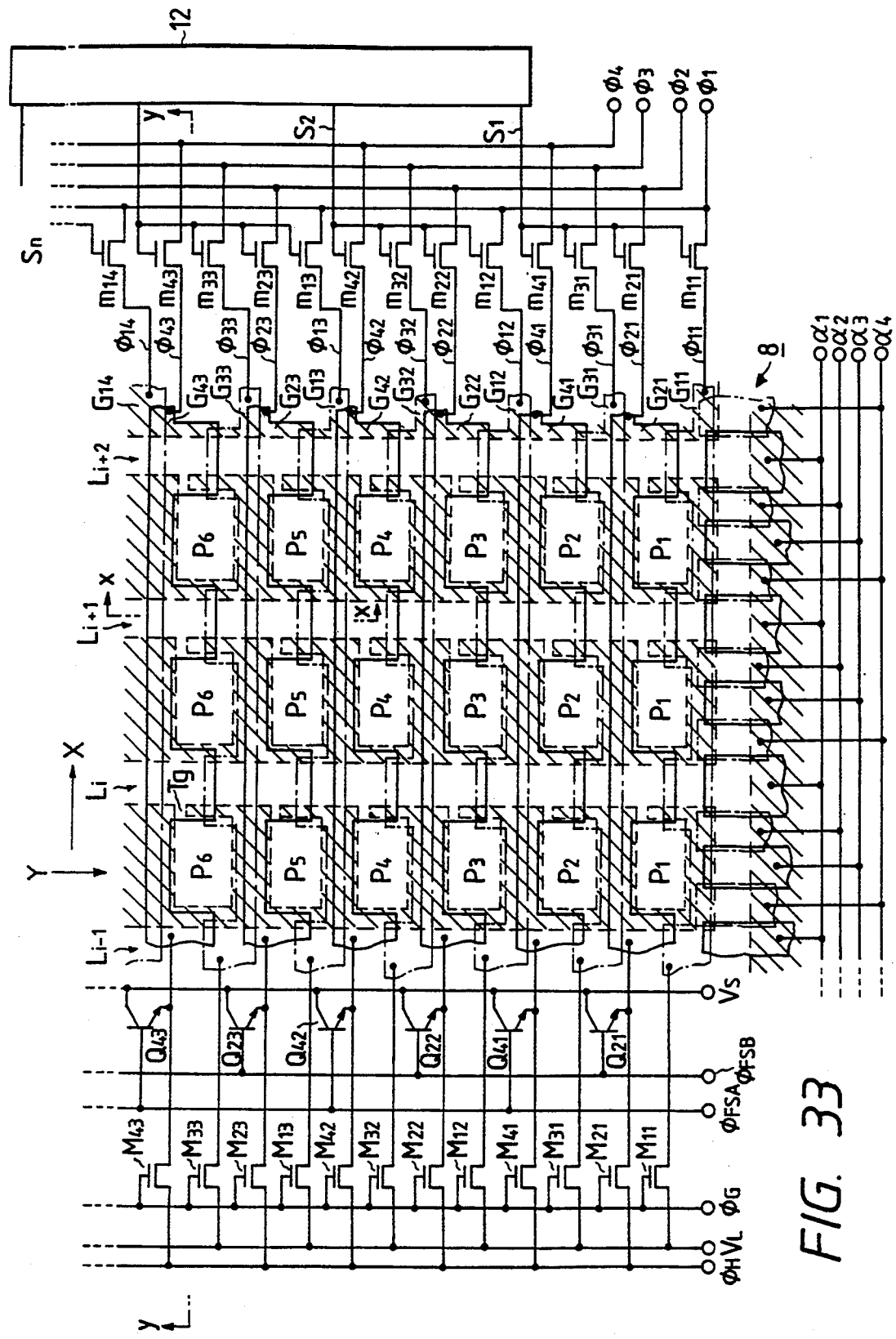
FIG. 33 is a diagram showing the construction of a photodetecting area of the image pick-up device, and its periphery circuit arrangement according to another embodiment of the invention.

Another embodiment of a solid-state image pick-up device of the CCD type will be described. The structure of the image pick-up device is illustrated in FIG. 33 corresponding to FIG. 14. The differences between the FIG. 33 structure and the FIG. 14 structure is primarily that npn transistors $Q_{41}$, $Q_{42}$, $Q_{43}$ ... are controlled by the first field shift signal $\phi_{FSA}$, and npn transistors $Q_{21}$, $Q_{22}$, $Q_{23}$, ... by the second shift signal $\phi_{FSB}$. Those shift signals $\phi_{FSA}$ and $\phi_{FSB}$ are generated by the sync control circuit 6. The remaining structure of the second embodiment resembles that shown in FIGS. 13–16 and 23. When the image pick-up device is applied to a camera, for example, the structure is substantially the same as that of FIG. 12.

The still picture photographing mode proceeds at the same times as those in FIGS. 17 through 21 with some exceptions.

The shift signal $\phi_{FSA}$ and $\phi_{FSB}$ shown in FIG. 33 are substituted by the signal $\phi_{FS}$. All of the transistors $Q_{21}$, $Q_{41}$, $Q_{22}$, $Q_{42}$, $Q_{23}$, $Q_{43}$ ... in FIG. 33 are controlled by the signal $\phi_{FS}$. The operation of the still picture photographing mode proceeds is equal to that of the first embodiment. The transfer of the pixel signals is performed as shown in FIGS. 22 and 23, realizing the noninterlace/full frame scan read.

In the motion picture photographing mode, all of the output signals $S_1$ to $S_n$ of the third drive circuit 12 are set to "M" level, and all of the transistors $m_{11}$, $m_{21}$, $m_{31}$, $m_{41}$ to $m_{1n}$, $m_{2n}$, $m_{3n}$, $m_{4n}$ are made conductive. In the scan read mode of the odd-numbered field, the first field shift signal $\phi_{FSA}$ is set to "H" level, and the second shift signal $\phi_{FSB}$ is set to "L". Under this condition, the odd-numbered field is shifted to scan read pixel signals according to the four-phase drive system of the timing signals $\phi_1$, $\phi_2$, $\phi_3$, and $\phi_4$. In the scan read mode of the even-numbered field, the first field shift signal $\phi_{FSA}$ is set to "L" level, and the second shift signal $\phi_{FSB}$ is set to "H". Under this condition, the odd-numbered field is shifted to scan read pixel signals according to the four-phase drive system of the timing signals $\phi_1$, $\phi_2$, $\phi_3$, and $\phi_4$. In this way, the motion picture is photographed in the interlace scan read mode.

Still another embodiment of a solid-state image pickup device of the CCD type will be described. The structure of the image pick-up device shown in FIGS. 13, 14 and 23 is available for that of the image pick-up device of this embodiment. The still picture photographing mode is equal to that of the first embodiment.

Figure 34:
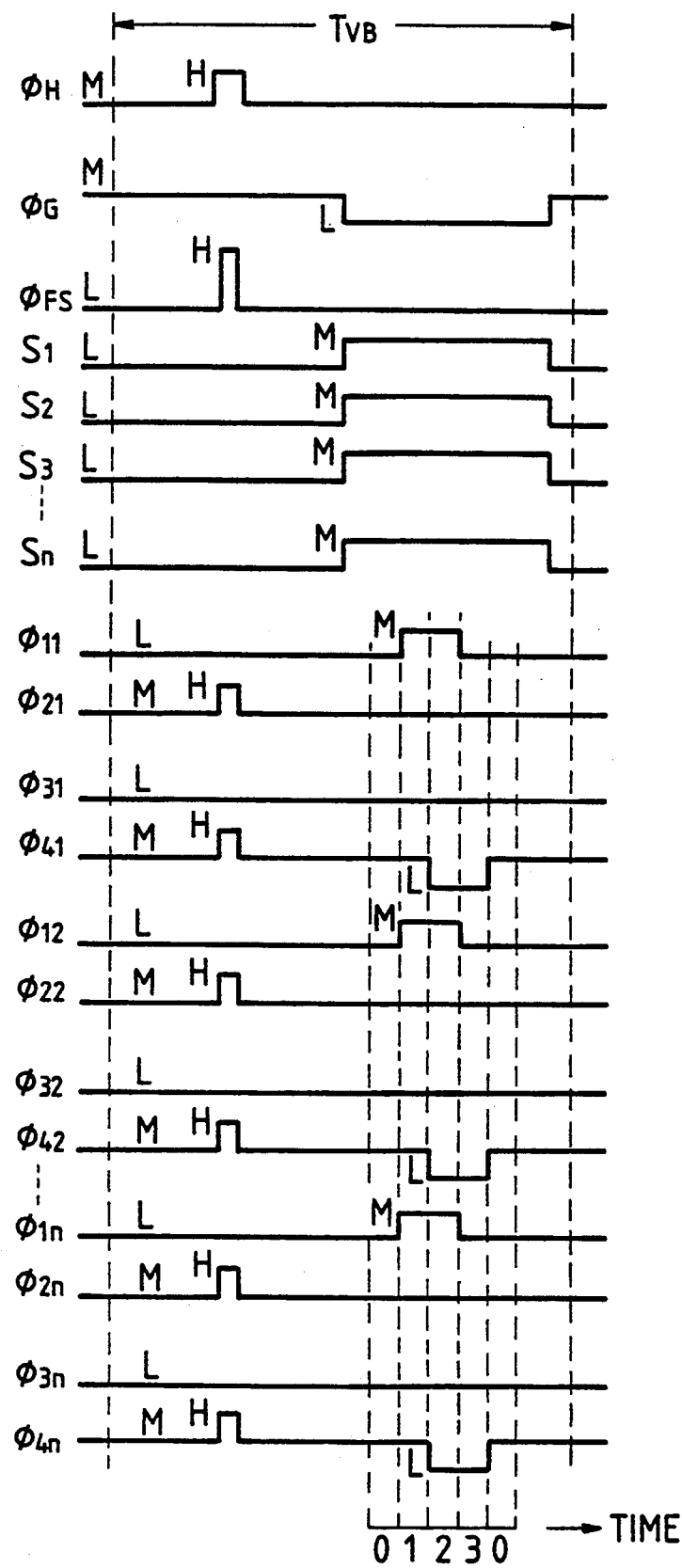
FIGS. 34 to 37 are timing charts showing in detail the scan read operation of the image pick-up device of the embodiment shown in FIG. 33.

The operation of the picture photographing mode will described. The times of the respective signals are similar to those in FIG. 18, but the times of the vertical blanking period $T_{VB}$ shown in FIG. 18 are replaced, by the times shown in FIG. 34 in the scan read mode for the odd-numbered field, and the times shown in FIG. 35 in the scan read mode for the even-numbered field.

Figure 36:
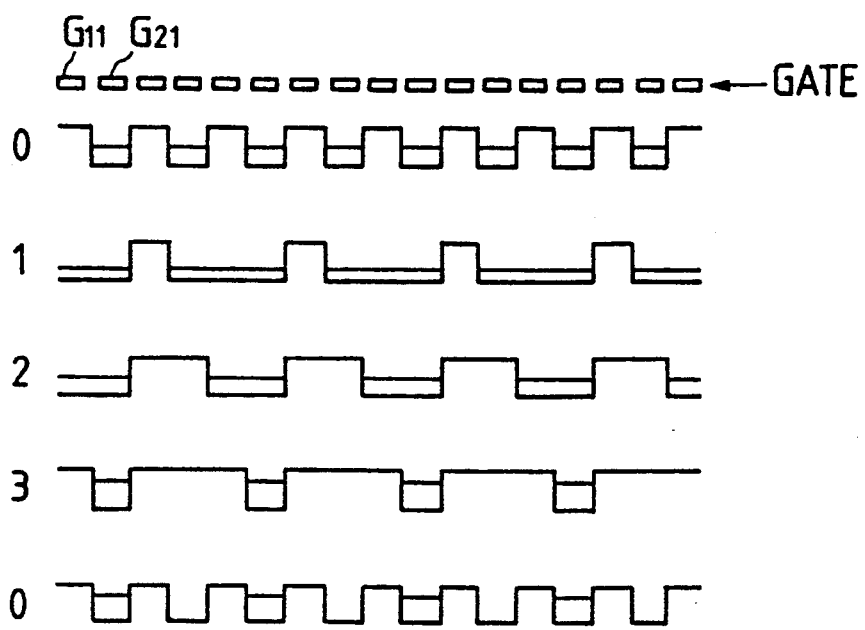

In the scan read mode for the odd-numbered field, during the vertical blanking period $T_{VB}$, as shown in FIG. 18, the field shift signal $\phi_{FSA}$ is set to "H" level, so that the pixel signals corresponding to all of the pixels are transferred to the transfer pixels under the even-numbered gate electrodes of each set. Then, the signal $\phi_G$ is set to "L" level, and all of the output signals $S_1$ to $S_n$ of the third drive circuit 12 are set to "M" level, to render all of the transistors $m_{11}$, $m_{21}$, $m_{31}$, $m_{41}$ to $m_{1n}$, $m_{2n}$, $m_{3n}$, $m_{4n}$ conductive. Under this condition, at times 0, 1, 2, 3, 0 the gate signals $\phi_{11}$ to $\angle_{4n}$ corresponding to the timing signals $\phi_1$, $\phi_2$, $\phi_3$, and $\phi_4$ are applied to the gate electrodes $G_{11}$ to $G_{4n}$. Then, according to the potential profile as shown in FIG. 36, a pair of pixel signals are mixed and retained in the transfer pixels the second gate electrodes of each set. The transfer pixels under the fourth gate electrodes of each set are empty.

Figure 8:
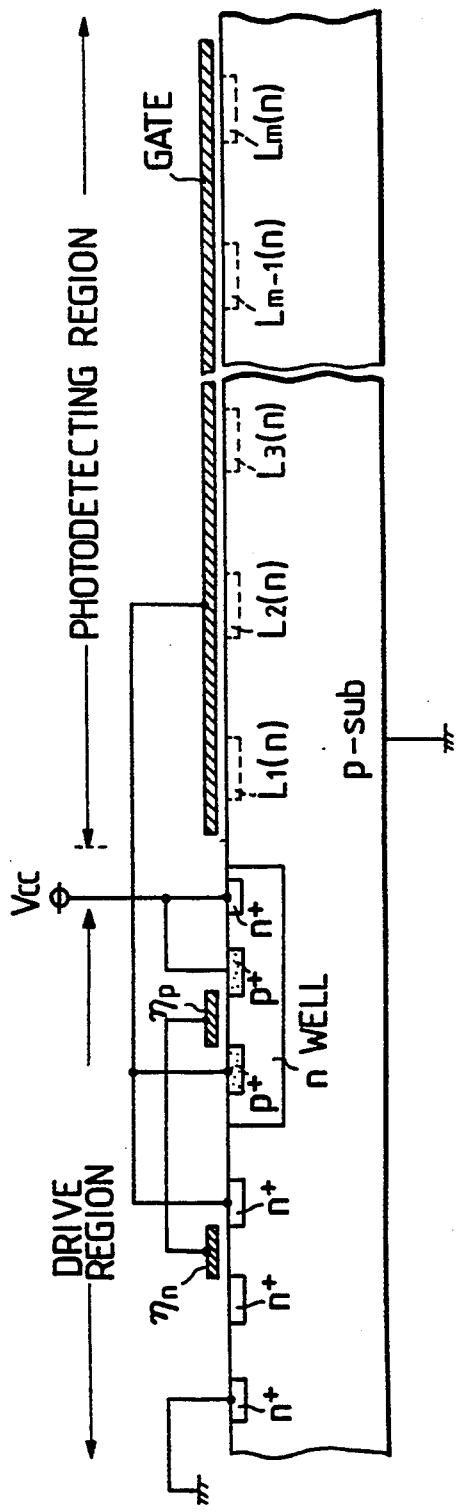

The scan read is applied at the times (see FIG. 8) similar to those in the still picture photographing mode of the first embodiment, thereby to perform the scan read for the odd-numbered field.

Figure 35:
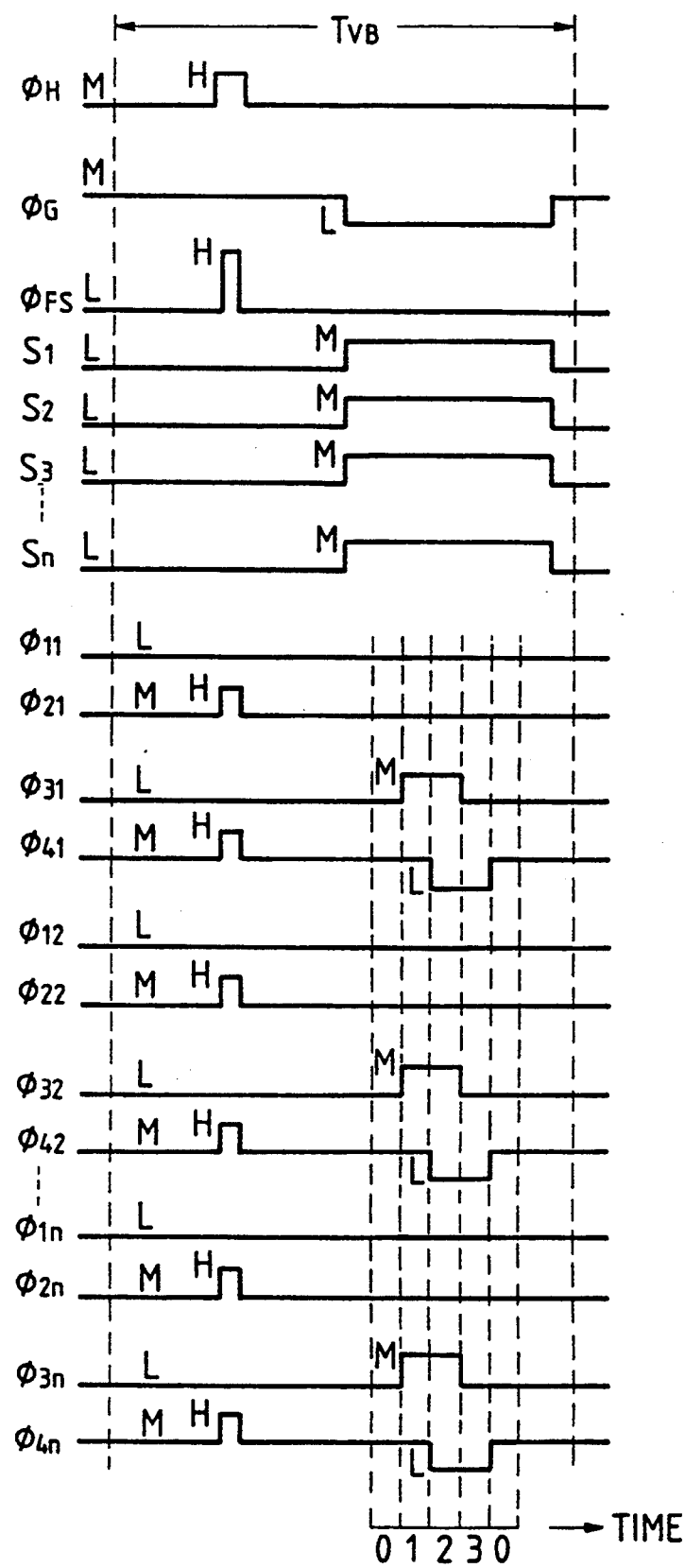
Figure 37:
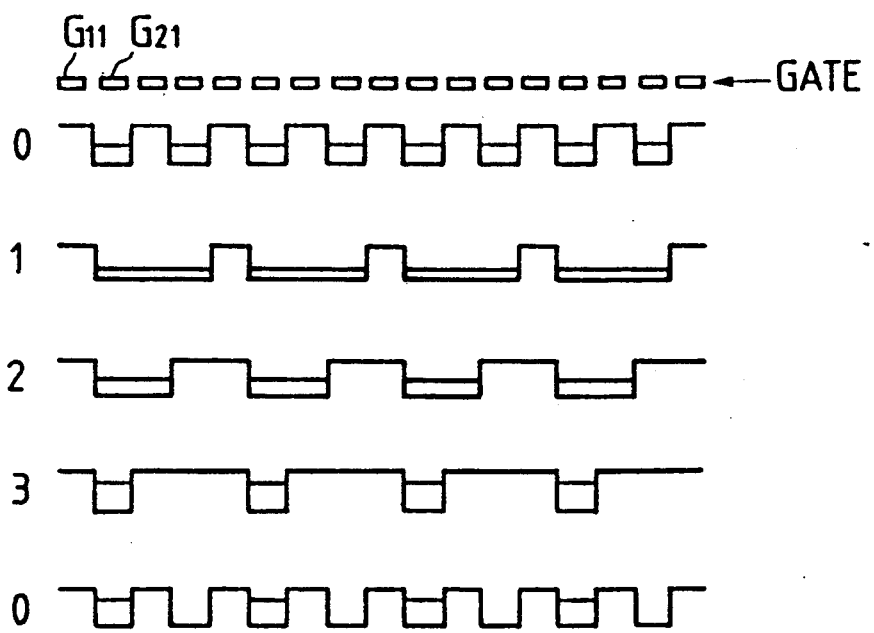

In the scan read mode for the even-numbered field, during the vertical blanking period $T_{VB}$, as shown in FIG. 35, the field shift signal $\phi_{FS}$ is set to "H" level, so that the pixel signals corresponding to all of the pixels are transferred to the transfer pixels under the even-numbered gate electrodes of each set. Then, the signal $\phi_G$ is set at the "L" level, and all of the output signals $S_1$ to $S_n$ of the third drive circuit 12 are set to "M" level, to render all of the transistors $m_{11}$, $m_{21}$, $m_{31}$, $m_{41}$ to $m_{1n}$, $m_{2n}$, $m_{3n}$, $m_{4n}$ conductive. Under this condition, at times 0, 1, 2, 3, 0 the gate signals $\phi_{11}$ to $\phi_{4n}$ corresponding to the timing signals $\phi_1$, $\phi_2$, $\phi_3$, and $\phi_4$ are applied to the gate electrodes $G_{11}$ to $G_{4n}$. Then, according to the potential profile as shown in FIG. 37, a pair of pixel signals are mixed and retained in the transfer pixels under the second gate electrodes of each set. The transfer pixels under the fourth gate electrodes of each set are empty. Here, in the even-numbered field, the combinations of the mixed pixel signals in the even-numbered field are shifted by one line.

The scan read is applied at the times (see FIG. 8) similar to those in the still picture photographing mode of the first embodiment, thereby to perform the scan read for the even-numbered field.

Thus, in the motion picture photographing mode of the third embodiment, the pixel signals are mixed in the transfer pixels of the vertical charge transfer paths $L_1$ to $L_m$, and the 2 field scan read is applied to realize the interlace scan read.

Those embodiments thus far described, in the still picture photographing mode, can provide a clear image by the noninter-lace scan read. The motion picture photographing mode can also be performed by the interlace scan read. Further, the image pick-up devices are inventive in the structure and the drive system.

As described above, the present invention successfully provides a solid-state CCD image pick-up device, which is operable in either of two scan read modes, an interlace scan read mode for photographing a motion picture and a noninter-lace/frame scan read mode for photographing a still picture.

Figure 39:
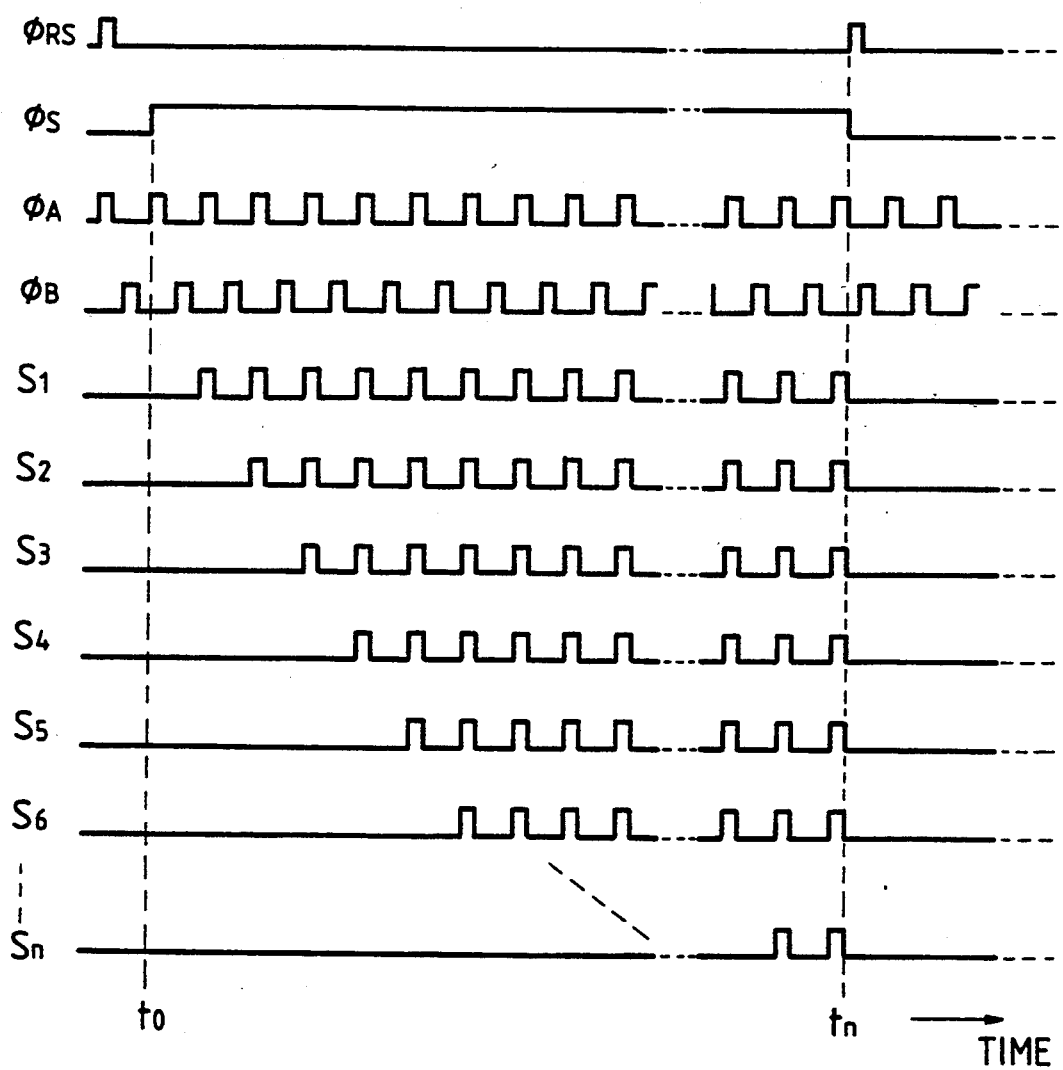
FIGS. 39 and 40 are timing charts useful in explaining the operation of the shift register shown in FIG. 38.
Figure 40:
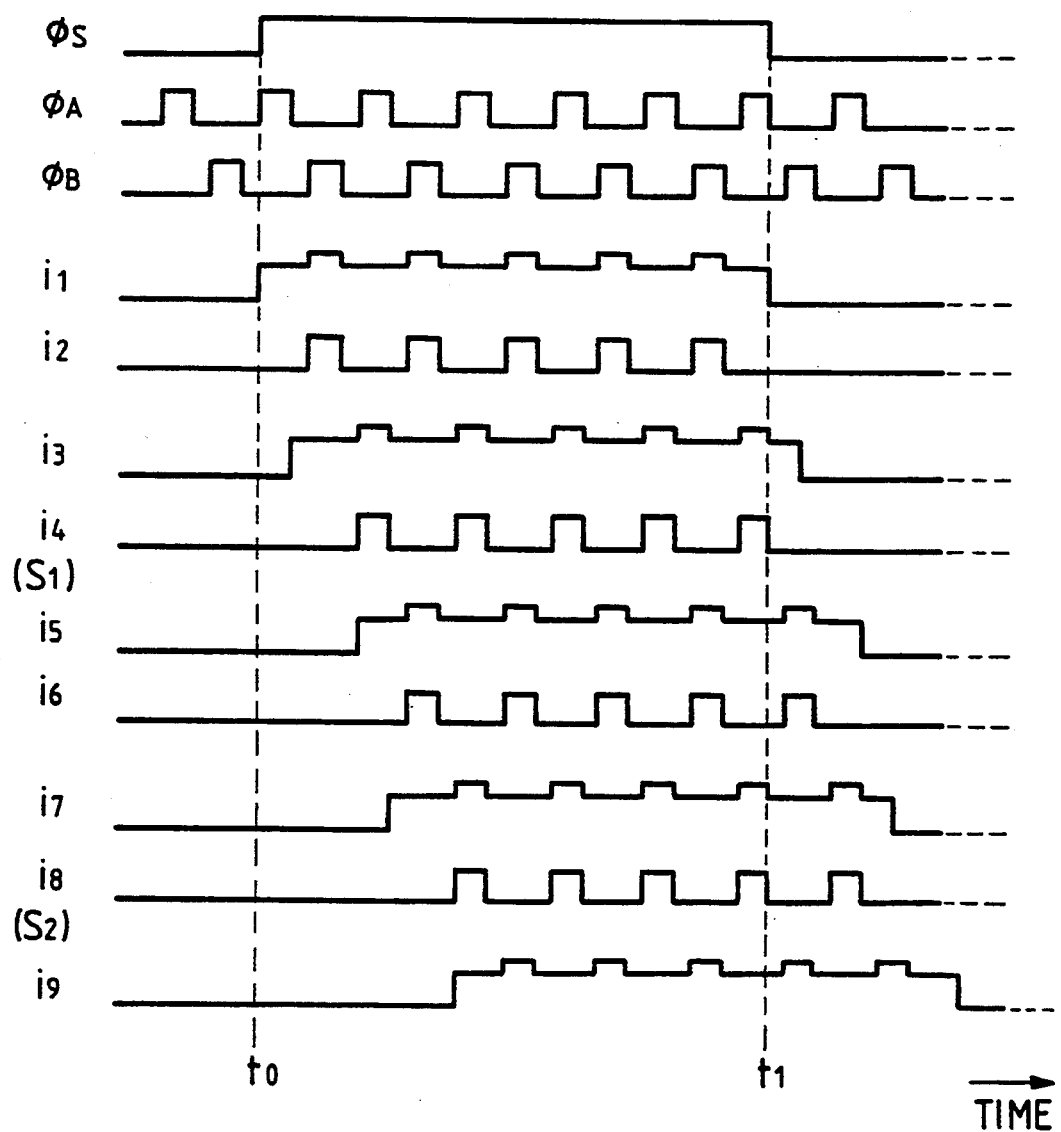

In another embodiment of the present invention, the third drive circuit 12 will be described with reference to FIGS. 38 to 40. The third drive circuit 12 consists of a shift register for shifting a start pulse $\phi_S$ in synchronism with two-phase timing signal $\phi_A$ and $\phi_B$ to sequentially generate drive signals of logic "H" in the order from the low- order bit to the high-order bit. In the first period, only the first drive signal $S_1$ goes high ("H"), while the remaining high-order bits are all low ("L") in logic level. In the second period, two low-order bits $S_1$ and $S_2$ go high, while the remaining high-order bits are low. In the third period, three low-order bits $S_1$, $S_2$, and $S_3$ go high, while the remaining high-order bits are low. Thus, the number of high drive signals progressively increases in order from the low-order bits to the high-order bits.

Figure 38:
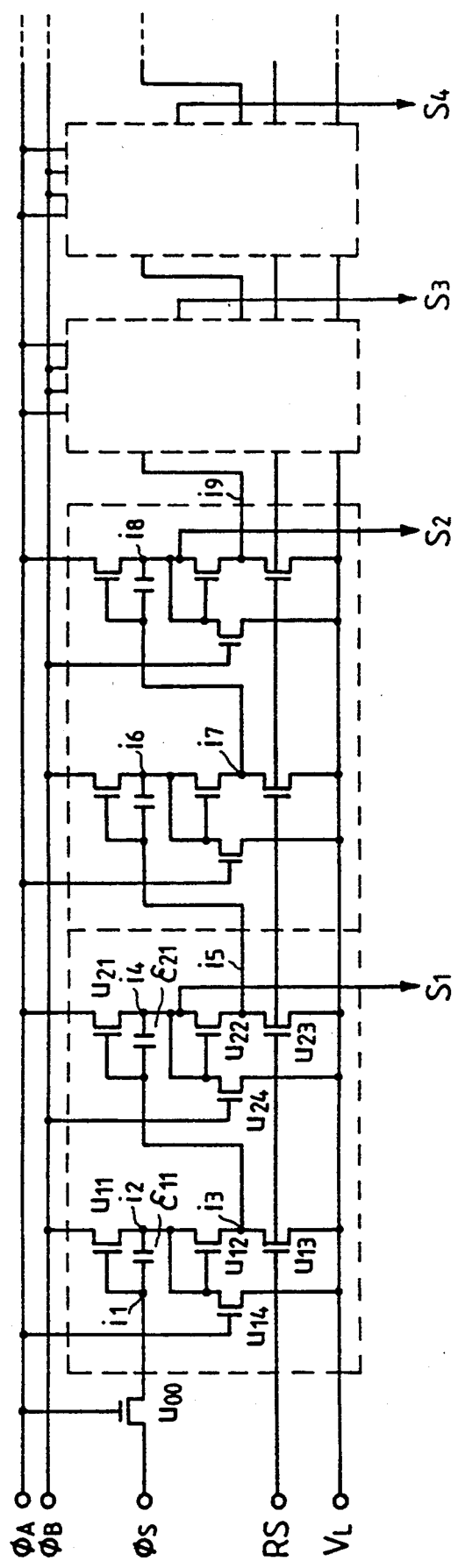
FIG. 38 is a circuit diagram showing a circuit arrangement of a shift register incorporated into another embodiment of the image pick-up device.

As shown in FIG. 38, each bit has a cell structure, and hence the circuit of the first bit will be typically described. The source-drain paths of three MOS $u_{11}$, $u_{12}$, $u_{13}$, and $u_{14}$ are connected in series between a signal line of the voltage $V_L$ and a signal line of the clock signal $\phi_B$. A signal line for the reset signal RS is connected to the gate contact of the transistor $u_{13}$. A bootstrap capacitor $\epsilon_{11}$ is connected between the gate contact and the source contact of the transistor $u_{11}$. The gate contact and the drain contact of the transistor $u_{12}$ are connected to each other, and to the drain contact of the transistor $u_{14}$. The transistor $u_{14}$ is connected at the drain contact to the signal line for the voltage $V_L$ and at the gate contact to the signal line for the timing signal $\phi_A$.

Transistors MOS $u_{22}$, $u_{22}$, $u_{23}$, and $u_{24}$ make up the same circuit as that made up of the transistors MOS $u_{11}$, $u_{12}$, $u_{13}$, and $u_{14}$. The drain contact (output point) of the transistor $u_{12}$ is connected to the gate contact (input point) of the transistor $u_{22}$. However, the connection of the signals $\phi_A$ and $\phi_B$ thereto is inverted.

The bit input corresponding to the gate contact of the gate contact of the transistor $u_{11}$. The bit output corresponding to the source contact of the transistor $u_{22}$. An n-bit shift register is formed by connecting the inputs and outputs of those bit cells in a cascade fashion. A start pulse $\phi_S$ is inputted to the least significant bit cell through an analog switch $u_{00}$ which is rendered conductive in synchronism with the clock signal $\phi_A$.

The shift register thus arranged will operate in the following. As shown in FIG. 39, during a period between $t_0$ to $t_n$, when the start pulse $\phi_S$ is set to "H" level, the bit output signals are successively set to "H" level from the low-order bit output signal S1 to the most significant bit output signal Sn. If a reset signal $\phi_{RS}$ is set to "H" level at a desired timing, then the bit output signals S1 to Sn are all reset to "L" level. Signals appearing at contacts $i_1$ to $i_9$ in the internal circuits forming bits shown in FIG. 38 take waveforms as shown in FIG. 40. As shown, the voltages at the gate contacts $i_1$, $i_3$, $i_7$, $i_9$, ... of the transistors $u_{11}$, $u_{21}$, ... are raised through the functions of the bootstrap capacitors $\epsilon_{11}$, $\epsilon_{12}$, .... Therefore, those voltages of satisfactory amplitudes are wave shaped to form rectangular bit output signals S1 to Sn.

The operation of the CCD image pick-up device thus constructed will be described using an electronic still camera for photographing a still picture into which the image pick-up device is incorporated.

The operation of the image pick-up device when it takes a still picture will be described with reference to FIG. 18. It is assumed that the period $T_{VB}$ corresponds to the vertical blanking period of a standard television system. At a predetermined time during the period $T_{VB}$, a so-called field shift to shift the pixel charges from the photodiodes to the vertical charge transfer paths is performed. The electronic shutter function is realized if the time for the field shift operation is made to correspond to a time of closing a shutter (time of an exposure completion). Accordingly, the exposure operation starts at a time after the shutter close time, and the device is so controlled that the exposure time ranges from the exposure start time to a time of starting the field shift operation.

The excessive charges possibly causing the smear component and the dark current component in the vertical charge transfer paths $L_1$ to $L_m$ and the horizontal charge transfer path 8, are discharged by the charge transfer operation before the field shift starts. Further, immediately before the exposure starts, the unnecessary charges in the photodiodes have been drained by the vertical overflow drain structure.

During the period $T_{VB}$ corresponding to the vertical blanking period, the pixel signals of all of the photodiodes are simultaneously transferred to the transfer pixels of the vertical charge transfer paths $L_1$ to $L_m$. During the period $T_{HB}$ corresponding to the horizontal blanking period, a pixel signal of the transfer pixel closest to the horizontal charge transfer path 8 is transferred to the transfer path 8. During a period $T_{1H}$ corresponding to the horizontal scan period (called a 1 H period), the pixel signals of one line are horizontally transferred through the horizontal charge transfer path 8. As a result, the pixel signals of the first line are read out.

Then, during the period $T_{HB}$ corresponding to the next horizontal blanking period, the vertical charge transfer paths $L_1$ to $L_m$ feed the pixel signals of the next line to the horizontal charge transfer path 8. During a period $T_{1H}$ corresponding to the next horizontal scan period, the pixel signals are horizontally transferred through the horizontal charge transfer path 8. In this way, the pixel signals of the second line are read out.

The pixel signals of the third line are likewise read out of the photodiodes by using periods $T_{HB}$ and $T_{1H}$. The pixel signals of the remaining lines are successively read out while repeating a similar sequence of operations. Finally, all of the pixel signals of one frame are read out.

The scan read operation will be described in detail with reference to FIG. 18 showing a timing chart of drive signals and timing signals. In the figure, the period $T_{VB}$ corresponds to the vertical blanking period, the period $T_{HB}$ corresponds to the horizontal blanking period, period $T_{1H}$ corresponds to the horizontal scan period. Further, "H" indicates 12 V, "M" indicates 0 V, "L" indicates $-8$ V, and "HH" indicates approximately 15 to 25 V equal to the substrate voltage.

During the period $T_{VB}$ corresponding to the vertical blanking period, the timing signal $\phi_H$ and $\phi_G$ go high (H) only at a predetermined time $t_2$, while remains "M" in level at the remaining times. The timing signal $\phi_G$ is always at the "M" level. The timing signal $\phi_{FS}$ goes high (H) as the timing signal $\phi_H$ goes high, while being kept at the "L" level during the remaining times. The drive signals $S_1$ to $S_n$ generated from the third drive circuit 12 are always at the "L" level.

During the period $T_{VB}$, all of the NMOS transistors of the first drive circuit 10 are rendered conductive by the timing signal $\phi_G$ of "H" and "M" level, while at the same time all of the drive signals $S_1$ to $S_n$ of the third drive circuit 12 are placed at the "L" level. Accordingly, all of the NMOS transistors in the second drive circuit 11 become conductive. All of the gate electrodes $G_{11}$, $G_{21}$, $G_{31}$, $G_{41}$ to $G_{1n}$, $G_{2n}$, $G_{4n}$ are controlled by the first drive circuit 10.

More specifically, when the timing signals $\phi_H$ and $\phi_{FS}$ are not at the "H" level, the gate signals $\phi_{11}$, $\phi_{31}$, $\phi_{12}$, $\phi_{32}$ to $\phi_{1n}$, $\phi_{3n}$, which are applied to the odd-numbered gate electrodes $G_{11}$, $G_{31}$, $G_{12}$, $G_{32}$ to $G_{1n}$, $G_{3n}$, are each equal in voltage level to the signal $V_L$ (constantly set at $-8$ V). Under this condition, potential barriers are generated in the vertical charge transfer paths $L_1$ to $L_m$ under those gate electrodes.

The gate signals $\phi_{21}$, $\phi_{41}$, $\phi_{22}$, $\phi_{42}$ to $\phi_{2n}$, $\phi_{4n}$, which are applied to the even-numbered gate electrodes $G_{21}$, $G_{41}$, $G_{22}$, $G_{42}$ to $G_{2n}$, $G_{4n}$, are each equal in voltage to the signal $\phi_H$ at the "M" level. Under this condition, transfer pixels are generated in the vertical charge transfer paths $L_1$ to $L_m$ under those gate electrodes.

Accordingly, all of the portions adjacent to the transfer gates Tg (see FIG. 14) serve as the transfer pixels being separated from one another by the potential barriers.

Under this condition, when the timing signals $\phi_H$ and $\phi_{FS}$ go high at time t2, all of the npn transistors $Q_{21}$, $Q_{41}$, $Q_{61}$, . . . become conductive, and the "H" level voltage of approximately 12 V is applied to only the even-numbered gate electrodes $G_{21}$, $G_{41}$, $G_{22}$, $G_{42}$ to $G_{2n}$, $G_{4n}$. Accordingly, all of the transfer gates Tg become conductive, and all of the pixel signals of all of the photodiodes are transferred to the adjacent transfer pixels.

As already described referring to FIG. 17, the exposure process has been completed just before the time t2, and the removal of the unnecessary charges has also been completed. During the period $T_{VB}$, a so-called field shift operation is performed, so that as at the time $t_1$ shown in FIG. 22, the pixel signals (shaded squares) are transferred to the vertical charge transfer paths. During the period $T_{HB}$ corresponding to the first horizontal blanking period, the timing signal $\phi_G$ is always at the "L" level. Accordingly, all of the NMOS transistors in the first drive circuit 10 become nonconductive and are separated from all of the gate electrodes.

Only the drive signal $S_1$ at the first output terminal of the third drive circuit 12 is placed at the "M" level, while the remaining drive signals $S_2$ to $S_n$ are at the "L" level. This renders conductive only the first set of NMOS transistors $m_{11}$, $m_{21}$, $m_{31}$, $m_{41}$ concerning the drive signal $S_1$ of the second drive circuit 11.

During the period that only the drive signal $S_1$ is set to "M" level, the timing signals $\phi_1$, $\phi_2$, $\phi_3$, and $\phi_4$ of four phases for the vertical charge transfer are inputted to the second drive circuit 110 Accordingly, only the first set of first to fourth gate signals $\phi_{11}$, $\phi_{21}$, $\phi_{31}$, and $\phi_{41}$ are equal in level to the timing signals $\phi_1$, $\phi_2$, $\phi_3$, and $\phi_4$. The charge transfer is performed by the first set of first to fourth gate electrodes $G_{11}$, $G_{21}$, $G_{31}$, and $G_{41}$. The enlarged signal waveforms during the period $T_{HB}$ are shown in FIG. 19.

As a consequence, the signal charges are transferred to the horizontal charge transfer path 8 at the times (indicated by numerals 1, 2, 3, 4, 5, 6, and 7) of the gate signals $\phi_{11}$, $\phi_{21}$, $\phi_{31}$, and $\phi_{41}$ in FIG. 19, as in the first transfer shown in FIG. 22. A pixel signal $q_{lj}$ of the first line closest to the horizontal charge transfer path 8 is transferred to the transfer path 8. A pixel signal $q_{2j}$ of the second line moves to the first line position.

Then, during the first horizontal scan period $T_{1H}$ (between times $t_4$ and $t_5$), the variation of the signal applied to each gate electrode stops, and the horizontal charge transfer path 8 vertically transfers signal charges in synchronism with the gate signals $\alpha_1$ to $\alpha_4$ recurring at predetermined times according to the four- or two-phase drive system. As a result, pixel signals of the first one line are read out.

During a period between times $t_5$ to $t_7$, a sequence of operations, which is similar to that during the period between times $t_3$ to $t_5$, is repeated to read the pixel signals of the next line out of the image pick-up device. During the horizontal blanking period $T_{HB}$ between times $t_3$ to $t_4$, the drive signals $S_1$ and $S_2$ of the third drive circuit 12 are simultaneously set to "M" level, and the remaining drive signals $S_3$ to $S_n$ are set to "L" level. The enlarged signal waveforms during this period $T_{HB}$ are shown in FIG. 20.

Consequently, a set of the first to fourth gate electrodes $G_{11}$ to $G_{41}$, and two sets of fifth to eighth $G_{12}$ to $G_{42}$ are driven by the gate signals $\phi_{11}$ to $\phi_{41}$ and $\phi_{12}$ to $\phi_{42}$, which are equal to the timing signals $\phi_1$, $\phi_2$, $\phi_3$, and $\phi_4$. The result is the vertical transfer of the pixel signals under those gate electrodes.

The timing chart shown in FIG. 20 shows that as indicated by the second vertical scan in FIG. 22, the pixel signal $q_{2j}$ of the second line is transferred to the horizontal charge transfer path 8. Two lines of the pixel signals $q_{j3}$ of the third line and one line of the pixel signal $q_{j4}$ of the fourth line are transferred to the horizontal charge transfer path 8.

During the horizontal scan period $T_{1H}$ between times $t_6$ and $t_7$, the horizontal charge transfer path 8 reads out the pixel signal $q_{2j}$ of the second line.

The third scan read starts at time $t_7$. Then, the drive signals $S_1$, $S_2$, and $S_3$ are set to "M" level, while the remaining drive signals $S_4$ to $S_n$ of the third drive circuit 12 are set to "L" level. The first to third sets of first to 12th gate electrodes $G_{11}$ to $G_{41}$, $G_{12}$ to $G_{42}$ to $G_{42}$, and $G_{13}$ to $G_{42}$ are driven for the vertical charge transfer. Accordingly, as in the third transfer of FIG. 22, the pixel signal $q_{3j}$ of the third line is transferred to the horizontal charge transfer path 8. The pixel signals $q_{4j}$ to $q_{7j}$ of the 4th to 7th lines are transferred every line to the horizontal charge transfer path 8.

Then, the pixel signal $q_{3j}$ is read out of the photodiodes by the horizontal charge transfer path 8.

Subsequently, the drive signals $S_4$ to $S_n$ of the third drive circuit 12 are progressively inverted to "M" level every time the pixel signal of each line is read out. The gate electrodes to be driven are increased every four transfer pixels under the gate electrodes. During the horizontal blanking period $T_{HB}$ (between times $t_9$ and $t_{10}$), all of the gate signals $\phi_1$ to $\phi_{4n}$ have the same waveforms as those of the timing signals $\phi_1$ to $\phi_4$, as shown FIG. 21. The pixel signals of the last line are read out by the final scan read operation.

FIG. 23 shows the K-th and (K+1) th vertical charge transfer operations, for example, in terms of potential profiles. As shown, in order from the transfer pixel closest to the horizontal charge transfer path 8, the intervals of the idle transfer pixels progressively increase. With this, the pixel signals are read out in the order from the pixel signals of the pixel closed to the transfer path 8 to the succeeding ones.

Thus, in the present embodiment, the pixel signals of one frame can be read out by one-time frame scan read operation.

Also in the embodiment, the width of the odd-numbered gate electrodes is wider than that of the even-numbered gate electrodes. This feature allow increase of a charge retaining capacitance of the transfer pixels adjacent to the transfer gates. Additionally, during the vertical charge transfer, the transfer pixels under the even-numbered gate electrodes are, of necessity, used for the charge transfer, thereby improving the charge transfer efficiency.

The shift register corresponding to the third drive circuit produces the respective bit output signals at the frequency equal to that of the timing signal. Therefore, there is no need for increasing the frequency of the timing signal, although the prior shift register needs the increase of it. Further, the shift register can be reset at a desired timing. In the embodiment, the charge transfer is performed in synchronism with the four-phase timing signals $\phi_1$, $\phi_2$, $\phi_3$, and $\phi_4$ during the period $T_{HB}$ corresponding to each horizontal blanking period. If necessary, the timing signals of 4 or more phases may be used for driving the gate electrodes corresponding to the number of phases.

The solid-state image pick-up device having the thus constructed shift register operates in synchronism with the timing signal in a manner that the number of the bit output signals of "H" level gradually increases in the order from the low-order bit to the high-order bit. That is, during a first period, only the first bit output signal is at the "H" level, while the remaining high-order bits are all at the "L" level. During the next period, the bit output signals at the two low-order bits are at the "H" level, while the remaining high-order bits are at the "L" level. During the succeeding period, the bit output signals at the three low-order bits are at the "H" level, while the remaining high-order bits are at the "L" level.

The bit output signals vary in synchronism with the frequency of the timing signal. Additionally, the shift register can be reset at any time by a reset signal.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A solid-state image pick-up device of the charge-coupled device type, comprising:

a plurality of optoelectric transducing elements corresponding to pixels, said elements being vertically and horizontally arrayed in a matrix fashion so as to form column linear arrays and row linear arrays, said column linear arrays defining a column direction;

a plurality of vertical charge transfer paths, each of said vertical charge transfer paths being associated with a corresponding adjacent column linear array; and an optical shield layer, disposed over said vertical charge transfer paths, for optically shielding said vertical charge transfer paths;

wherein pixel signals are vertically transferred from each of said column linear arrays through a corresponding one of said vertical charge transfer paths in a manner such that after pixel signals generated in the transducing elements are transferred to the vertical charge transfer paths, application of gate signals occurring at predetermined times to a plurality of gate electrodes of said vertical charge transfer paths permits said pixel signals to be scan read from said column linear arrays through said vertical charge transfer paths by a horizontal charge transfer path;

wherein switching elements are each provided, one for each of a plurality of transfer gates connecting said optoelectric transducing elements and said vertical charge transfer paths, and are each coupled between a timing signal electrode and a respective one of said plurality of gate electrodes, a pair of said gate electrodes being disposed adjacent to each of said optoelectric transducing elements, said plurality of transfer gates and their associated switching elements being combined into groups in an order starting from one of said plurality of gate electrodes disposed closest to said horizontal charge transfer path; and wherein a first drive circuit sequentially generates a plurality of drive signals, each of said drive signals being provided to said switching elements to render them conductive, thereby transferring said pixel signals to said horizontal charge transfer path from said column linear arrays so as to allow a full frame scan read to be performed through said vertical charge transfer paths by a timing signal source supplying a predetermined number of timing signals, said predetermined number corresponding to the number of transfer gates in each of said groups, in synchronism with said plurality of drive signals, to respective ones of said gate electrodes.

2. A solid-state image pick-up device as claimed in claim 1, wherein said gate electrodes comprise alternating narrow and wide gate electrodes, each pair of said alternating narrow and wide gate electrodes forming said pair of said gate electrodes which are disposed adjacent to each of said optoelectric transducing elements, 3. A solid-state image pick-up device as claimed in claim 2, further comprising a second drive circuit for supplying said gate signals to said gate electrodes so that said pixel signals are transferred through said vertical charge transfer paths at predetermined times, said first drive circuit including a shift register for producing said drive signals at predetermined times.

4. A solid-state image pick-up device as claimed in claim 3, wherein said plurality of optoelectric transducing elements comprise n+ impurity layers formed in a p-well layer, said vertical charge transfer paths comprise n-type impurity layers, lying adjacent to said elements and each having an upper surface, said transfer gates comprise a plurality of p+impurity layers, and said gate electrodes comprise polycrystalline silicon layers, with each of said p+impurity layers and said polycrystalline silicon layers having a first end and a second end.

5. A solid-state image pick-up device as claimed in claim 4, wherein each of said gate electrodes is layered on a respective said upper surface of each of said n-type impurity layers.

6. A solid-state image pick-up device as claimed in claim 5, wherein said transfer gates become conductive in response to a predetermined high voltage being applied to said wide gate electrodes, and said wide gate electrodes become conductive in response to creation of potential wells under said gate electrodes in said vertical charge transfer paths, such that said pixel signals are transferred to said potential wells.

7. A solid-state image pick-up device as claimed in claim 6, wherein horizontal path electrodes provided over said horizontal transfer path provide a drive system to transfer said pixel signals through said horizontal transfer path.

8. A solid-state image pick-up device as claimed in claim 7, further comprising a third drive circuit for providing a further plurality of signals to said gate electrodes, said third drive circuit comprising a first plurality of NMOS transistors and a plurality of npn transistors, each of said NMOS transistors and said plurality of npn transistors having an emitter contact, a base contact, and a collector contact.

9. A solid-state image pick-up device as claimed in claim 8, further comprising a sync drive circuit for generating a plurality of sync drive signals and a bias voltage signal which are sent to said gate electrodes, a first sync drive signal being applied, through said NMOS transistors, to first ends of said narrow gate electrodes, a second sync drive signal being applied, through said NMOS transistors, to first ends of said wide gate electrodes, a third sync drive signal being applied to said NMOS transistors, a fourth sync drive signal being applied to the base contacts of said npn transistors, with the emitter contacts of said npn transistors being connected to said first ends of said wide gate electrodes, and said bias voltage signal being applied to the collector contacts of said npn transistors.

10. A solid-state image pick-up device as claimed in claim 9, wherein each of said NMOS transistors comprises first and second n+ impurity layers buried in a first p-well layer, said first n+ impurity layer being coupled with said second sync drive signal to serve as a drain contact, said second n+ impurity layer being coupled with said gate electrodes to serve as a source contact, and said first sync drive signal being applied to a first p+impurity layer buried in said p-well layer containing said NMOS transistor.

11. A solid-state image pick-up device as claimed in claim 10, wherein each of said npn transistors comprises a second p+impurity layer buried in a second p-well layer, a third n+ impurity layer, and an n-type semiconductor substrate, said third n+ impurity layer being connected to said gate electrodes to serve as an emitter contact, said fourth sync drive signal being applied to said second p-well layer serving as a base contact and to said third p+impurity layer, and said bias voltage signal being applied to said n-type substrate serving as a collector contact.

12. A solid-state image pick-up device as claimed in claim 11, wherein said second drive circuit comprises said switching elements, each of said switching elements comprising a respective one of a second plurality of NMOS transistors which select said timing signals from said sync drive circuit in synchronism with said further plurality of signals generated by said third drive circuit, said second plurality of NMOS transistors forming groups of four adjacent transistors, each transistor of each of said groups receiving the same drive signal but receiving a different timing signal.

13. A solid-state image pick-up device as claimed in claim 12, wherein the source contacts of said second plurality of NMOS transistors are connected to said second ends of said polycrystalline layer.

14. A solid-state image pick-up device as claimed in claim 13, wherein said full frame scan comprises all of said pixel signals of a full frame image being transferred to said vertical charge transfer paths, followed by the pixel signals of each line of said full frame image being sequentially transferred, line by line, to and then through said horizontal transfer path.

15. A solid-state image pick-up device as claimed in claim 14, wherein said full frame scan further comprises the pixel signals of all of said elements being transferred from said elements to said vertical charge transfer paths during a first period corresponding to a vertical blanking period of a standard television system, followed by one line of said pixel signals being transferred to said horizontal charge transfer path during a second period corresponding to a horizontal blanking period of a standard television system, followed by another line of said pixel signals being transferred horizontally through said horizontal charge transfer path during a third period corresponding to a horizontal scan period of a standard television system, followed by the pixel signals of each successive line of a full frame being transferred vertically and then horizontally, line by line, so that all the pixel signals of a full frame are read out.

16. A solid-state image pick-up device as claimed in claim 14, wherein said sync drive signals, timing signals, and drive signals may be at one of a first voltage level, a second voltage level, and a third voltage level.

17. A solid-state image pick-up device as claimed in claim 16, wherein said first voltage level is positive, said second voltage level is zero, and said third voltage level is negative.

18. A solid-state image pick-up device as claimed in claim 17, wherein said full frame scan further comprises all of said first plurality of NMOS transistors of said third drive circuit being rendered conductive by said third sync drive signal being set at the second voltage level during a first period corresponding to a vertical blanking period of a standard television system, followed by all of said second plurality of NMOS transistors in said second drive circuit being rendered conductive by all of said drive signals of said first drive circuit being set at the third voltage level, and when said second sync drive signal and said fourth sync drive signal are not at said first voltage level, said gate signals which are applied to said narrow gate electrodes become equal in voltage level to said first sync drive signal, thereby generating potential barriers in the vertical charge transfer paths under said narrow gate electrodes, when gate signals which are applied to said wide gate electrodes are equal in voltage level to said second sync drive signal at said second voltage level, potential wells being generated in the vertical charge transfer paths under said wide gate electrodes, and when said second and fourth sync drive signals are at said first voltage level at a predetermined time, all of said npn transistors of said third drive circuit become conductive, with said first voltage level being applied to only the wide gate electrodes, such that all of said transfer gates are rendered conductive and all of said pixel signals of said elements are transferred to adjacent potential wells on said vertical charge transfer paths, followed by the pixel signals closest to said horizontal transfer path being transferred by said third sync drive signal being set to said third voltage level, during a second period corresponding to a horizontal blanking period of a standard television system, so that all of said first plurality of NMOS transistors in said first drive circuit become nonconductive and separated from all of said gate electrodes, with said first drive signal set at said second voltage level and said remaining drive signals set at said third voltage level, only the first of said group of four adjacent transistors among said second plurality of NMOS transistors receiving said first drive signal being rendered conductive, said timing signals being supplied to said second drive circuit, which in turn activate those gate signals which are equal in level to said timing signals, such that said pixel signals of said first line of said full frame image are transferred from said vertical transfer paths to said horizontal transfer paths by the gate electrodes corresponding to said first group of four adjacent transistors, followed by said first line of pixel signals being transferred through said horizontal charge transfer path by said horizontal path electrodes, followed by the pixel signals of each successive line being transferred vertically and then transferred horizontally, line by line, so that all the pixel signals of one full frame are read out.

19. A solid-state image pick-up device as claimed in claim 18, wherein in order from said potential well closest to said horizontal charge transfer path, the intervals of potential wells progressively increase so that pixel signals are progressively read out in order from the pixel signal closest to said horizontal charge transfer path to succeeding ones.

20. A solid-state image pick-up device of the charge-coupled device type, comprising:

a plurality of optoelectric transducing elements corresponding to pixels, said elements being vertically and horizontally arrayed in a matrix fashion so as to form column linear arrays and row linear arrays, said column linear arrays defining a column direction;

a plurality of vertical charge transfer paths, each of said vertical charge transfer paths being associated with a corresponding adjacent column linear array; and an optical shield layer, disposed over said vertical charge transfer paths, for optically shielding said vertical charge transfer path;

wherein pixel signals are vertically transferred from each of said column linear arrays through a corresponding one of said vertical charge transfer paths in a manner such that after pixel signals generated in the transducing elements are transferred to the vertical charge transfer paths, application of gate signals occurring at predetermined times to a plurality of gate electrodes of said vertical charge transfer paths, said gate electrodes comprising alternating narrow and wide gate electrodes, generates potential wells and potential barriers in said vertical charge transfer paths lying under said gate electrodes so as to permit said pixel signals to be scan read from said column linear arrays through said vertical charge transfer paths by a horizontal charge transfer path;

wherein switching elements are each provided, one for each of a plurality of transfer gates connecting said optoelectric transducing elements and said vertical charge transfer paths, and are each coupled between a timing signal electrode and a respective one of said plurality of gate electrodes, a pair of said gate electrodes being disposed adjacent to each of said optoelectric transducing elements and layered on an upper surface of said vertical charge transfer paths, said plurality of transfer gates and their associated switching elements being combined into groups in an order starting from one of said plurality of gate electrodes disposed closest to said horizontal charge transfer path; and wherein a drive circuit sequentially generates a plurality of drive signals, each of said drive signals being provided to and rendering conductive said switching elements, thereby transferring said pixel signals to said vertical charge transfer path from said column linear arrays through said vertical charge transfer path so as to allow a full frame scan read to be performed through said vertical charge transfer paths by a timing signal source supplying a predetermined number of timing signals, said predetermined number corresponding to the number of transfer gate electrodes in each of said groups, in synchronism with said plurality of drive signals, to respective ones of said gate electrodes.

* * * * *